United States Patent
Tsuchimura et al.

(10) Patent No.: US 9,625,813 B2
(45) Date of Patent: *Apr. 18, 2017

(54) CHEMICAL AMPLIFICATION RESIST COMPOSITION, RESIST FILM USING THE COMPOSITION, RESIST-COATED MASK BLANKS, RESIST PATTERN FORMING METHOD, PHOTOMASK AND POLYMER COMPOUND

(71) Applicant: FUJIFILM Corporation, Minato-ku, Tokyo (JP)

(72) Inventors: Tomotaka Tsuchimura, Shizuoka (JP); Tadateru Yatsuo, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/943,062

(22) Filed: Jul. 16, 2013

(65) Prior Publication Data

US 2013/0302726 A1 Nov. 14, 2013

Related U.S. Application Data

(63) Continuation of application No. PCT/JP2011/080549, filed on Dec. 22, 2011.

(60) Provisional application No. 61/504,431, filed on Jul. 5, 2011.

(30) Foreign Application Priority Data

Jan. 18, 2011 (JP) ................. 2011-008331
Nov. 22, 2011 (JP) ................. 2011-255302

(51) Int. Cl.
| | | |
|---|---|---|
| G03F 7/004 | (2006.01) |
| G03F 7/38 | (2006.01) |
| C08F 257/00 | (2006.01) |
| G03F 1/20 | (2012.01) |
| G03F 7/038 | (2006.01) |
| C08F 12/24 | (2006.01) |
| C08F 212/14 | (2006.01) |
| C09D 125/18 | (2006.01) |
| C08K 5/19 | (2006.01) |
| G03F 1/22 | (2012.01) |
| G03F 7/20 | (2006.01) |
| G03F 7/039 | (2006.01) |
| G03F 1/56 | (2012.01) |
| G03F 1/76 | (2012.01) |

(52) U.S. Cl.
CPC ............ *G03F 7/0382* (2013.01); *C08F 12/24* (2013.01); *C08F 212/14* (2013.01); *C08F 257/00* (2013.01); *C08K 5/19* (2013.01); *C09D 125/18* (2013.01); *G03F 1/20* (2013.01); *G03F 1/22* (2013.01); *G03F 1/56* (2013.01); *G03F 1/76* (2013.01); *G03F 7/0397* (2013.01); *G03F 7/20* (2013.01); *G03F 7/2037* (2013.01); *G03F 7/2039* (2013.01)

(58) Field of Classification Search
CPC ........ G03F 7/0382; G03F 7/0397; G03F 1/20; G03F 1/22; C08F 257/00
USPC ............... 430/270.1, 905, 907, 910, 5, 942; 525/210
See application file for complete search history.

(56) References Cited

U.S. PATENT DOCUMENTS

| | | | |
|---|---|---|---|
| 5,585,218 A | 12/1996 | Nakano et al. |
| 6,153,349 A | 11/2000 | Ichikawa et al. |
| 6,258,507 B1 | 7/2001 | Ochiai et al. |
| 6,323,295 B1* | 11/2001 | Muhlebach et al. | 526/171 |
| 2002/0037472 A1 | 3/2002 | Zampini et al. |
| 2004/0126700 A1 | 7/2004 | Lee et al. |
| 2005/0186501 A1 | 8/2005 | Kishimura et al. |
| 2008/0090179 A1 | 4/2008 | Takeda et al. |
| 2008/0268375 A1 | 10/2008 | Hayashi et al. |
| 2010/0075257 A1 | 3/2010 | Takemoto et al. |
| 2010/0081085 A1* | 4/2010 | Ando et al. ............ 430/270.1 |
| 2011/0212390 A1* | 9/2011 | Masunaga ............ G03F 7/0046 430/5 |

FOREIGN PATENT DOCUMENTS

| | | |
|---|---|---|
| CN | 1616501 A | 5/2005 |
| CN | 101712733 A | 5/2010 |
| EP | 2 146 247 A1 | 1/2010 |
| JP | 7-295220 A | 11/1995 |
| JP | 2000-29220 A | 1/2000 |
| JP | 2002-174904 A | 6/2002 |
| JP | 2004-210763 A | 7/2004 |
| JP | 3546687 B2 | 7/2004 |
| JP | 2005-99558 A | 4/2005 |
| JP | 2005-208366 A | 8/2005 |
| JP | 2005208366 * | 8/2005 |
| JP | 2008-95009 A | 4/2008 |

(Continued)

OTHER PUBLICATIONS

Search Report dated Jul. 1, 2014 issued by the European Patent Office in counterpart European Patent Application No. 11856421.0.

(Continued)

*Primary Examiner* — John S. Chu

(74) *Attorney, Agent, or Firm* — Sughrue Mion, PLLC

(57) ABSTRACT

A chemical amplification resist composition contains: (A) a polymer compound having a structure where a hydrogen atom of a phenolic hydroxyl group is replaced by a group having a non-acid-decomposable polycyclic alicyclic hydrocarbon structure; and (B) a compound capable of generating an acid upon irradiation with an actinic ray or radiation.

20 Claims, 2 Drawing Sheets

(56) References Cited

FOREIGN PATENT DOCUMENTS

| JP | 2008-162101 A | 7/2008 |
|----|---------------|--------|
| JP | 2008-249889 A | 10/2008 |
| JP | 2009-86354 A  | 4/2009 |

OTHER PUBLICATIONS

Office Action dated Jul. 1, 2014, from the Japanese Patent Office in a Japanese Application No. 2011-255302.
International Search Report (PCT/ISA/210), dated Apr. 3, 2012, issued by the International Searching Authority in counterpart International Patent Application No. PCT/JP2011/080549.
Written Opinion (PCT/ISA/237), dated Apr. 3, 2012, issued by the International Searching Authority in counterpart International Patent Application No. PCT/JP2011/080549.
Search Report dated May 8, 2015, issued by the Intellectual Property Office of Singapore in counterpart Singaporean Application No. 2013054861.
Written Opinion dated May 8, 2015, issued by the Intellectual Property Office of Singapore in counterpart Singaporean Application No. 2013054861.
Office Action issued on May 12, 2015 by the Taiwanese Intellectual Property Office in corresponding Taiwan Application No. 100148741.
Office Action from the Chinese Patent Office issued Sep. 6, 2015 in counterpart Chinese Application No. 201180065257.X.
Office Action dated Apr. 1, 2016 in corresponding Korean Patent Application No. 10-2013-7018904.
Communication dated Oct. 10, 2016, from the State Intellectual Property Office of People's Republic of China in corresponding Chinese Application No. 201180065257.X.
Masamitsu Shirai et al., "Non-Chemically Amplified Negative Resist for EUV Lithography", Advances in Resist Materials and Processing Technology XXVI, edited by Clifford L. Henderson, Proc. of SPIE vol. 7273, 72731N, Mar. 13, 2009, pp. 72731N-8, 9 Pages Total DOI: 10.1117/12.813377, Downloaded From: http://spiedigitallibrary.org/ on Sep. 27, 2016.
Office Action dated Oct. 19, 2016 issued by the Korean Intellectual Property Office in Korean Patent Application No. 10-2013-7018904.
Office Action dated Sep. 14, 2016, issued by the European Patent Office in counterpart European Application No. 11 856 421.0.
Office Action dated Jan. 5, 2017 issued by the Korean Intellectual Property Office in counterpart Korean Patent Application No. 10-2013-7018904.

* cited by examiner

CHEMICAL AMPLIFICATION RESIST COMPOSITION, RESIST FILM USING THE COMPOSITION, RESIST-COATED MASK BLANKS, RESIST PATTERN FORMING METHOD, PHOTOMASK AND POLYMER COMPOUND

CROSS REFERENCE TO RELATED APPLICATION

This is a continuation of International Application No. PCT/JP2011/080549 filed on Dec. 22, 2011, and claims priority from Japanese patent application Nos. JP 2011-8331 filed on Jan. 18, 2011, and JP 2011-255302 filed on Nov. 22, 2011, and U.S. Provisional Application No. 61/504,431 filed on Jul. 5, 2011, the entire disclosures of which are incorporated therein by reference.

TECHNICAL FIELD

The present invention relates to a chemical amplification resist composition suitably usable in the ultramicrolithography process such as production of VLSI or a high-capacity microchip as well as in other photofabrication processes and capable of forming a highly defined pattern by using an electron beam or an extreme-ultraviolet ray, a resist film using the composition, a resist-coated mask blanks, a resist pattern forming method, a photomask and a polymer compound. More specifically, the present invention relates to a chemical amplification resist composition for use in the process using a substrate having a specific underlying film, a resist film using the composition, a resist-coated mask blanks, a resist pattern forming method, a photomask and a polymer compound.

BACKGROUND ART

In the microfabrication using a resist composition, with an increase in the integration degree of an integrated circuit, formation of an ultrafine pattern is required. To meet this requirement, the exposure wavelength tends to become shorter, such as from g line to i line or further to excimer laser light, and, for example, development of a lithography technique using an electron beam is proceeding. As the resin used for the exposure to excimer laser light such as KrF excimer laser, a resin having a structure where a hydrogen atom of a phenolic hydroxyl group is replaced by a group having an aliphatic hydrocarbon residue, a resin having a structure where the hydrogen atom is replaced by a group having an aryl group, and a resin having a structure where the hydrogen atom is replaced by an alkyl group, are described in JP-A-2000-29220 (the term "JP-A" as used herein means an "unexamined published Japanese patent application"), Japanese Patent No. 3,546,687 and JP-A-7-295220, respectively.

In order to form an ultrafine pattern, thin film formation of the resist is necessary, but when the resist is formed as a thin film, its dry etching resistance is reduced. Also, in the electron beam lithography, recently, the accelerating voltage of the electron beam (EB) is increased to reduce the effect of electron scattering (forward scattering) in the resist film. However, in this case, the resist film is reduced in the electron energy trapping ratio to decrease the sensitivity, and the effect of scattering (back scattering) of electrons reflected in the resist substrate increases. In particular, when forming an isolated pattern having a large exposure area, the effect of back scattering is large, and the resolution of the isolated pattern is impaired.

Particularly, in the case of patterning on a photomask blanks used for semiconductor exposure, a light-shielding film containing a heavy atom is present as the layer below the resist, and the effect of backward scattering attributable to the heavy atom is serious. Therefore, in the case of forming an isolated pattern on a photomask blanks, among others, the resolution is highly likely to decrease.

As one of the methods to solve these problems, use of a resin having a polycyclic aromatic skeleton such as naphthalene is being studied (see, for example, JP-A-2008-95009 and JP-A-2009-86354), but the problem about the resolution of an isolated pattern has been unsolved. In JP-A-2005-99558, as one of the methods to enhance the resolution of an isolated pattern, a resin containing a group for adjusting the solubility is used, but it has not been achieved to sufficiently satisfy the resolution of an isolated pattern.

Also, the microfabrication using a resist composition is not only used directly to produce an integrated circuit but also applied, in recent year, to the fabrication or the like of a so-called imprint mold structure (see, for example, JP-A-2008-162101 and Yoshihiko Hirai (compiler), Nanoimprint no Kiso to Gijutsu Kaihatsu●Oyo Tenkai-Nanoimprint no Kiban Gijutsu to Saishin no Gijutsu Tenkai (Basic and Technology Expansion●Application Development of Nanoimprint-Fundamental Technology of Nanoimprint and Latest Technology Expansion), Frontier Shuppan (issued June, 2006)). Therefore, it becomes an important task to satisfy high sensitivity, high resolution property (for example, high resolution, excellent pattern profile and small line edge roughness (LER)) and good dry etching resistance all at the same time, and this needs to be solved.

SUMMARY OF INVENTION

An object of the present invention is to provide a chemical amplification resist composition capable of forming a pattern satisfying high sensitivity, high resolution property (for example, high resolution, excellent pattern profile and small line edge roughness (LER)) and good dry etching resistance all at the same time, and a resist film using the composition, a resist-coated mask blanks, a resist pattern forming method, a photomask and a polymer compound.

Another object of the present invention is to provide a chemical amplification resist composition exhibiting high resolution particularly in forming a fine isolated pattern by exposure to an electron beam or an extreme-ultraviolet ray.

As a result of intensive studies, the present inventors have found that the above-described objects can be attained by a chemical amplification resist composition containing a polymer compound of specific structure.

That is, the present invention is as follows.

[1]

A chemical amplification resist composition, comprising:

(A) a polymer compound having a structure where a hydrogen atom of a phenolic hydroxyl group is replaced by a group having a non-acid-decomposable polycyclic alicyclic hydrocarbon structure; and (B) a compound capable of generating an acid upon irradiation with an actinic ray or radiation.

[2]

The chemical amplification resist composition as described in [1] above, which is for electron beam or extreme-ultraviolet exposure.

[3]

The chemical amplification resist composition as described in [1] or [2] above, wherein the polymer compound (A) contains a repeating unit represented by the following formula (1):

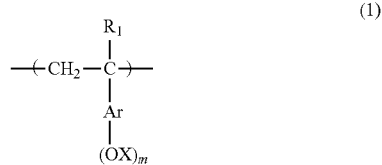

wherein $R_1$ represents a hydrogen atom or a methyl group;

X represents a group having a non-acid-decomposable polycyclic alicyclic hydrocarbon structure;

Ar represents an aromatic ring; and m is an integer of 1 or more.

[4]

The chemical amplification resist composition as described in [3] above, wherein the repeating unit represented by formula (1) is a repeating unit represented by the following formula (2) and the polymer compound (A) further contains a repeating unit represented by the following formula (3):

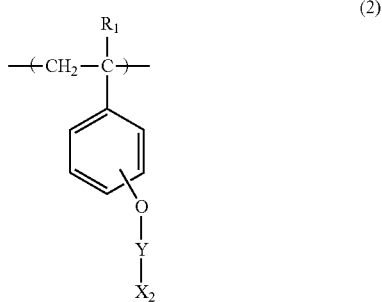

wherein $R_1$ represents a hydrogen atom or a methyl group;

Y represents a single bond or a divalent linking group; and $X_2$ represents a non-acid-decomposable polycyclic alicyclic hydrocarbon group;

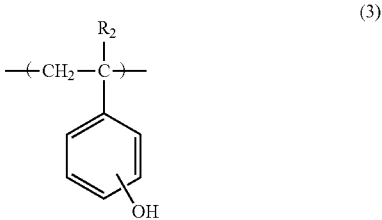

wherein $R_2$ represents a hydrogen atom or a methyl group.

[5]

The chemical amplification resist composition as described in [4] above, wherein in formula (2), Y is a divalent linking group and the divalent linking group is a carbonyl group.

[6]

The chemical amplification resist composition as described in any one of [1] to [5] above, wherein the compound (B) is an onium compound.

[7]

The chemical amplification resist composition as described in any one of [1] to [6] above, wherein a dispersity of the polymer compound (A) is from 1.0 to 1.35.

[8]

The chemical amplification resist composition as described in any one of [1] to [7] above, which is a negative chemical amplification resist composition, further comprising:

(C) a compound having two or more hydroxymethyl groups or alkoxymethyl groups per molecule.

[9]

The chemical amplification resist composition as described in any one of [1] to [7] above, which is a positive chemical amplification resist composition, wherein the polymer compound (A) further contains a repeating unit having a group capable of decomposing by an action of an acid to produce an alkali-soluble group.

[10]

A resist film, which is formed from the chemical amplification resist composition described in any one of [1] to [9] above.

[11]

A resist-coated mask blanks, which is coated with the resist film described in [10] above.

[12]

A resist pattern forming method, comprising:

exposing the resist film described in [10] above, so as to form an exposed film; and developing the exposed film.

A resist pattern forming method, comprising:

exposing the resist-coated mask blanks described in [11] above, so as to form an exposed resist-coated mask blanks; and developing the exposed resist-coated mask blanks.

[14]

The resist pattern forming method as described in [12] or [13] above, wherein the exposure is performed using an electron beam or an extreme-ultraviolet ray.

[15]

A photomask, which is obtained by exposing and developing the resist-coated mask blanks described in [11] above.

[16]

A polymer compound, which has a structure where a hydrogen atom of a phenolic hydroxyl group is replaced by a group having a non-acid-decomposable polycyclic alicyclic hydrocarbon structure.

[17]

The polymer compound as described in [16] above, wherein the group having a non-acid-decomposable polycyclic alicyclic hydrocarbon structure is a group having a non-acid-decomposable adamantane structure.

DESCRIPTION OF EMBODIMENTS

Figure 1:
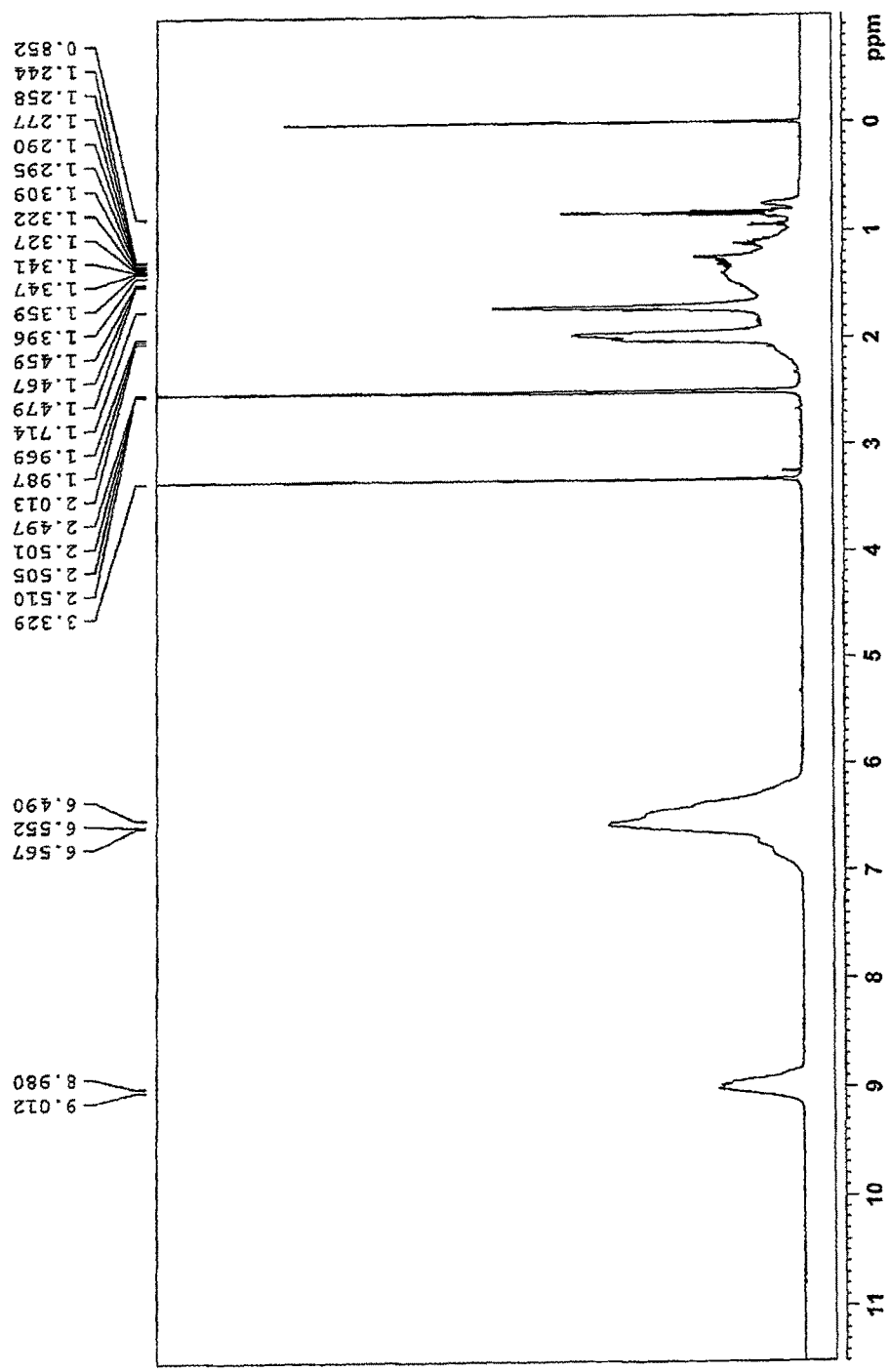
FIG. 1 is the $^1$H-NMR measurement chart in a $d^6$-DMSO (dimethylsulfoxide) solvent of the polymer compound (A1) synthesized in Synthesis Example 1.

The mode for carrying out the present invention is described in detail below.

Incidentally, in the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The chemical amplification resist composition of the present invention contains (A) a polymer compound having a structure where a hydrogen atom of a phenolic hydroxyl group is replaced by a group having a non-acid-decomposable polycyclic alicyclic hydrocarbon structure, and (B) a compound capable of generating an acid upon irradiation with an actinic ray or radiation.

The chemical amplification resist composition of the present invention is preferably for electron beam or extreme-ultraviolet exposure.

The chemical amplification resist composition of the present invention may be a negative chemical amplification resist composition or a positive chemical amplification resist composition.

The chemical amplification resist composition of the present invention is described in detail below.

[1] (A) Polymer Compound

The chemical amplification resist composition of the present invention contains (A) a polymer compound having a structure where a hydrogen atom of a phenolic hydroxyl group is replaced by a group having a non-acid-decomposable polycyclic alicyclic hydrocarbon structure.

The present invention also relates to the polymer compound (A).

In the present invention, (A) a polymer compound having the above-described specific structure is used and thanks to the specific structure, the glass transition temperature (Tg) of the polymer compound (A) becomes high, whereby a very hard resist film can be formed and the acid diffusion and dry etching resistance can be controlled. Accordingly, an acid is highly constrained from diffusion in the area exposed to an actinic ray or radiation such as electron beam and extreme-ultraviolet ray, and this produces an excellent effect in terms of resolution, pattern profile and LER in a fine pattern. Also, the configuration that the polymer compound (A) has a non-acid-decomposable polycyclic alicyclic hydrocarbon structure is considered to contribute to high dry etching resistance. Furthermore, although details are unknown, it is presumed that the polycyclic alicyclic hydrocarbon structure has a high hydrogen radical-donating property and the polymer compound works out to a hydrogen source when decomposing the later-described photoacid generator, that is, (B) a compound capable of generating an acid upon irradiation with an actinic ray or radiation, as a result, the decomposition efficiency of the photoacid generator and in turn, the acid generation efficiency are enhanced. This is considered to contribute to the excellent sensitivity.

In the specific structure of the polymer compound (A) for use in the present invention, an aromatic ring such as benzene ring and a group having a non-acid-decomposable polycyclic alicyclic hydrocarbon structure are connected through an oxygen atom derived from a phenolic hydroxyl group. This specific structure contributes to high dry etching resistance as described above and moreover, enables raising the glass transition temperature (Tg) of the polymer compound (A), and the combination of these effects is presumed to ensure the resolution, particularly, high resolution in forming a fine isolated pattern by exposure to an electron beam or an extreme-ultraviolet ray.

The effect of raising the glass transition temperature (Tg) by the polymer compound (A) for use in the present invention is higher in using the polymer compound (A) in a negative resist composition than in the case of using it in a positive resist composition. For this reason, the chemical amplification resist composition of the present invention is preferably a negative chemical amplification resist composition.

In the present invention, the "non-acid-decomposable" means a property of not causing a decomposition reaction by the effect of the acid generated from the later-described (B) compound capable of generating an acid upon irradiation with an actinic ray or radiation.

More specifically, the group having a non-acid-decomposable polycyclic alicyclic hydrocarbon structure is preferably stable to an acid and an alkali. The "group stable to an acid and an alkali" means a group not exhibiting acid decomposability and alkali decomposability. The "acid decomposability" as used herein means a property of causing a decomposition reaction by the action of an acid generated from the later-described (B) compound capable of generating an acid upon irradiation with an actinic ray or radiation, and the group exhibiting acid decomposability includes the acid decomposable group described later in "Repeating Unit Having Acid-Decomposable Group".

Also, the "alkali decomposability" means a property of causing a decomposition reaction by the action of an alkali developer, and the group exhibiting alkali decomposability includes the conventionally known group capable of decomposing by the action of an alkali developer to increase the dissolution rate in an alkali developer (for example, a group having a lactone structure), which is contained in the resin suitably used for the positive chemical amplification resist composition.

The phenolic hydroxyl group as used in the present application is a group formed by replacing a hydrogen atom of an aromatic ring group by a hydroxyl group. The aromatic ring of the aromatic ring group is a monocyclic or polycyclic aromatic ring and includes, for example, a benzene ring and a naphthalene ring.

In the present invention, the group having a polycyclic alicyclic hydrocarbon structure is not particularly limited as long as it is a monovalent group having a polycyclic alicyclic hydrocarbon structure, but the total carbon number thereof is preferably from 5 to 40, more preferably from 7 to 30. The polycyclic alicyclic hydrocarbon structure may have an unsaturated bond in the ring.

The polycyclic alicyclic hydrocarbon structure in the group having a polycyclic alicyclic hydrocarbon structure means a structure having plural monocyclic alicyclic hydrocarbon groups, or an alicyclic hydrocarbon structure of a polycyclic type, and may be a crosslinked structure. The monocyclic alicyclic hydrocarbon group is preferably a cycloalkyl group having a carbon number of 3 to 8, and examples thereof include a cyclopropyl group, a cyclopentyl group, a cyclohexyl group, a cyclobutyl group and a cyclooctyl group. The structure having plural monocyclic alicyclic hydrocarbon groups has plural such groups. The structure having plural monocyclic alicyclic hydrocarbon groups preferably has 2 to 4 monocyclic alicyclic hydrocarbon groups, more preferably two monocyclic alicyclic hydrocarbon groups.

The alicyclic hydrocarbon structure of the polycyclic type includes, for example, a bicyclo-, tricyclo- or tetracyclo-structure having a carbon number of 5 or more and is preferably a polycyclic cyclo-structure having a carbon number of 6 to 30, and examples thereof include an adamantane structure, a decalin structure, a norbornane structure, a norbornene structure, a cedrol structure, an isobornane structure, a bornane structure, a dicyclopentane structure, an α-pinene structure, a tricyclodecane structure, a tetracyclodecane structure and an androstane structure. Incidentally, a part of carbon atoms in the monocyclic or polycyclic cycloalkyl group may be replaced by a heteroatom such as oxygen atom.

The polycyclic alicyclic hydrocarbon structure is preferably an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, or a tricyclodecane structure, and most preferably an adamantane structure in view of dry etching resistance (that is, it is most preferred that the group having a non-acid-decomposable polycyclic alicyclic hydrocarbon structure is a group having a non-acid-decomposable adamantane structure).

Chemical formulae of these polycyclic alicyclic hydrocarbon structures (with respect to the structure having a plurality of monocyclic alicyclic hydrocarbon groups, the monocyclic alicyclic hydrocarbon structure corresponding to the monocyclic alicyclic hydrocarbon group (specifically, structures of the following formulae (47) to (50))) are illustrated below.

(1)

(2)

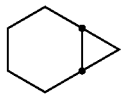

(3)

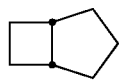

(4)

-continued

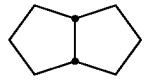

(5)

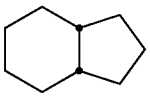

(6)

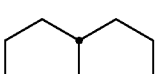

(7)

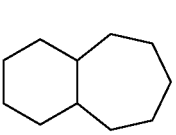

(8)

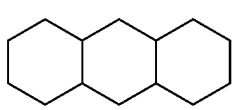

(9)

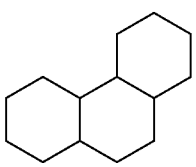

(10)

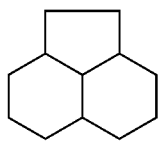

(11)

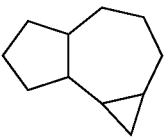

(12)

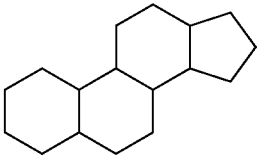

(13)

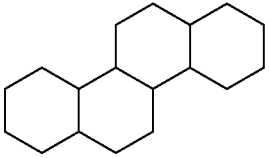

(14)

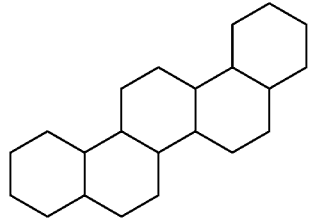

(15)

-continued
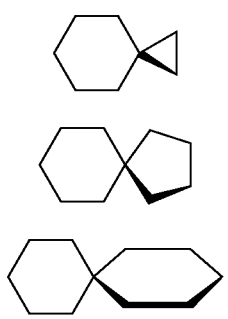
(16)
(17)
(18)
(19)
(20)
(21)
(22)
(23)
(24)
(25)
(26)
(27)
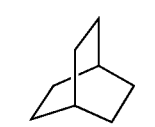
(28)
-continued
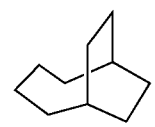
(29)
(30)
(31)
(32)
(33)
(34)
(35)
(36)
(37)
(38)
(39)
(40)

(41) 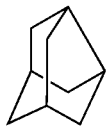

(42) 

(43) 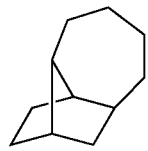

(44) 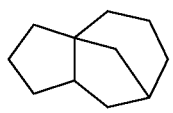

(45) 

(46) 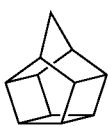

(47) 

(48) 

(49) 

(50) 

(51) 

The polycyclic alicyclic hydrocarbon structure may further have a substituent, and examples of the substituent include an alkyl group (preferably having a carbon number of 1 to 6), a cycloalkyl group (preferably having a carbon number of 3 to 10), an aryl group (preferably having a carbon number of 6 to 15), a halogen atom, a hydroxyl group, an alkoxy group (preferably having a carbon number of 1 to 6), a carboxyl group, a carbonyl group, a thiocarbonyl group, an alkoxycarbonyl group (preferably having a carbon number of 2 to 7), and a combination of these groups (preferably having a total carbon number of 1 to 30, more preferably a total carbon number of 1 to 15).

The polycyclic alicyclic hydrocarbon structure is preferably a structure represented by any one of formulae (7), (23), (40), (41) and (51), or a structure having two monovalent groups each formed by substituting a bond for one arbitrary hydrogen atom on the structure of formula (48), more preferably a structure represented by any one of formulae (23), (40) and (51), or a structure having two monovalent groups each formed by substituting a bond for one arbitrary hydrogen atom on the structure of formula (48), and most preferably a structure represented by formula (40).

The group having a polycyclic alicyclic hydrocarbon structure is preferably a monovalent group formed by substituting a bond for one arbitrary hydrogen atom on the above-described polycyclic alicyclic hydrocarbon structure.

In the polymer compound (A), the structure where a hydrogen atom of a phenolic hydroxyl group is replaced by a group having a non-acid-decomposable polycyclic alicyclic hydrocarbon structure is preferably contained as a repeating unit represented by the following formula (1):

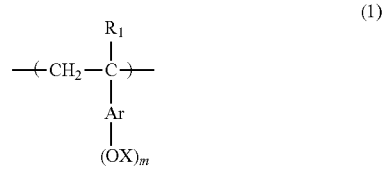

(wherein $R_1$ represents a hydrogen atom or a methyl group, X represents a group having a non-acid-decomposable polycyclic alicyclic hydrocarbon structure, Ar represents an aromatic ring, and m is an integer of 1 or more).

In formula (1), $R_1$ represents a hydrogen atom or a methyl group and is preferably a hydrogen atom.

Examples of the aromatic ring represented by Ar in formula (1) include an aromatic hydrocarbon ring having a carbon number of 6 to 18 which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred.

The aromatic ring of Ar may have a substituent other than the group represented by —OX, and examples of the substituent include an alkyl group (preferably having a carbon number of 1 to 6), a cycloalkyl group (preferably having a carbon number of 3 to 10), an aryl group (preferably having a carbon number of 6 to 15), a halogen atom, a hydroxyl group, an alkoxy group (preferably having a carbon number of 1 to 6), a carboxyl group and an alkoxycarbonyl group (preferably having a carbon number of 2 to 7). Among these, an alkyl group, an alkoxy group and an alkoxycarbonyl group are preferred, and an alkoxy group is more preferred.

X represents a group having a non-acid-decomposable polycyclic alicyclic hydrocarbon structure. Specific examples and preferred ranges of the group having a non-acid-decomposable polycyclic alicyclic hydrocarbon structure represented by X, are the same as those described above.

X is more preferably a group represented by —Y—$X_2$ in later described formula (2).

m is preferably an integer of 1 to 5 and most preferably 1. When m is 1 and Ar is a benzene ring, the substitution position of —OX may be a para-position, a meta-position or an ortho-position with respect to the bonding position of the benzene ring to the polymer main chain but is preferably a para-position or a meta-position, and more preferably a para-position.

In the present invention, the repeating unit represented by formula (1) is preferably a repeating unit represented by the following formula (2).

When a polymer compound having a repeating unit represented by formula (2) is used, Tg of the polymer compound becomes high and a very hard resist film is formed, so that the acid diffusion and dry etching resistance can be more unfailingly controlled.

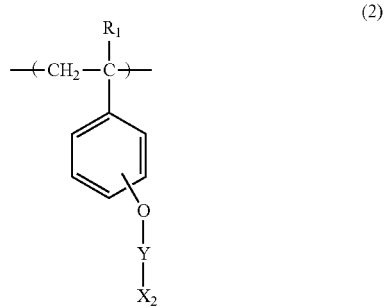

(wherein $R_1$ represents a hydrogen atom or a methyl group, Y represents a single bond or a divalent linking group, and $X_2$ represents a non-acid-decomposable polycyclic alicyclic hydrocarbon group).

Preferred embodiments of the repeating unit represented by formula (2) for use in the present invention are described below.

In formula (2), $R_1$ represents a hydrogen atom or a methyl group and is preferably a hydrogen atom.

In formula (2), Y is preferably a divalent linking group. The divalent linking group of Y is preferably a carbonyl group, a thiocarbonyl group, an alkylene group (preferably having a carbon number of 1 to 10, more preferably a carbon number of 1 to 5), a sulfonyl group, —COCH$_2$—, —NH— or a divalent linking group composed of a combination thereof (having a total carbon number of 1 to 20, more preferably a total carbon number of 1 to 10), more preferably a carbonyl group, —COCH$_2$—, a sulfonyl group, —CONH— or —CSNH—, still more preferably a carbonyl group or —COCH$_2$—, still further more preferably a carbonyl group.

$X_2$ represents a polycyclic alicyclic hydrocarbon group and is non-acid-decomposable. The total carbon number of the polycyclic alicyclic hydrocarbon group is preferably from 5 to 40, more preferably from 7 to 30. The polycyclic alicyclic hydrocarbon group may have an unsaturated bond in the ring.

This polycyclic alicyclic hydrocarbon group is a group having plural monocyclic alicyclic hydrocarbon groups, or an alicyclic hydrocarbon group of a polycyclic type, and may be a crosslinked group. The monocyclic alicyclic hydrocarbon group is preferably a cycloalkyl group having a carbon number of 3 to 8, and examples thereof include a cyclopropyl group, a cyclopentyl group, a cyclohexyl group, a cyclobutyl group and a cyclooctyl group. The group has plural such groups. The group having plural monocyclic alicyclic hydrocarbon groups preferably has 2 to 4 monocyclic alicyclic hydrocarbon groups, more preferably two monocyclic alicyclic hydrocarbon groups.

The alicyclic hydrocarbon group of a polycyclic type includes a group containing, for example, a bicyclo-, tricyclo- or tetracyclo-structure having a carbon number of 5 or more and is preferably a group containing a polycyclic cyclo-structure having a carbon number of 6 to 30, and examples thereof include an adamantyl group, a norbornyl group, a norbornenyl group, an isoboronyl group, a camphanyl group, a dicyclopentyl group, an α-pinel group, a tricyclodecanyl group, a tetracyclodecanyl group and an androstanyl group. Incidentally, a part of carbon atoms in the monocyclic or polycyclic cycloalkyl group may be replaced by a heteroatom such as oxygen atom.

The polycyclic alicyclic hydrocarbon group of $X_2$ is preferably an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups, or a tricyclodecanyl group, and most preferably an adamantyl group in view of dry etching resistance. Examples of the chemical formula of the polycyclic alicyclic hydrocarbon structure in the polycyclic alicyclic hydrocarbon group of $X_2$ are the same as those of the chemical formula of the polycyclic alicyclic hydrocarbon structure in the above-described group having a polycyclic alicyclic hydrocarbon structure, and the preferred range is also the same. The polycyclic alicyclic hydrocarbon group of $X_2$ includes a monovalent group formed by substituting a bond for one arbitrary hydrogen atom on the above-described polycyclic alicyclic hydrocarbon structure.

The alicyclic hydrocarbon group may have a substituent, and examples of the substituent are the same as those described above as the substituent which may be substituted on the polycyclic alicyclic hydrocarbon structure.

In formula (2), the substitution position of —O—Y—$X_2$ may be a para-position, a meta-position or an ortho-position with respect to the bonding position of the benzene ring to the polymer main chain but is preferably a para-position.

In the present invention, the repeating unit represented by formula (1) is most preferably a repeating unit represented by the following formula (2'):

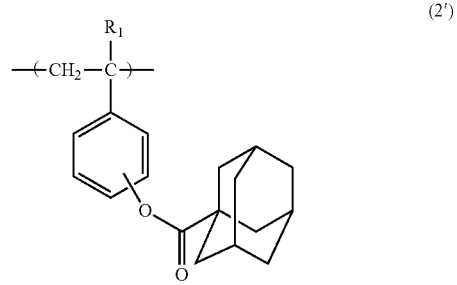

(wherein $R_1$ represents a hydrogen atom or a methyl group).

In formula (2'), $R_1$ represents a hydrogen atom or a methyl group and is preferably a hydrogen atom.

In formula (2'), the substitution position of the adamantyl ester group may be a para-position, a meta-position or an ortho-position with respect to the bonding position of the benzene ring to the polymer main chain but is preferably a para-position.

Specific examples of the repeating unit represented by formula (1) or (2) include the followings.
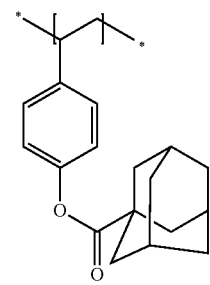 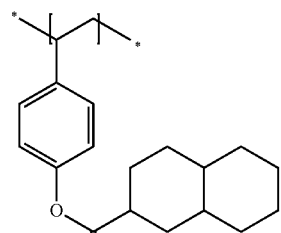
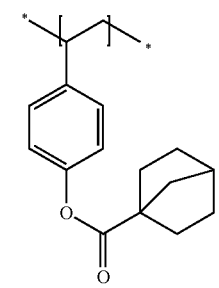 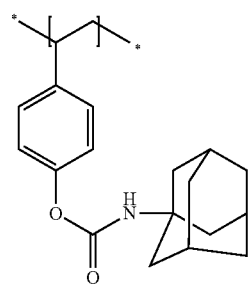
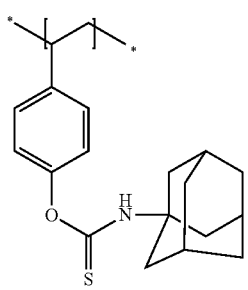 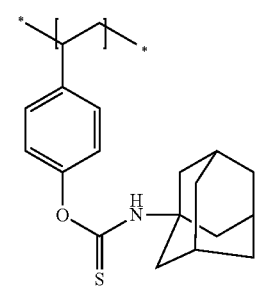
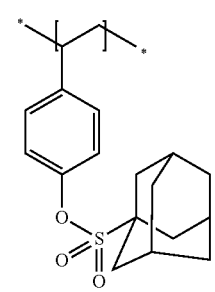 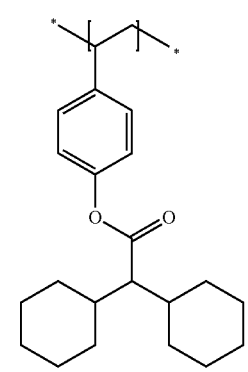
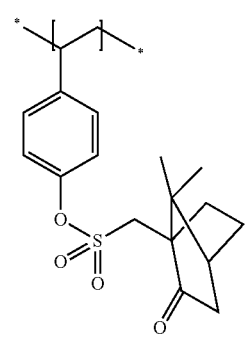 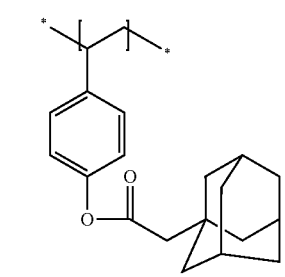
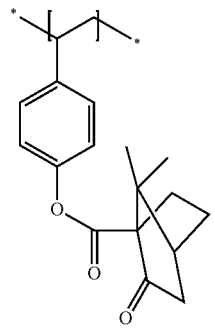 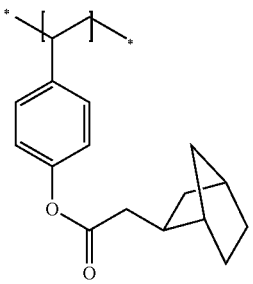
-continued
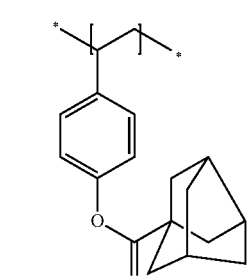 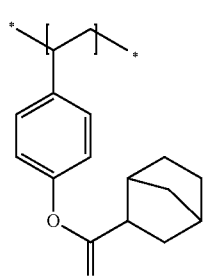
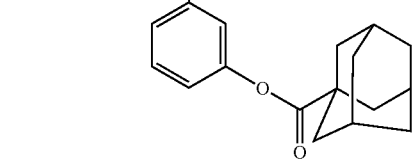
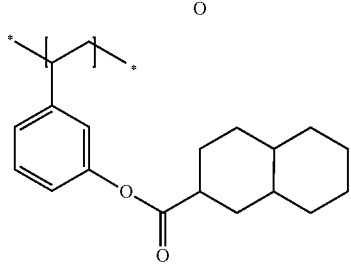
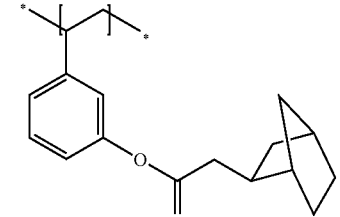
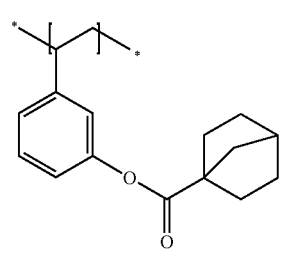

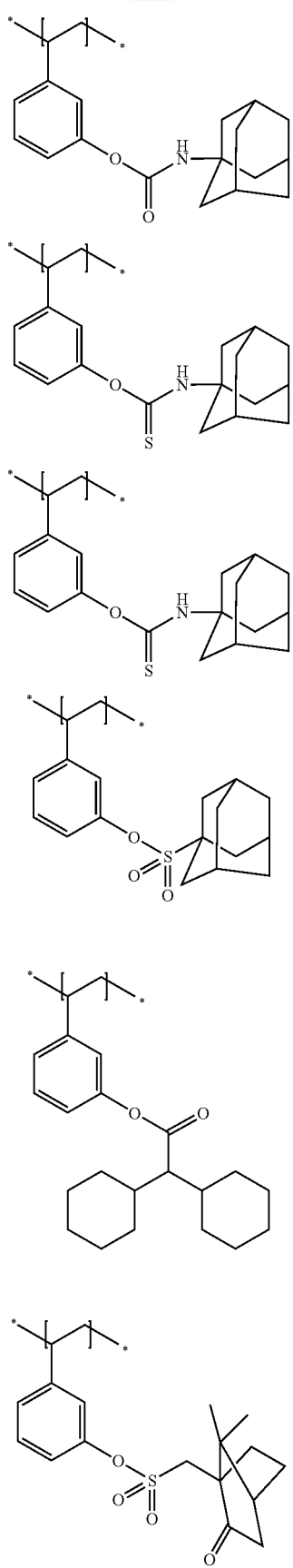

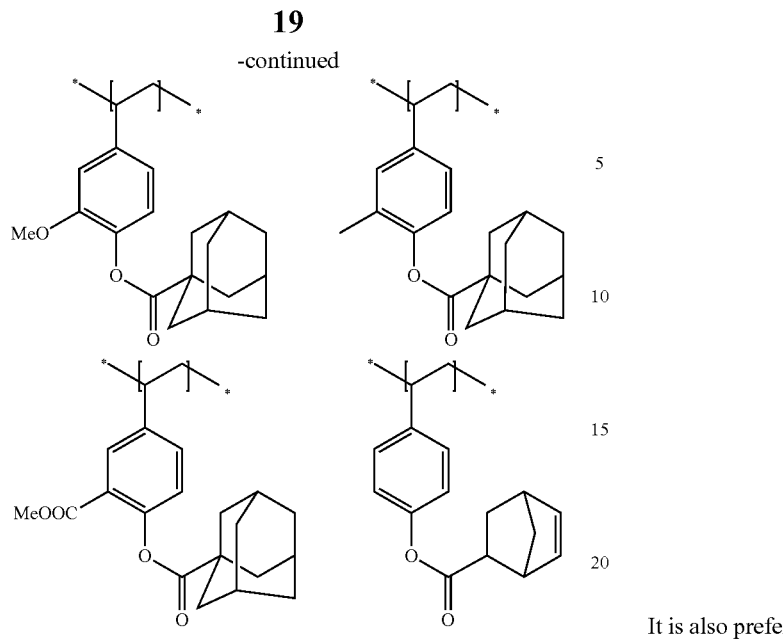

The polymer compound (A) for use in the present invention preferably further contains a repeating unit represented by the following formula (3), in addition to the repeating unit represented by formula (1), (2) or (2').

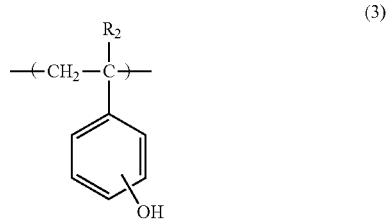

(wherein $R_2$ represents a hydrogen atom or a methyl group).

With respect to the repeating unit represented by formula (3), preferred compounds for use in the present invention are described below.

In formula (3), $R_2$ represents a hydrogen atom or a methyl group and is preferably a hydrogen atom.

With respect to the hydroxystyrene repeating unit represented by formula (3), the substitution position of the hydroxyl group on the benzene ring may be a para-position, a meta-position or an ortho-position with respect to the bonding position of the benzene ring to the polymer main chain but is preferably a para-position or a meta-position, more preferably a para-position.

In formula (3), the benzene ring on which the hydroxyl group is substituted may have a substituent other than the hydroxyl group, and specific examples and preferred examples of the substituent are the same as specific examples and preferred examples of the substituent which may be substituted on the aromatic ring of Ar in formula (1). In formula (3), the benzene ring on which the hydroxyl group is substituted preferably has no substituent other than the hydroxyl group.

As the repeating unit represented by formula (3), preferred repeating units include the followings.

It is also preferred that the polymer compound (A) for use in the present invention further contains the following repeating unit as a repeating unit other than the repeating unit represented by formula (1) or (2) and the repeating unit represented by formula (3).

For example, in the case of using the chemical resist composition of the present invention as a positive resist composition, the polymer compound (A) needs to further contain a repeating unit having a group capable of decomposing by the action of an acid to produce an alkali-soluble group (hereinafter, sometimes referred to as a "repeating unit having an acid-decomposable group").

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a phenolic hydroxyl group, a carboxyl group, a fluorinated alcohol group (preferably hexafluoroisopropanol) and a sulfonic acid group.

The group preferred as the acid-decomposable group is a group where a hydrogen atom of the alkali-soluble group above is replaced by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

The repeating unit capable of decomposing by the action of an acid to produce an alkali-soluble group is preferably a repeating unit represented by the following formula (4), because the reactivity is high and the sensitivity fluctuation during post baking or the process fluctuation during production is small. In the positive resist composition, the repeating unit represented by formula (4) is a repeating unit having, on the side chain, an acetal or ketal group which is a group capable of decomposing by the action of an acid and becoming an alkali-soluble group.

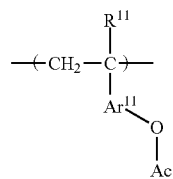

(4)

(wherein $R^{11}$ represents a hydrogen atom or a methyl group, $Ar^{11}$ represents an arylene group, Ac represents a group capable of leaving by the action of an acid, and —OAc represents an acetal or ketal group capable of decomposing by the action of an acid to produce an alkali-soluble group).

With respect to the repeating unit represented by formula (4), preferred compounds for use in the present invention are described below.

In formula (4), $R^{11}$ represents a hydrogen atom or a methyl group and is preferably a hydrogen atom.

In formula (4), $Ar^{11}$ represents an arylene group and may have a substituent. The arylene group of $Ar^{11}$ is preferably an arylene group having a carbon number of 6 to 18, which may have a substituent, more preferably a phenylene or naphthylene group, each of which may have a substituent, and most preferably a phenylene group which may have a substituent. Examples of the substituent which may be substituted on $Ar^{11}$ include an alkyl group, a halogen atom, a hydroxyl group, an alkoxy group, a carboxyl group and an alkoxycarbonyl group.

In the repeating unit represented by formula (4), when $Ar^{11}$ is a phenylene group, the bonding position of —OAc to the benzene ring of $Ar^{11}$ may be a para-position, a meta-position or an ortho-position with respect to the bonding position of the benzene ring to the polymer main chain but is preferably a para-position or a meta-position.

In formula (4), Ac is a group capable of leaving by the action of an acid, and —OAc represents an acetal or ketal group capable of decomposing by the action of an acid to produce an alkali-soluble group. Specifically, Ac is preferably a group represented by the following formula (5):

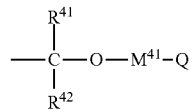

(5)

In formula (5), each of $R^{41}$ and $R^{42}$ independently represents a hydrogen atom, an alkyl group, a cycloalkyl group, an aryl group or an aralkyl group.

$M^{41}$ represents a single bond or a divalent linking group.

Q represents an alkyl group, an alicyclic group which may contain a heteroatom, or an aromatic ring group which may contain a heteroatom.

Incidentally, at least two members of $R^{41}$, $R^{42}$, $M^{41}$ and Q may combine with each other to form a ring. This ring is preferably a 5- or 6-membered ring.

The alkyl group as $R^{41}$ and $R^{42}$ is, for example, an alkyl group having a carbon number of 1 to 8, and preferred examples thereof include a methyl group, an ethyl group, a propyl group, an isopropyl group, an n-butyl group, a sec-butyl group, a tert-butyl group, a hexyl group and an octyl group.

The cycloalkyl group as $R^{41}$ and $R^{42}$ is, for example, a cycloalkyl group having a carbon number of 3 to 15, and preferred examples thereof include a cyclohexyl group, a norbornyl group and an adamantyl group.

The aryl group as $R^{41}$ and $R^{42}$ is, for example, an aryl group having a carbon number of 6 to 15, and preferred examples thereof include a phenyl group, a tolyl group, a naphthyl group and an anthryl group.

The aralkyl group as $R^{41}$ and $R^{42}$ is, for example, an aralkyl group having a carbon number of 6 to 20, and preferred examples thereof include a benzyl group and a phenethyl group.

Each of $R^{41}$ and $R^{42}$ is preferably a hydrogen atom, a methyl group, a phenyl group or a benzyl group. Also, at least either one of $R^{41}$ and $R^{42}$ is preferably a hydrogen atom (that is, —OAc is an acetal group capable of decomposing by the action of an acid to produce an alkali-soluble group).

The divalent linking group as $M^{41}$ is, for example, an alkylene group (preferably an alkylene group having a carbon number of 1 to 8, e.g., methylene, ethylene, propylene, butylene, hexylene, octylene), a cycloalkenylene group (preferably a cycloalkylene group having a carbon number of 3 to 15, e.g., cyclopentylene, cyclohexylene), —S—, —O—, —CO—, —CS—, —SO$_2$—, —N(R$_0$)—, or a combination of two or more thereof, and a linking group having a total carbon number of 20 or less is preferred. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group and an octyl group).

$M^{41}$ is preferably a single bond, an alkylene group, or a divalent linking group composed of a combination of an alkylene group and at least one of —O—, —CO—, —CS— and —N(R$_0$)—, more preferably a single bond, an alkylene group, or a divalent linking group composed of a combination of an alkylene group and —O—. Here, $R_0$ has the same meaning as $R_0$ above.

The alkyl group as Q is, for example, the same as the above-described alkyl group of $R^{41}$ and $R^{42}$.

The alicyclic group and aromatic ring group as Q include, for example, the above-described cycloalkyl group and aryl group of $R^{41}$ and $R^{42}$. The carbon number thereof is preferably from 3 to 15. Incidentally, in the present invention, a group formed by combining plural aromatic rings through a single bond (for example, a biphenyl group and a terphenyl group) is also included in the aromatic group of Q.

Examples of the heteroatom-containing alicyclic group and heteroatom-containing aromatic ring group include thiirane, cyclothiolane, thiophene, furan, pyrrole, benzothiophene, benzofuran, benzopyrrole, triazine, imidazole, benzimidazole, triazole, thiadiazole, thiazole and pyrrolidone. Incidentally, in the present invention, a group formed by combining plural "heteroatom-containing aromatic rings" through a single bond (for example, a viologen group) is also included in the aromatic group of Q.

The alicyclic group and aromatic ring group as Q may have a substituent, and examples thereof include an alkyl group, a cycloalkyl group, a cyano group, a halogen atom, a hydroxyl group, an alkoxy group, a carboxyl group and an alkoxycarbonyl group.

(-M$^{41}$-Q) is preferably a methyl group, an aryloxyethyl group, a cyclohexylethyl group or an arylethyl group.

Examples of the case where at least two members of R$^{41}$, R$^{42}$, M$^{41}$ and Q combine with each other to form a ring include a case where either M$^{41}$ or Q combine with R$^{41}$ to form a propylene group or a butylene group and thereby form a 5- or 6-membered ring containing oxygen atom.

Assuming that the total carbon number of R$^{41}$, R$^{42}$, M$^{41}$ and Q is denoted by Nc, when Nc is large, the change in alkali dissolution rate of the polymer compound (A) between before and after leaving of the group represented by formula (5) becomes large, and the contrast of dissolution is advantageously enhanced. Nc is preferably from 4 to 30, more preferably from 7 to 25, still more preferably from 7 to 20. When Nc is 30 or less, the glass transition temperature of the polymer compound (A) is kept from decreasing, and occurrence of a problem such that the exposure latitude (EL) of the resist is impaired or the residue after leaving of the group represented by formula (5) remains as a defect on the resist pattern is advantageously suppressed.

In view of dry etching resistance, at least one of R$^{41}$, R$^{42}$, M$^{41}$ and Q preferably has an alicyclic or aromatic ring. Here, the alicyclic group and the aromatic ring group are the same, for example, as the above-described alicyclic group and aromatic ring group of Q.

As the repeating unit capable of decomposing by the action of an acid to produce an alkali-soluble group, a repeating unit represented by formula (6) is also preferred. In the positive resist composition, the repeating unit represented by formula (6) is a repeating unit capable of decomposing by the action of an acid to produce a carboxyl group as an alkali-soluble group in the side chain.

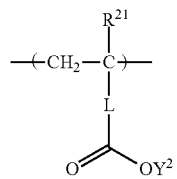

(6)

(wherein R$^{21}$ represents a hydrogen atom or a methyl group, L represents a single bond or a divalent linking group, and Y$^2$ represents a group capable of leaving by the action of an acid).

With respect to the repeating unit represented by formula (6), preferred compounds for use in the present invention are described below.

In formula (6), R$^{21}$ represents a hydrogen atom or a methyl group and is preferably a hydrogen atom.

In the case where L is a divalent linking group, examples thereof include an alkylene group, a cycloalkylene group, an arylene group, —O—, —SO$_2$—, —CO—, —N(R$_N$)— and a combination of plural these members. Here, R$_N$ represents an aryl group, an alkyl group or a cycloalkyl group.

The alkylene group as L is preferably an alkylene group having a carbon number of 1 to 10, and examples thereof include a methylene group, an ethylene group, a propylene group, a butylene group, a hexylene group and an octylene group.

The cycloalkylene group as L is preferably a cycloalkylene group having a carbon number of 5 to 10, and examples thereof include a cyclopentylene group and a cyclohexylene group.

The arylene group as L is preferably an arylene group having a carbon number of 4 to 20, and examples thereof include a phenylene group and a naphthylene group.

The carbon number of the aryl group as R$_N$ is preferably from 4 to 20, more preferably from 6 to 14. Examples of this aryl group include a phenyl group and a naphthyl group.

The carbon number of the alkyl group as R$_N$ is preferably from 1 to 8. Examples of this alkyl group include a methyl group, an ethyl group, a propyl group, a butyl group, a hexyl group and an octyl group.

The carbon number of the cycloalkyl group as R$_N$ is preferably from 5 to 8. Examples of this cycloalkyl group include a cyclopentyl group and a cyclohexyl group.

Each of the groups of L may further have a substituent, and specific examples of the substituent are the same as those of the substituent which may be further substituted on the arylene group of Ar$^{11}$.

Y$^2$ represents a group capable of leaving by the action of an acid and specifically, is preferably a group represented by the following formula:

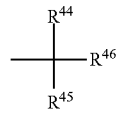

wherein each of R$^{44}$ to R$^{46}$ independently represents an alkyl group or a cycloalkyl group, and two members out of R$^{44}$ to R$^{46}$ may combine with each other to form a cycloalkyl group.

The alkyl group of R$^{44}$ to R$^{46}$ is preferably a linear or branched alkyl group having a carbon number of 1 to 4.

The cycloalkyl group of R$^{44}$ to R$^{46}$ is preferably a monocyclic cycloalkyl group having a carbon number of 3 to 8 or a polycyclic cycloalkyl group having a carbon number of 7 to 20.

The cycloalkyl group which may be formed by combining two members out of R$^{44}$ to R$^{46}$ with each other is preferably a monocyclic cycloalkyl group having a carbon number of 3 to 8 or a polycyclic cycloalkyl group having a carbon number of 7 to 20. Above all, a monocyclic cycloalkyl group having a carbon number of 5 to 6 is preferred. An embodiment where R$^{46}$ is a methyl group or an ethyl group and R$^{44}$ and R$^{45}$ are combined with each other to form the above-described cycloalkyl group, is more preferred.

It is also preferred that Y$^2$ is a group represented by the following formula:

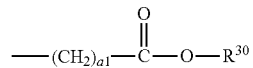

In the formula, R$^{30}$ represents a tertiary alkyl group having a carbon number of 4 to 20, preferably from 4 to 15, a trialkylsilyl group with each alkyl group having a carbon number of 1 to 6, an oxoalkyl group having a carbon number of 4 to 20, or a group represented by —C(R$^{44}$)(R$^{45}$)(R$^{46}$). Specific examples of the tertiary alkyl group include a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group. Specific examples of the trialkylsilyl group include a trimethylsilyl group, a triethylsilyl group, and a dimethyl-tert-butylsilyl group. Specific examples of the oxoalkyl group include a 3-oxocyclohexyl group, a 4-methyl-2-oxooxan-4-yl group, and a 5-methyl-2-oxooxolan-5-yl group. a1 is an integer of 1 to 6.

Specific examples of the repeating unit having a group capable of decomposing by the action of an acid to produce an alkali-soluble group are illustrated below, but the present invention is not limited thereto.

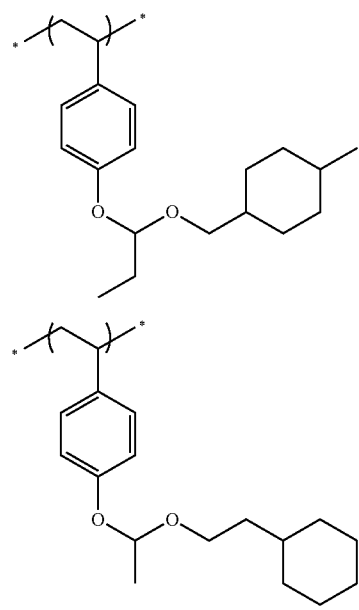
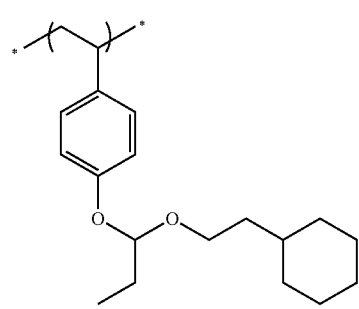
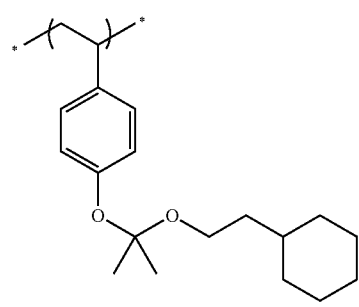
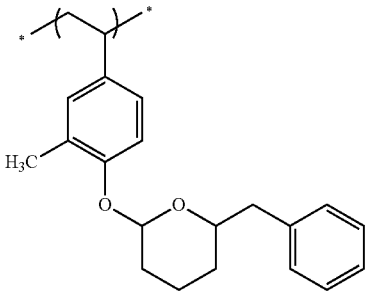

27
-continued
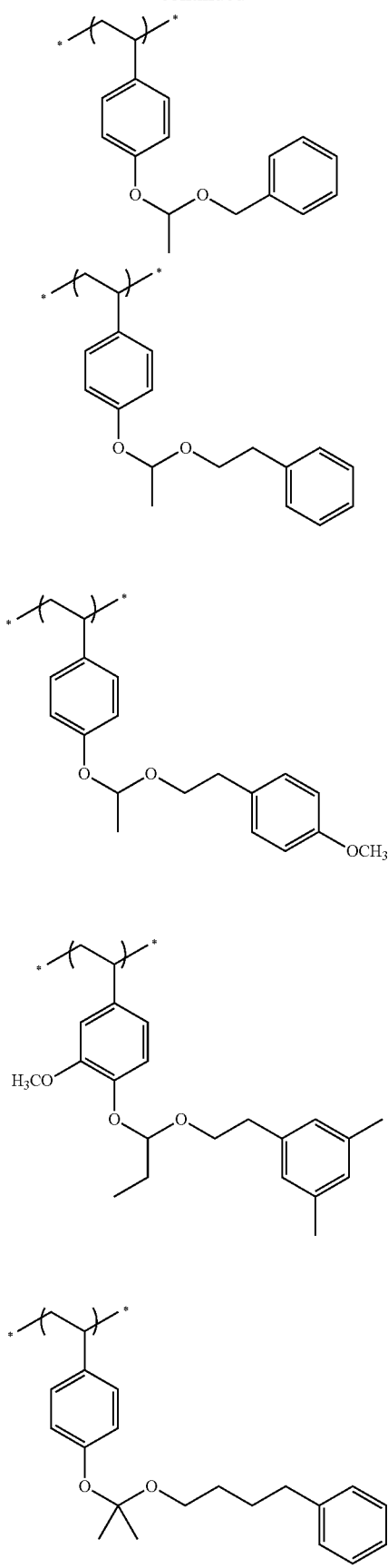
28
-continued
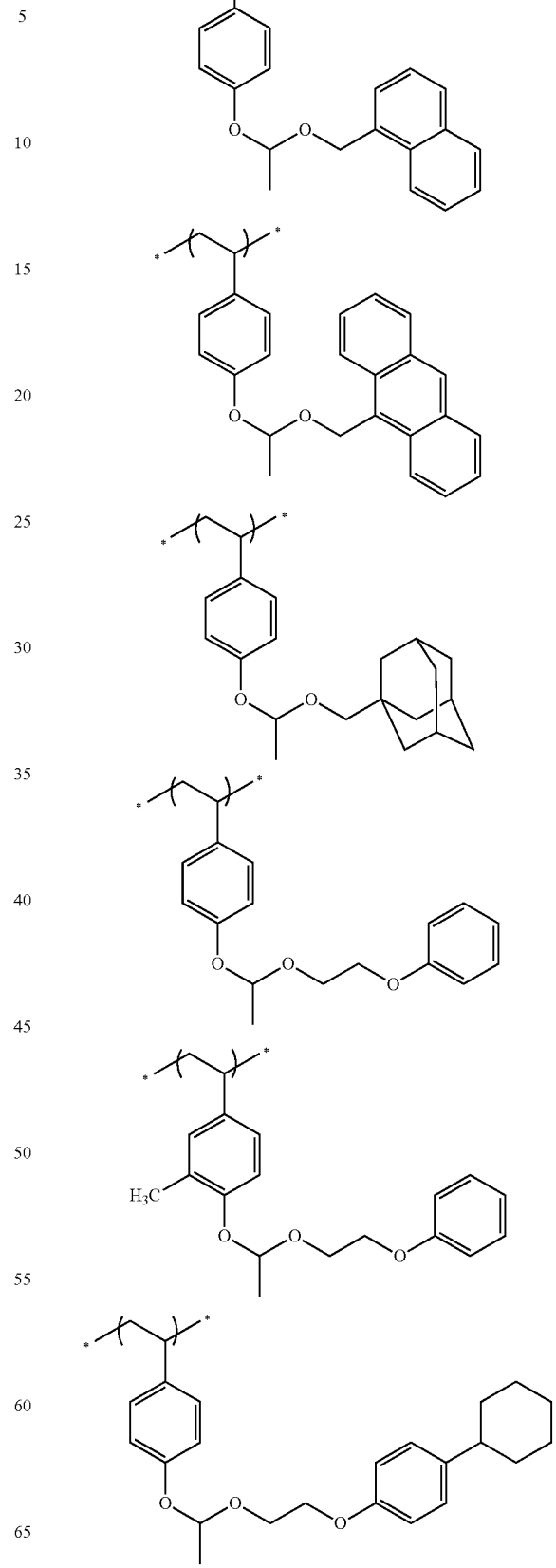

29
-continued
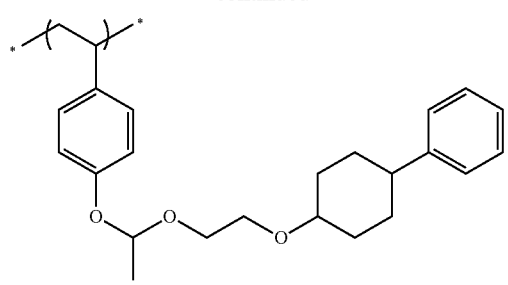
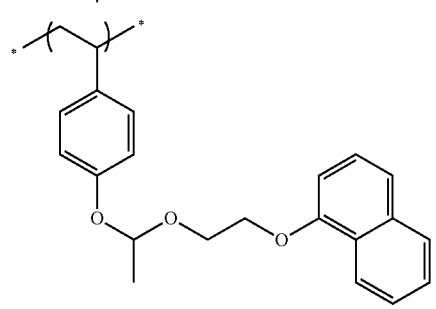
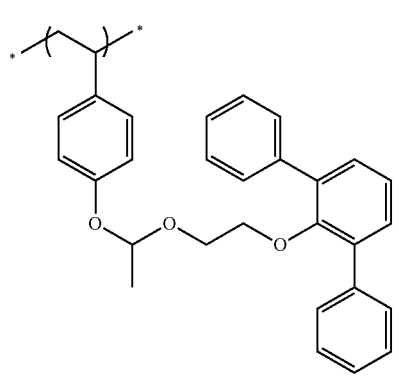
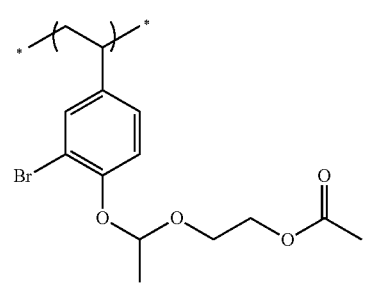
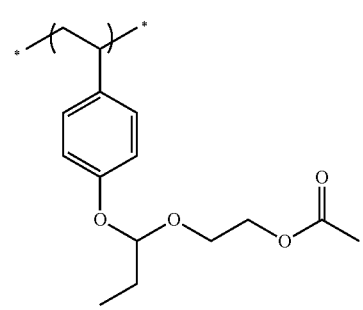
30
-continued
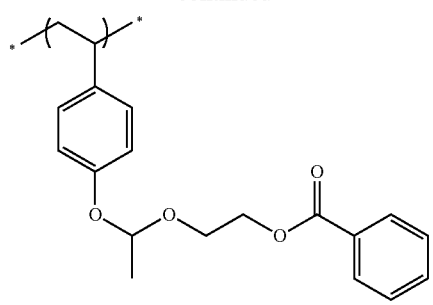
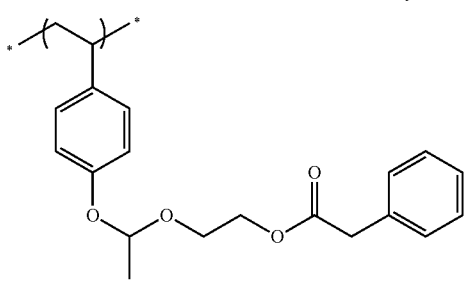
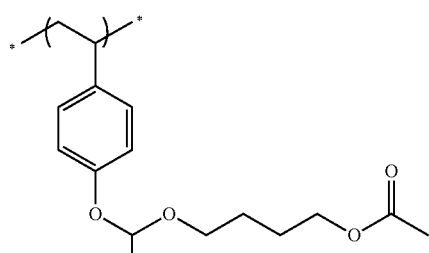
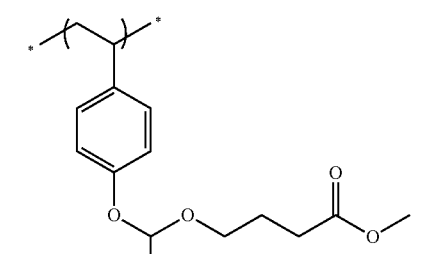
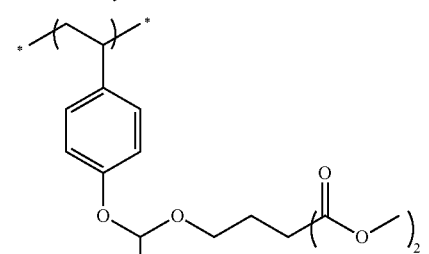
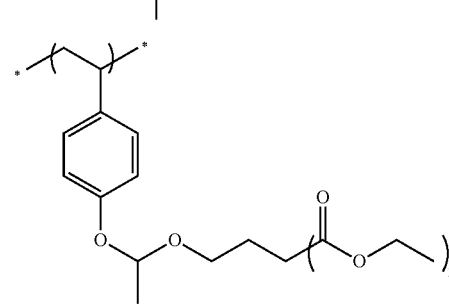

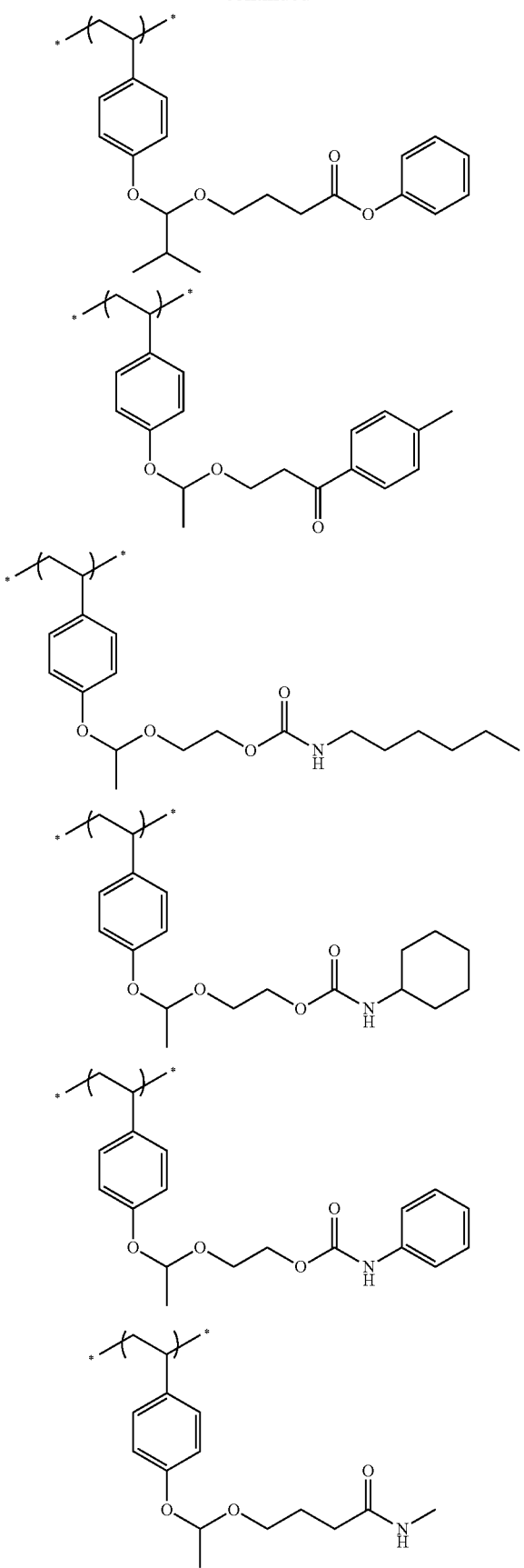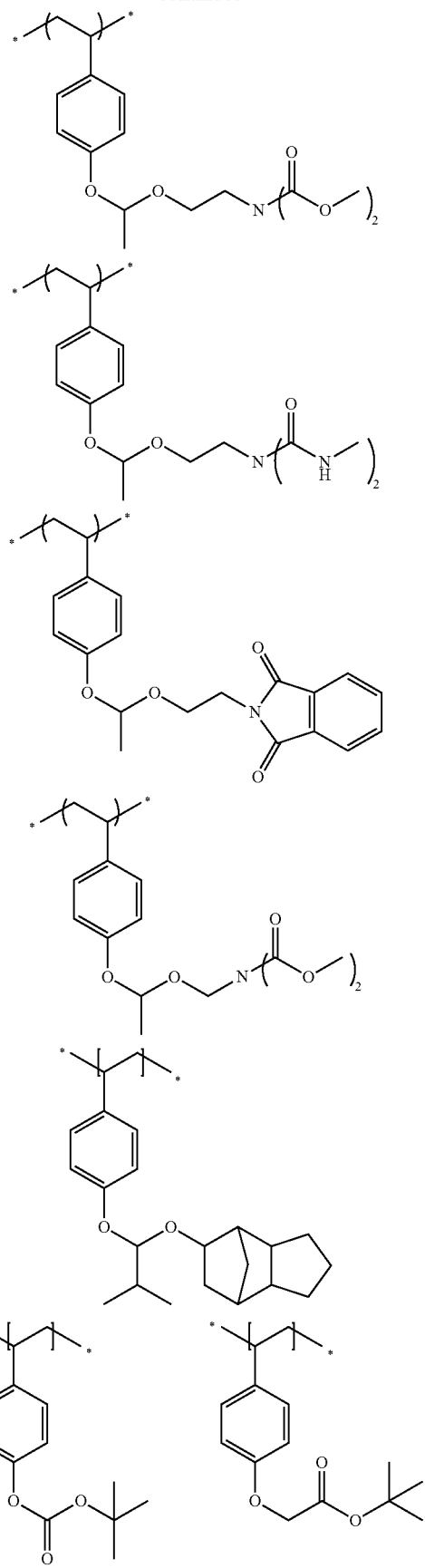

33
-continued
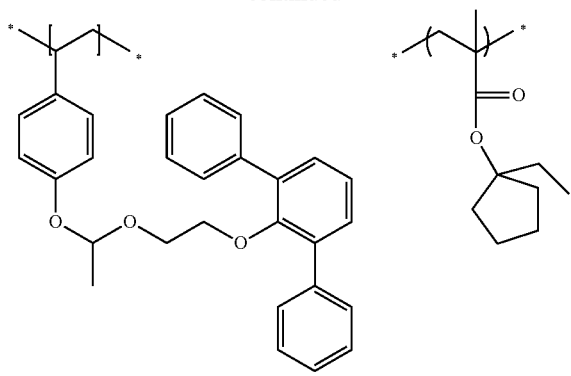
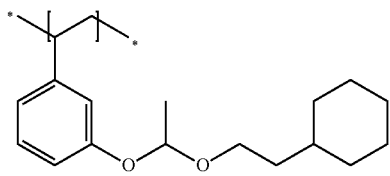
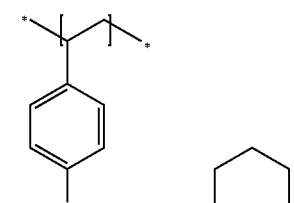
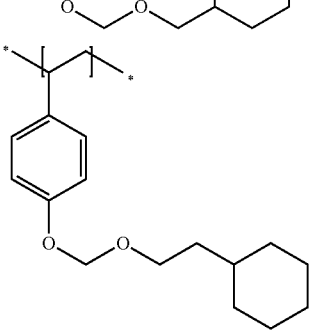
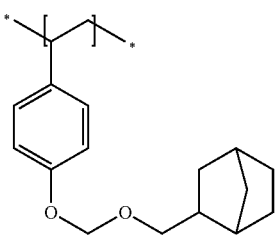
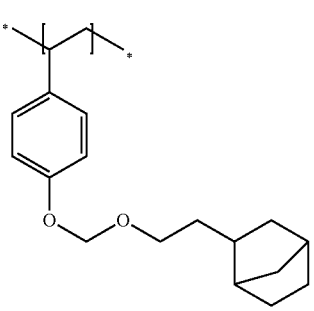
34
-continued
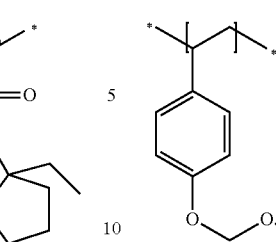
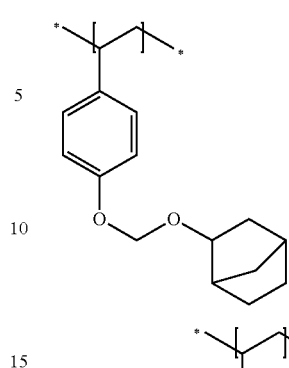
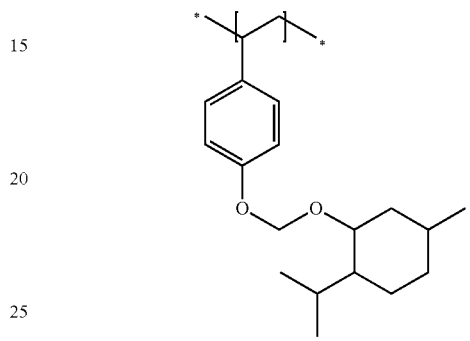
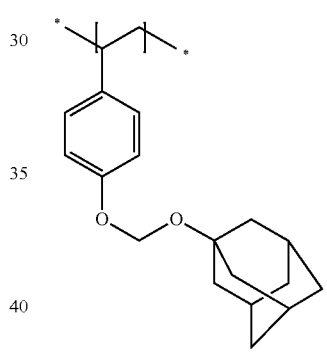
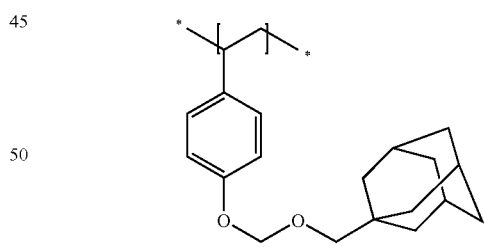
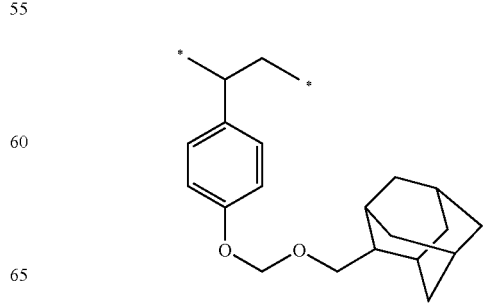

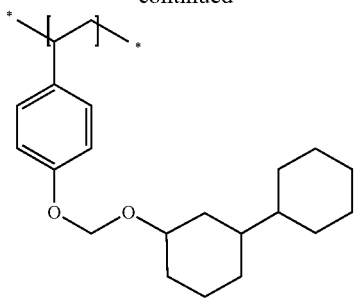

In the case of using the chemical amplification resist composition of the present invention as a positive resist composition, in the polymer compound (A), the content of the repeating unit capable of decomposing by the action of an acid to produce an alkali-soluble group is preferably from 5 to 70 mol %, more preferably from 10 to 60 mol %, still more preferably from 15 to 50 mol %, based on all repeating units in the polymer compound (A).

It is also preferred that the polymer compound (A) for use in the present invention further contains the following repeating units (hereinafter, sometimes referred to as "other repeating units") as a repeating unit other than the above-described repeating units.

Examples of the polymerizable monomer for forming these other repeating units include styrene, an alkyl-substituted styrene, an alkoxy-substituted styrene, an O-alkylated styrene, an O-acylated styrene, a hydrogenated hydroxystyrene, a maleic anhydride, an acrylic acid derivative (e.g., acrylic acid, acrylic acid ester), a methacrylic acid derivative (e.g., methacrylic acid, methacrylic acid ester), an N-substituted maleimide, an acrylonitrile, a methacrylonitrile, a vinylnaphthalene, a vinylanthracene, and an indene which may have a substituent.

The polymer compound (A) may or may not contain these other repeating units but in the case of containing them, the content of the other repeating units in the polymer compound (A) is generally from 1 to 20 mol %, preferably from 2 to 10 mol %, based on all repeating units constituting the polymer compound (A).

It is also preferred to further contain a repeating unit having a group capable of decomposing by the action of an alkali developer to increase the dissolution rate in the alkali developer, or a repeating unit having a photoacid generating group, as a repeating unit other than the above-described repeating units.

The repeating unit having a group capable of decomposing by the action of an alkali developer to increase the dissolution rate in the alkali developer includes, for example, a repeating unit having a lactone structure or a phenylester structure and is preferably a repeating unit having a 5- to 7-membered ring lactone structure, more preferably a 5- to 7-membered ring lactone structure to which another ring structure is fused in the form of forming a bicyclo structure or a spiro structure. Specific examples of the repeating unit having a group capable of decomposing by the action of an alkali developer to increase the dissolution rate in the alkali developer are illustrated below. In the formulae, Rx represents H, $CH_3$, $CH_2OH$ or $CF_3$.

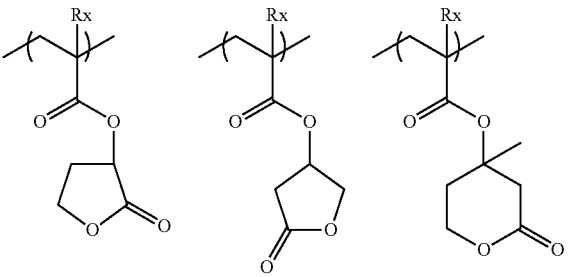

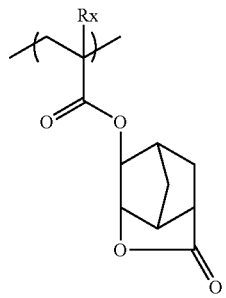

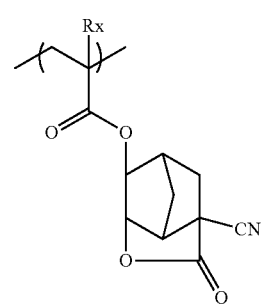

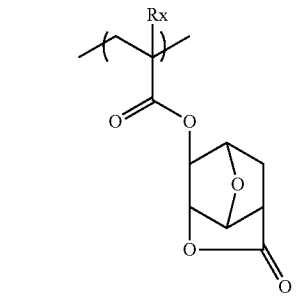

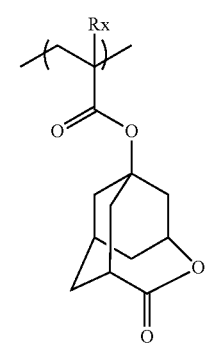

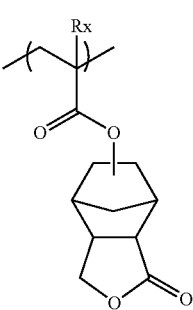

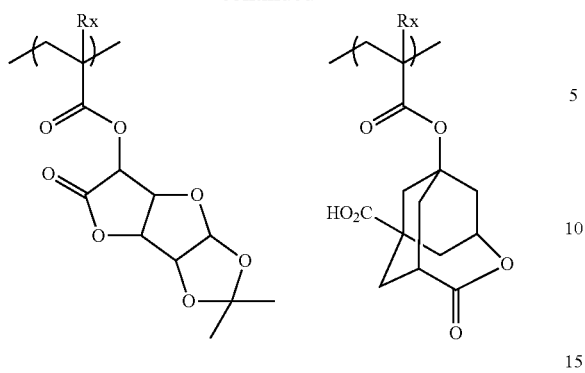
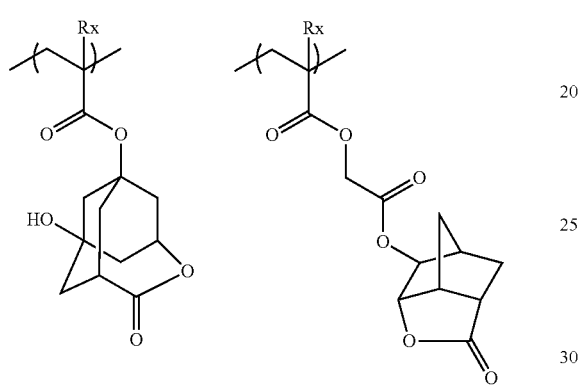
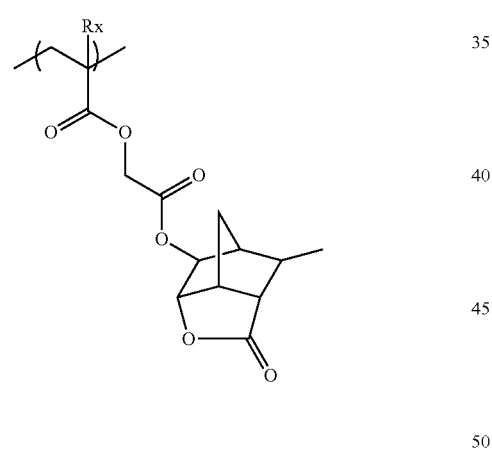
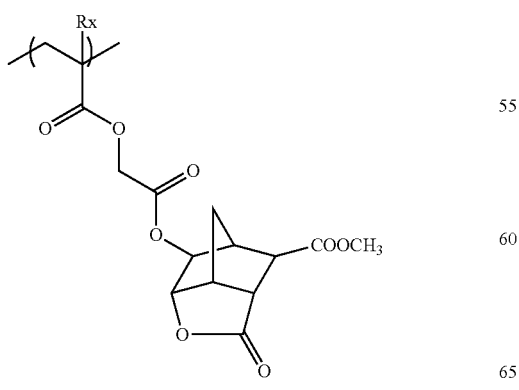
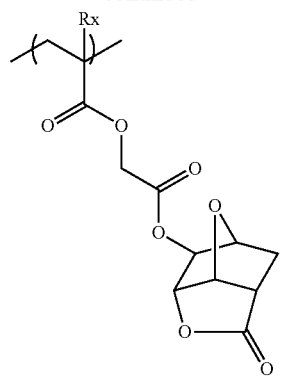
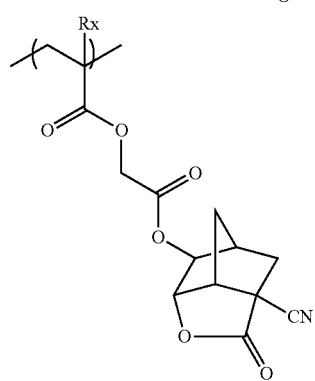
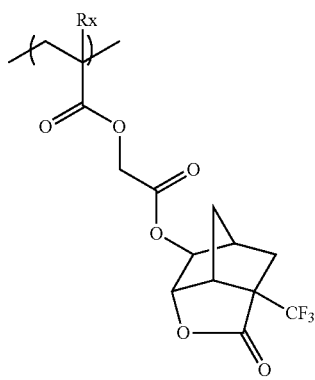
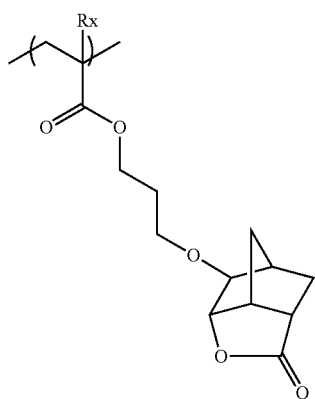

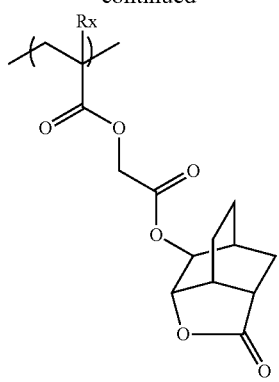
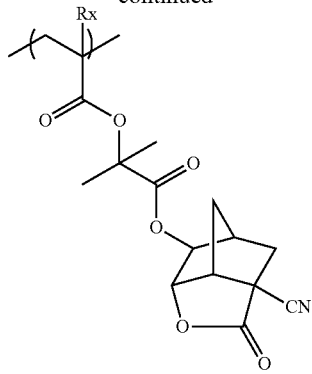
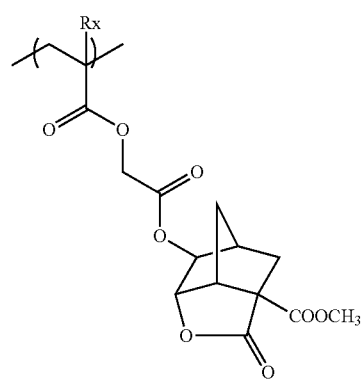
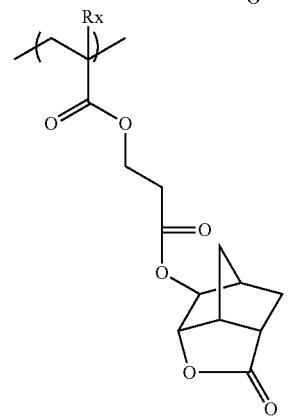
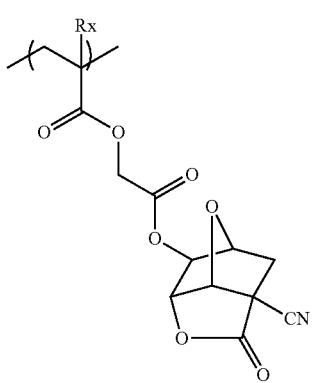
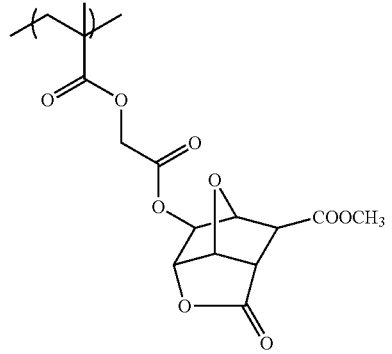
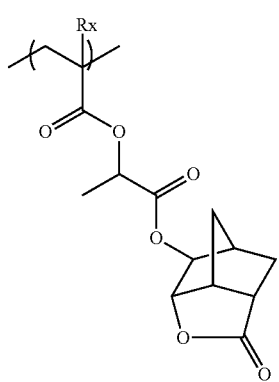

The polymer compound (A) may or may not contain a repeating unit having a group capable of decomposing by the action of an alkali developer to increase the dissolution rate in the alkali developer, but in the case of containing a repeating unit having a group capable of decomposing by the action of an alkali developer to increase the dissolution rate in the alkali developer, the content thereof is preferably from 5 to 50 mol %, more preferably from 10 to 40 mol %, still more preferably from 15 to 30 mol %, based on all repeating units in the polymer compound (A).

In the present invention, a repeating unit having a photoacid generating group is preferably further contained as a repeating unit other than the above-described repeating units, and examples of such a repeating unit include the repeating units described in paragraph [0028] of JP-A-9-325497 and the repeating units described in paragraphs [0038] to [0041] of JP-A-2009-93137. In this case, the repeating unit having a photoacid generating group can be considered to come under the (B) compound capable of generating an acid upon irradiation with an actinic ray or radiation.

Specific examples of the monomer corresponding to the repeating unit having a photoacid generating group (shown as the structure of the acid generated upon EB or EUV exposure) are illustrated below.

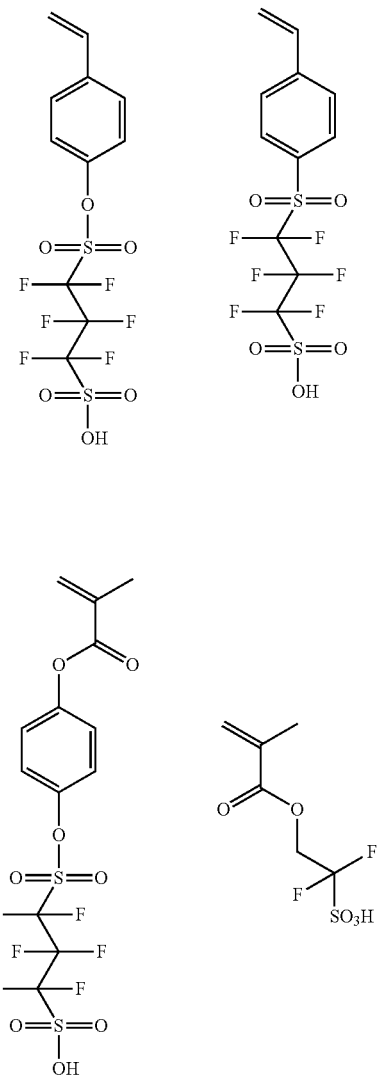

In the case where the polymer compound contains a repeating unit having a photoacid generating group, the content of the repeating unit having a photoacid generating compound is preferably from 1 to 40 mol %, more preferably from 5 to 35 mol %, still more preferably from 5 to 30 mol %, based on all repeating units in the polymer compound (A).

In the polymer compound (A) for use in the present invention, the content of the repeating unit having a structure where a hydrogen atom of a phenolic hydroxyl group is replaced by a group having a non-acid-decomposable polycyclic alicyclic hydrocarbon structure (preferably a repeating unit represented by formula (1), (2) or (2')) is generally from 1 to 40 mol %, preferably from 2 to 30 mol %, based on all repeating units constituting the polymer compound (A).

In the case where the polymer compound (A) contains a repeating unit represented by formula (3), the content of the repeating unit represented by formula (3) is, in case of a negative resist composition, generally from 60 to 99 mol %, preferably from 70 to 98 mol %, and in case of a positive resist composition, generally from 20 to 70 mol %, preferably from 25 to 60 mol %, based on all repeating units constituting the polymer compound (A).

The polymer compound (A) can be synthesized by a known radical polymerization method, anionic polymerization method or living radical polymerization method (e.g., iniferter method). For example, in the anionic polymerization method, vinyl monomers are dissolved in an appropriate organic solvent and reacted usually under cooling condition by using a metal compound (e.g., butyllithium) as the initiator, whereby the polymer can be obtained.

As the polymer compound (A), a polyphenol compound produced by a condensation reaction of an aromatic ketone or aromatic aldehyde and a compound containing from 1 to 3 phenolic hydroxyl groups (see, for example, JP-A-2008-145539), a calixarene derivative (see, for example, JP-A-2004-18421), a Noria derivative (see, for example, JP-A-2009-222920), and a polyphenol derivative (see, for example, JP-A-2008-94782) can be also applied, and these may be modified by a polymer reaction to synthesize the polymer compound.

The polymer compound (A) is preferably synthesized through a polymer reaction to modify the polymer synthesized by radical polymerization or anionic polymerization.

The weight average molecular weight of the polymer compound (A) is preferably from 1,000 to 200,000, more preferably from 2,000 to 50,000, still more preferably from 2,000 to 10,000.

The polydispersity (molecular weight distribution) (Mw/Mn) of the polymer compound (A) is preferably 1.7 or less and from the standpoint of enhancing the sensitivity and resolution, more preferably from 1.0 to 1.35, most preferably from 1.0 to 1.2. When living polymerization such as living anionic polymerization is employed, the polymer compound obtained can have a uniform polydispersity (molecular weight distribution), and this is preferred. The weight average molecular weight and the polydispersity of the polymer compound (A) are defined as a value in terms of polystyrene by GPC measurement.

Incidentally, the polymer compound (A) is not limited only to a compound obtained by polymerizing monomers corresponding to the above-described specific repeating units, and a relatively low molecular weight compound such as molecular resist may be also used as long as the compound has a structure where a hydrogen atom of a phenolic hydroxyl group is replaced by a group having a non-acid-decomposable polycyclic alicyclic hydrocarbon structure.

The amount of the polymer compound (A) added in the chemical amplification resist composition of the present invention is preferably from 30 to 95 mass %, more preferably from 40 to 90 mass %, still more preferably from 50 to 85 mass %, based on the entire solid content of the composition. (In this specification, mass ratio is equal to weight ratio.)

Specific examples of the polymer compound (A) for use in the present invention are illustrated below.

In the case of using the chemical amplification resist composition of the present invention as a negative resist composition, a compound having a structure shown below is preferably used as the polymer compound (A).

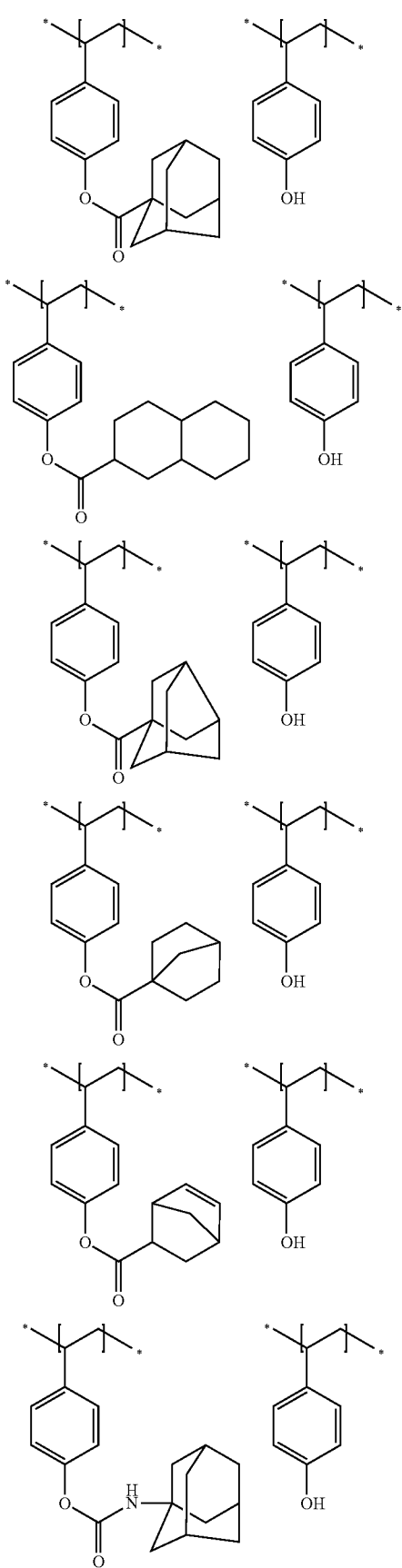
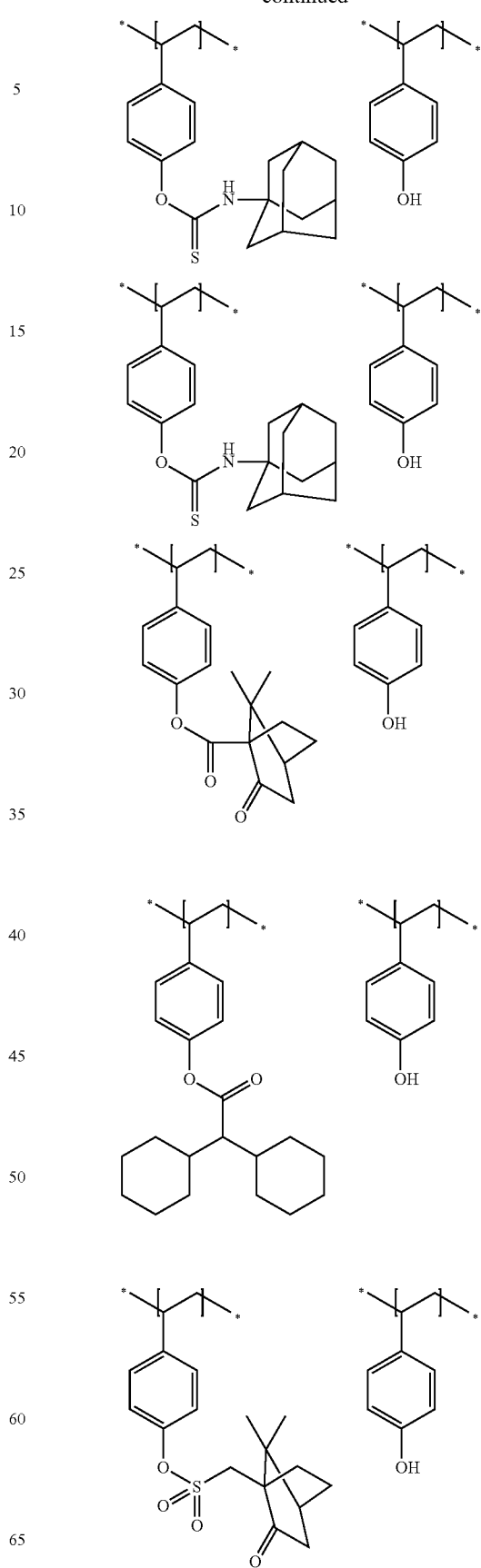

-continued
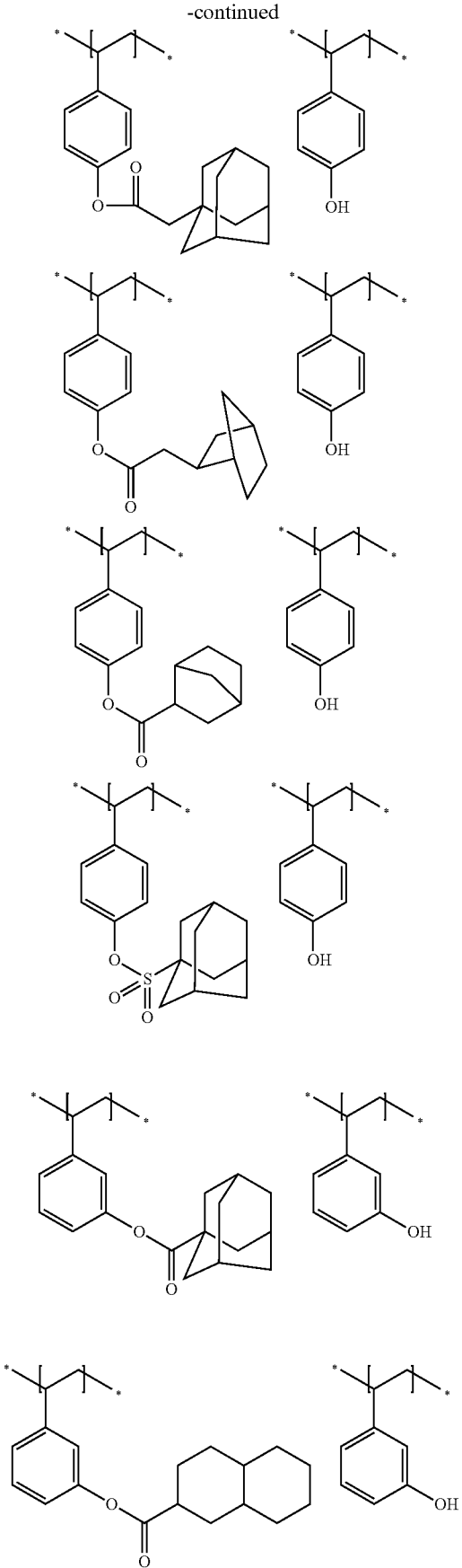
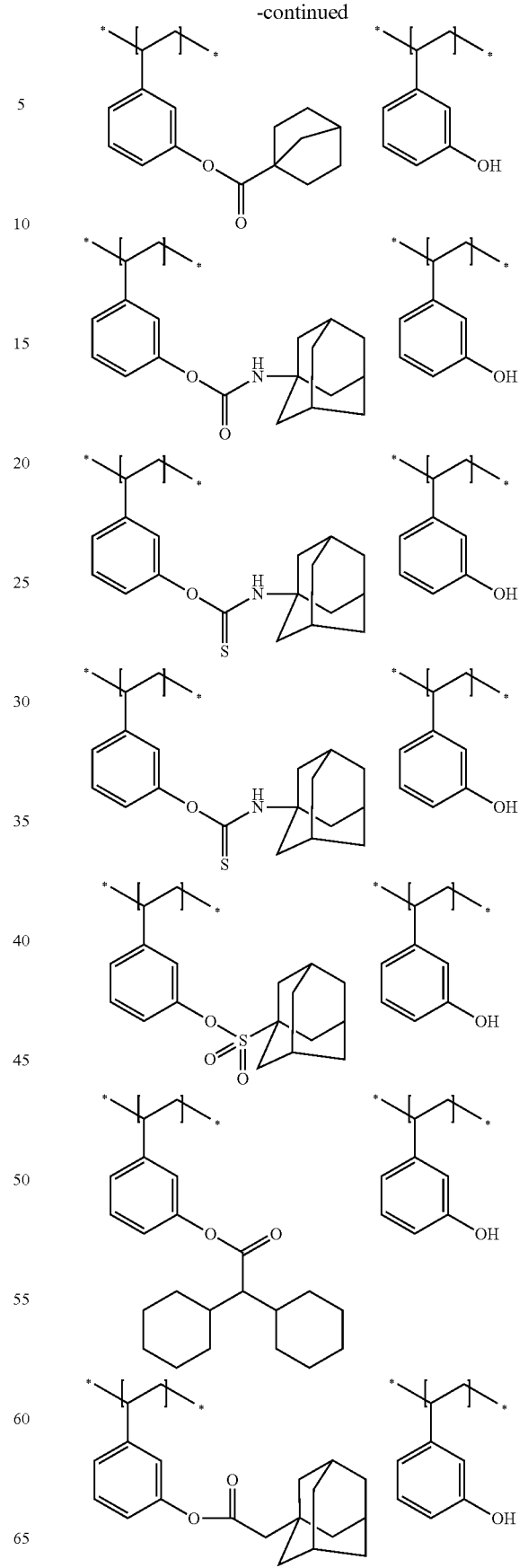

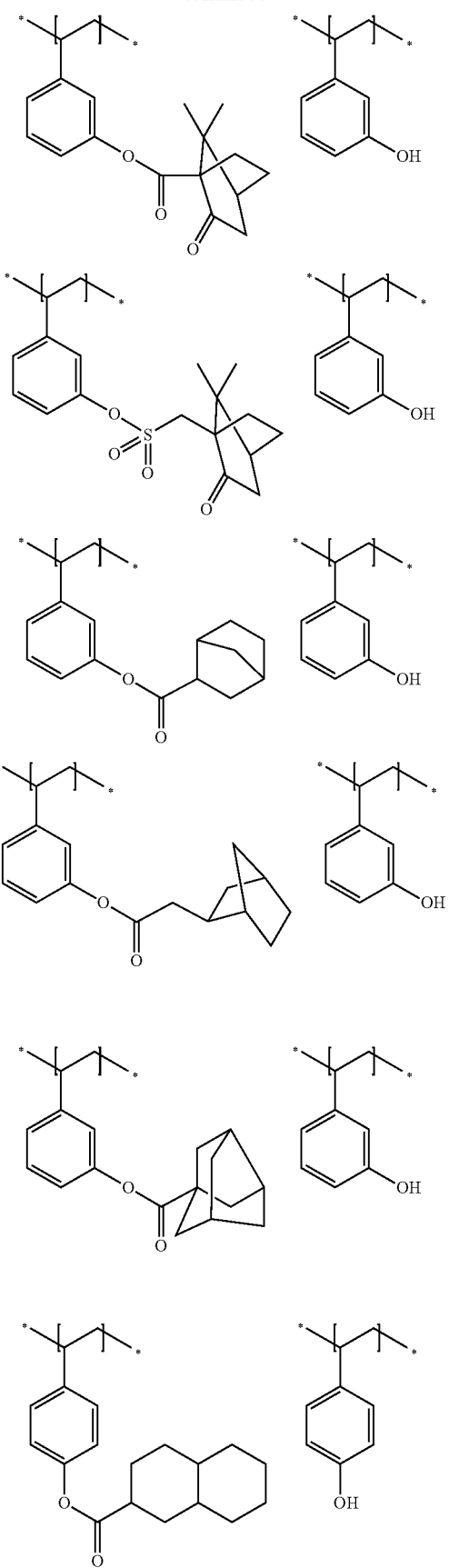
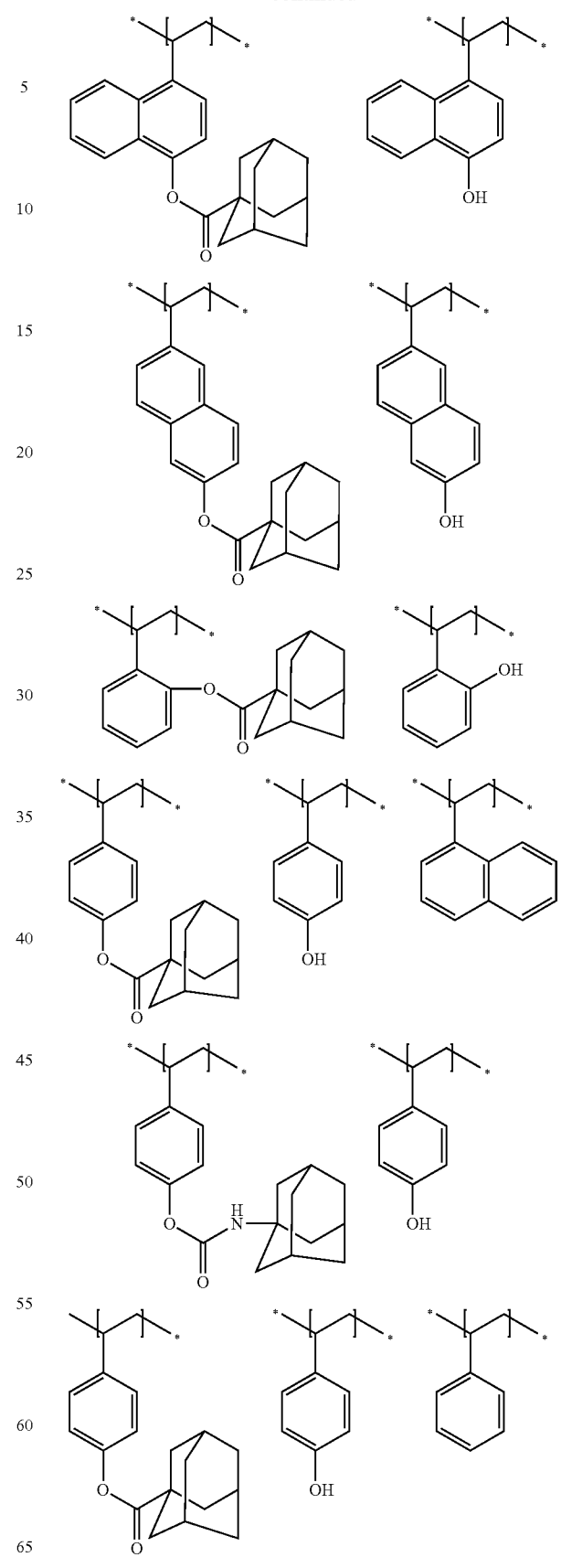

-continued
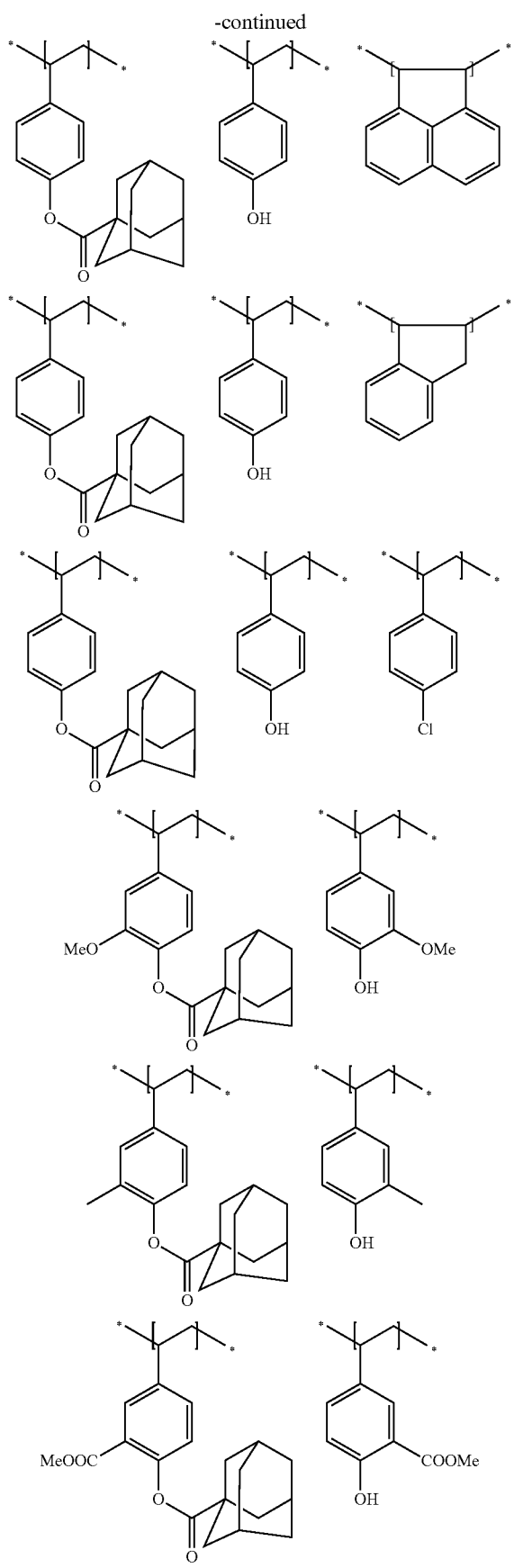
In the case of using the chemical amplification resist composition of the present invention as a positive resist composition, a compound having a structure shown below is preferably used as the polymer compound (A).
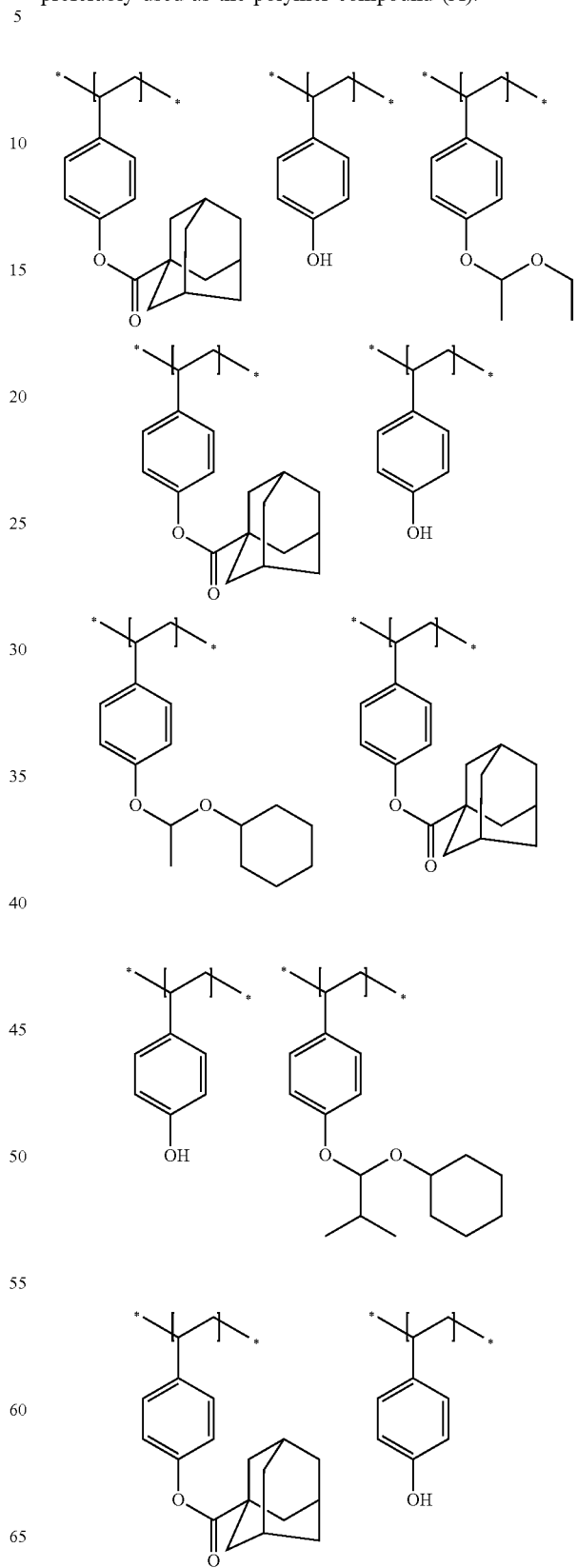

51
-continued
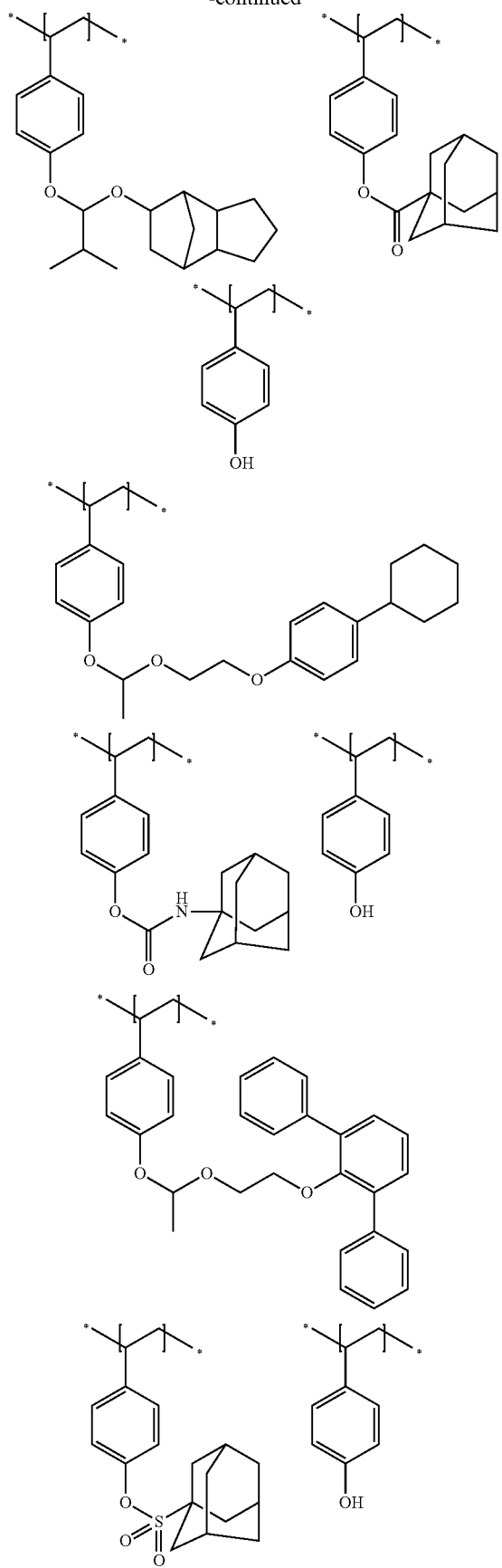
52
-continued
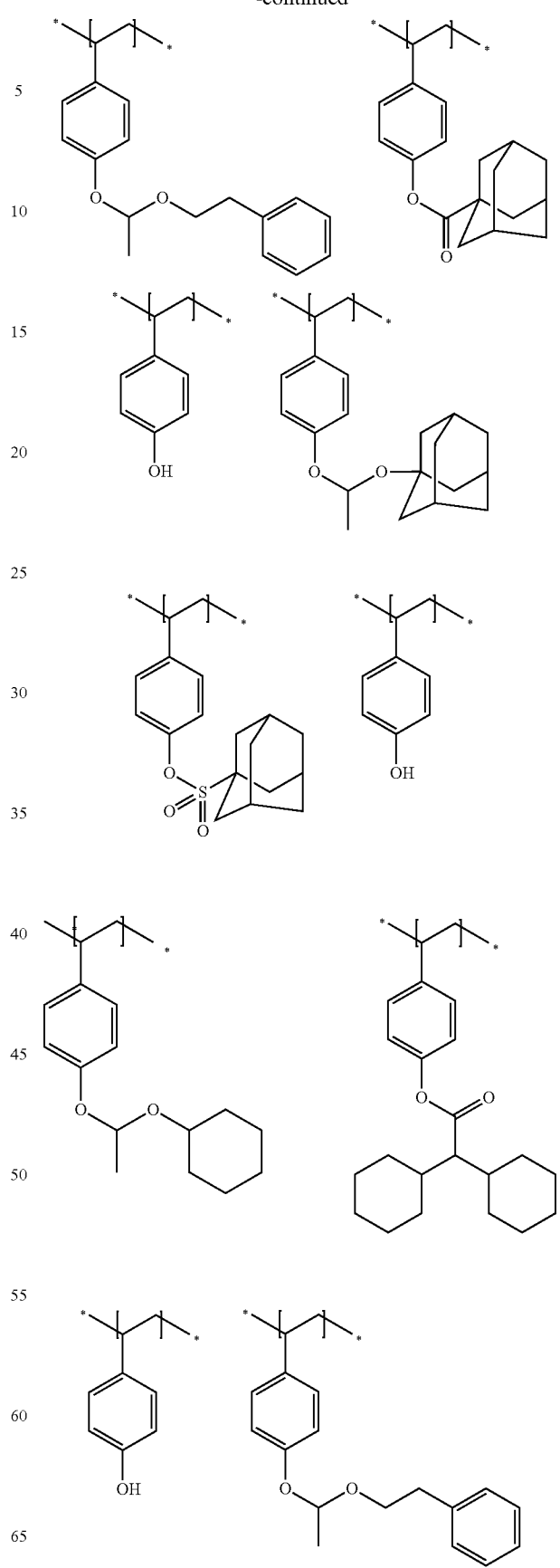

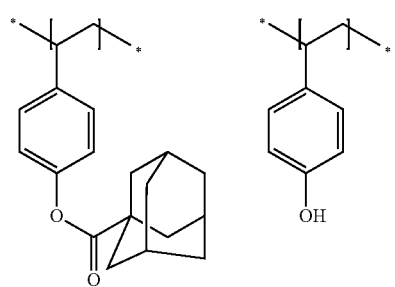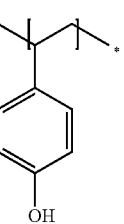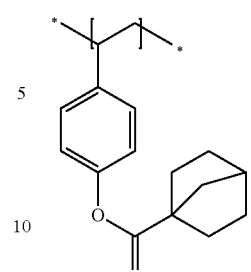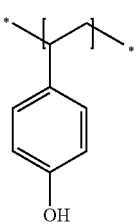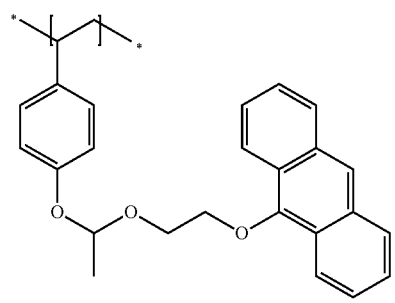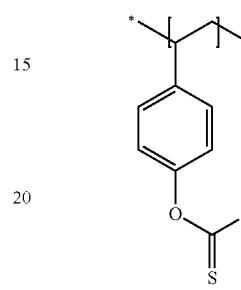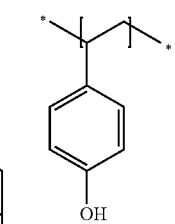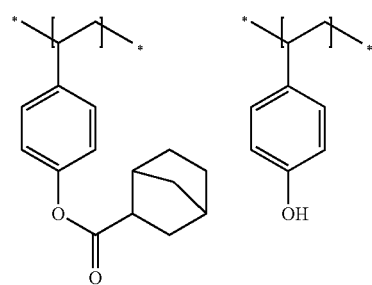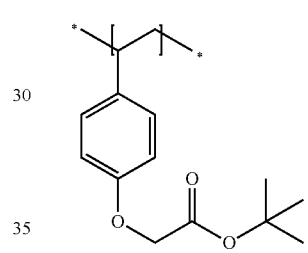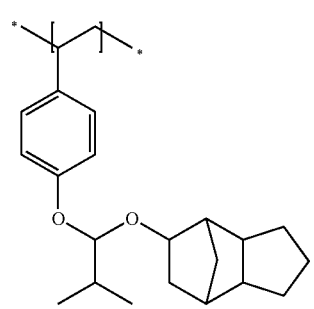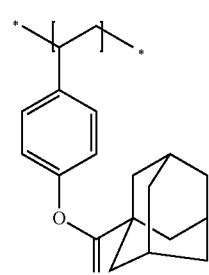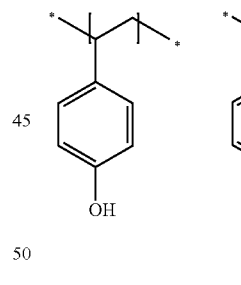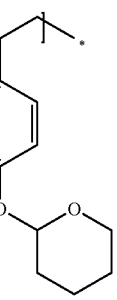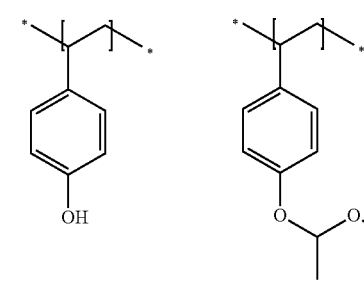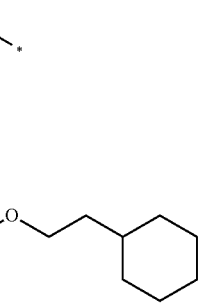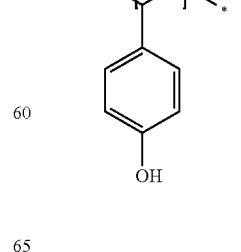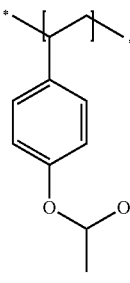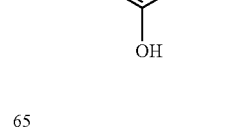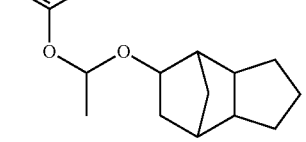

55
-continued
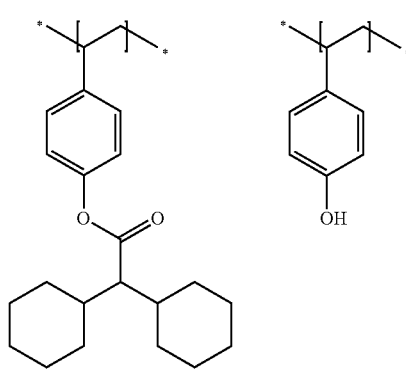
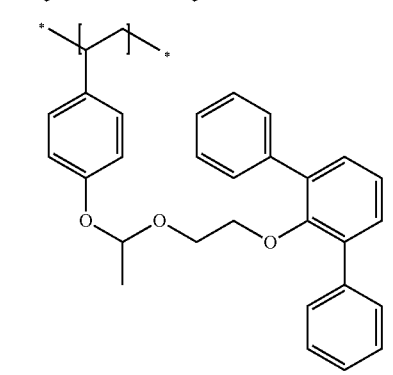
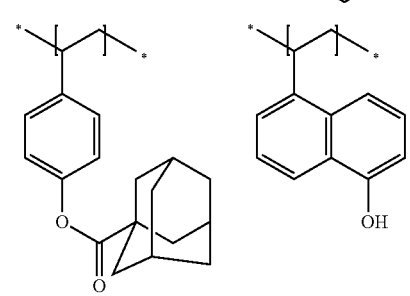
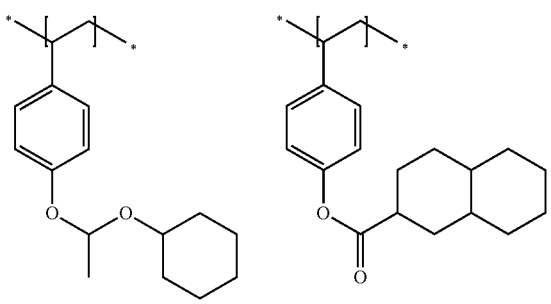
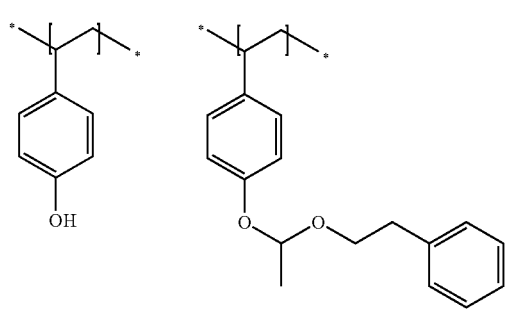
56
-continued
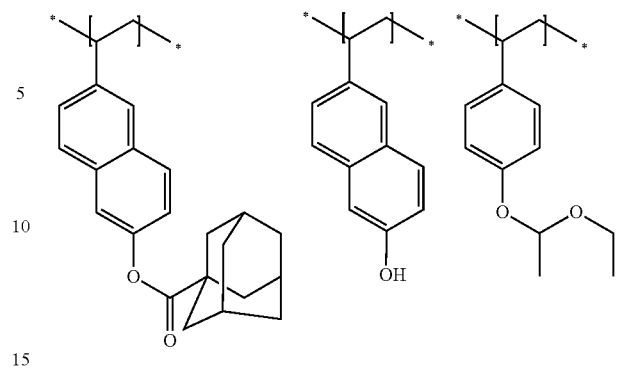
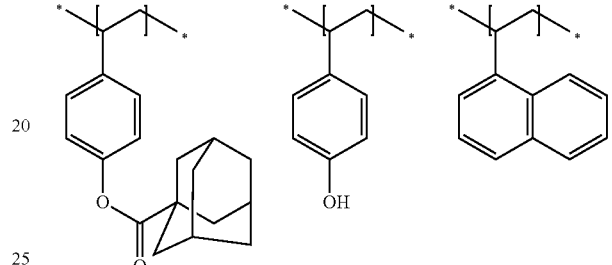
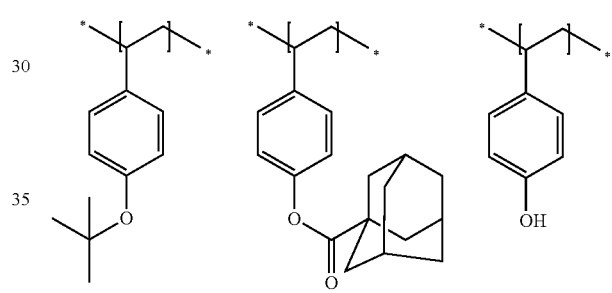
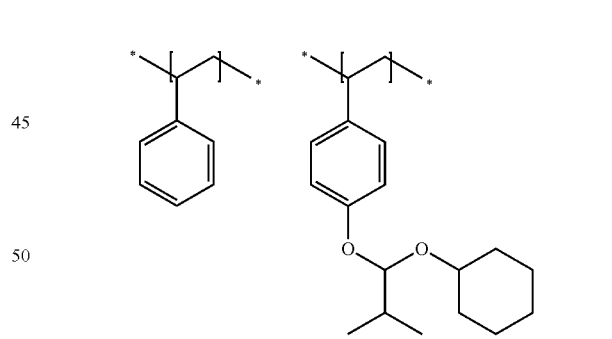
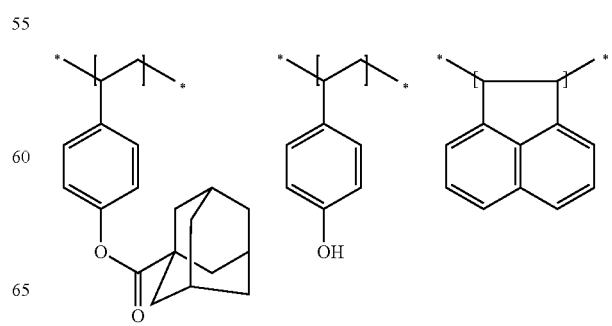

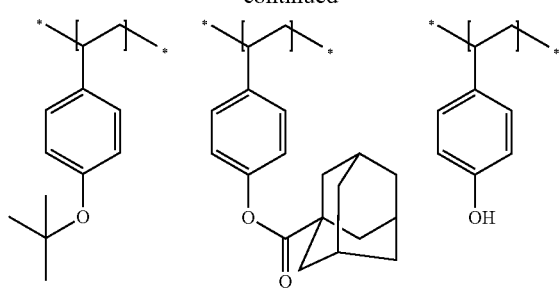
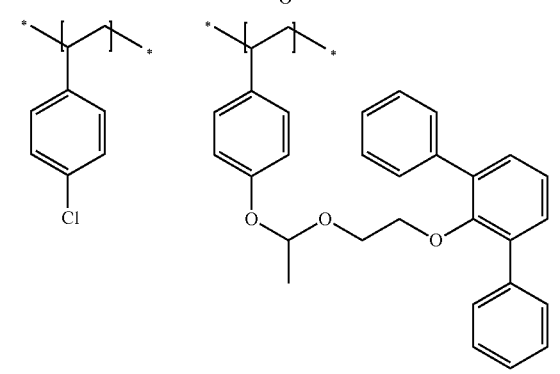
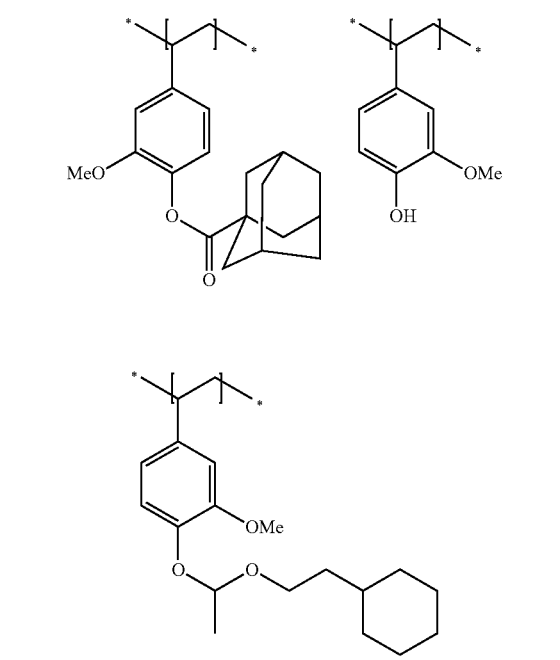
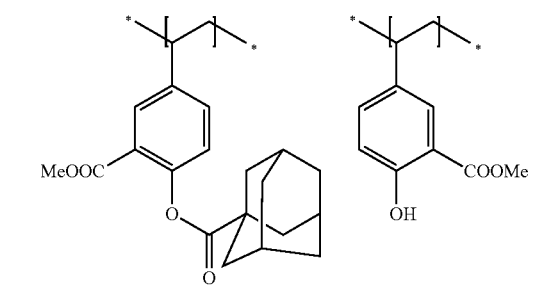
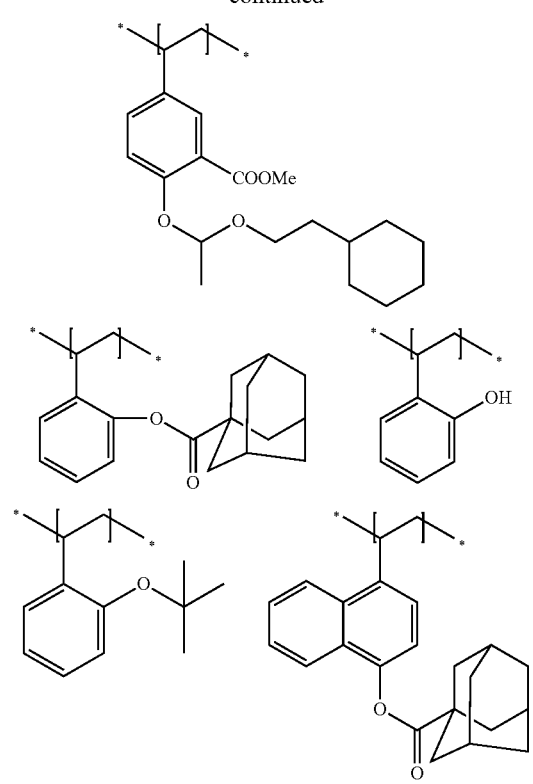

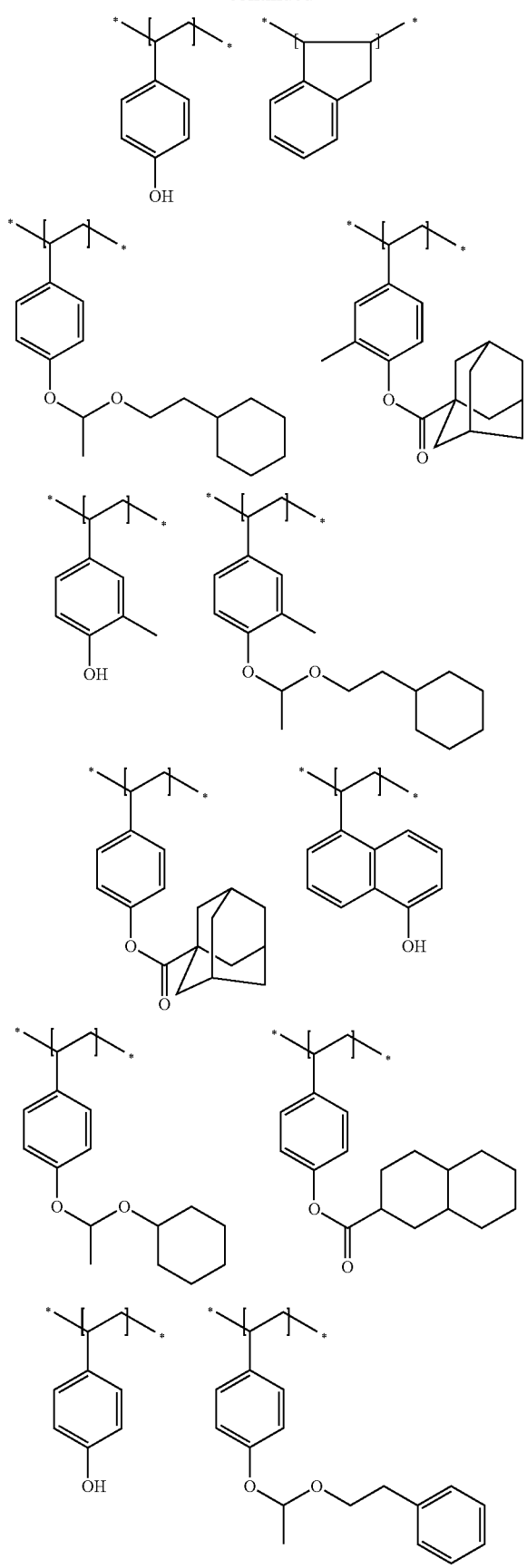
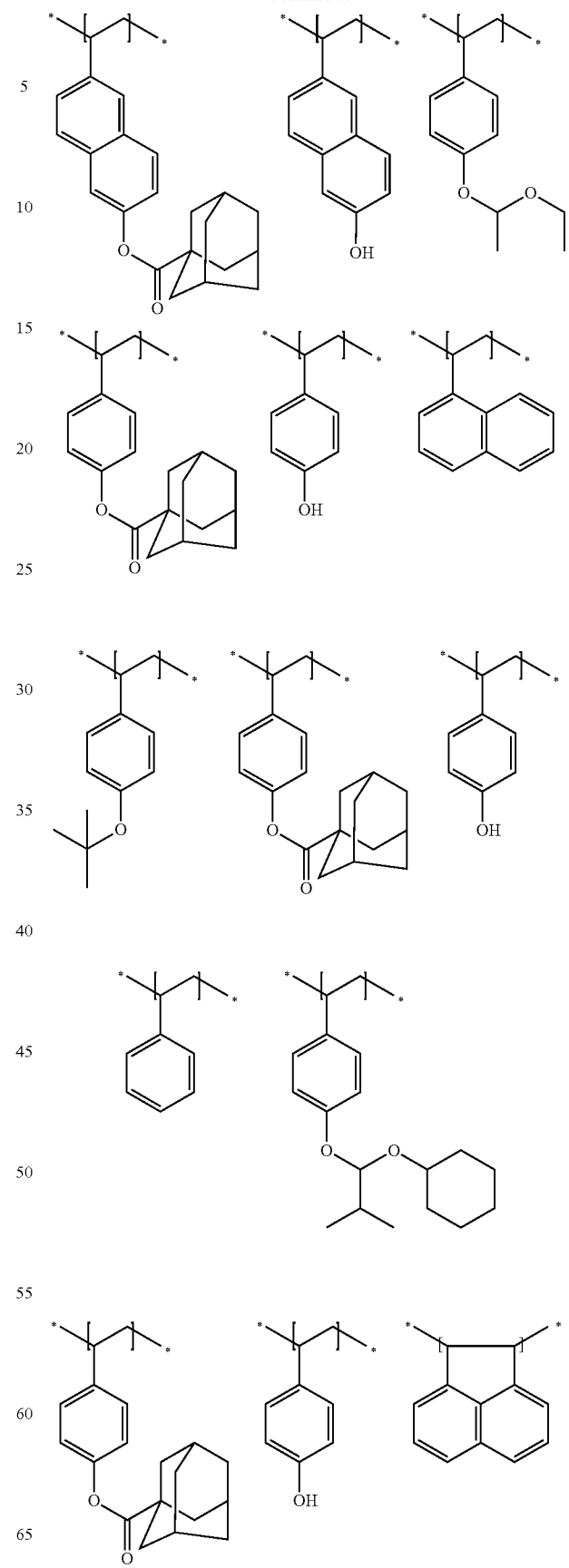

-continued
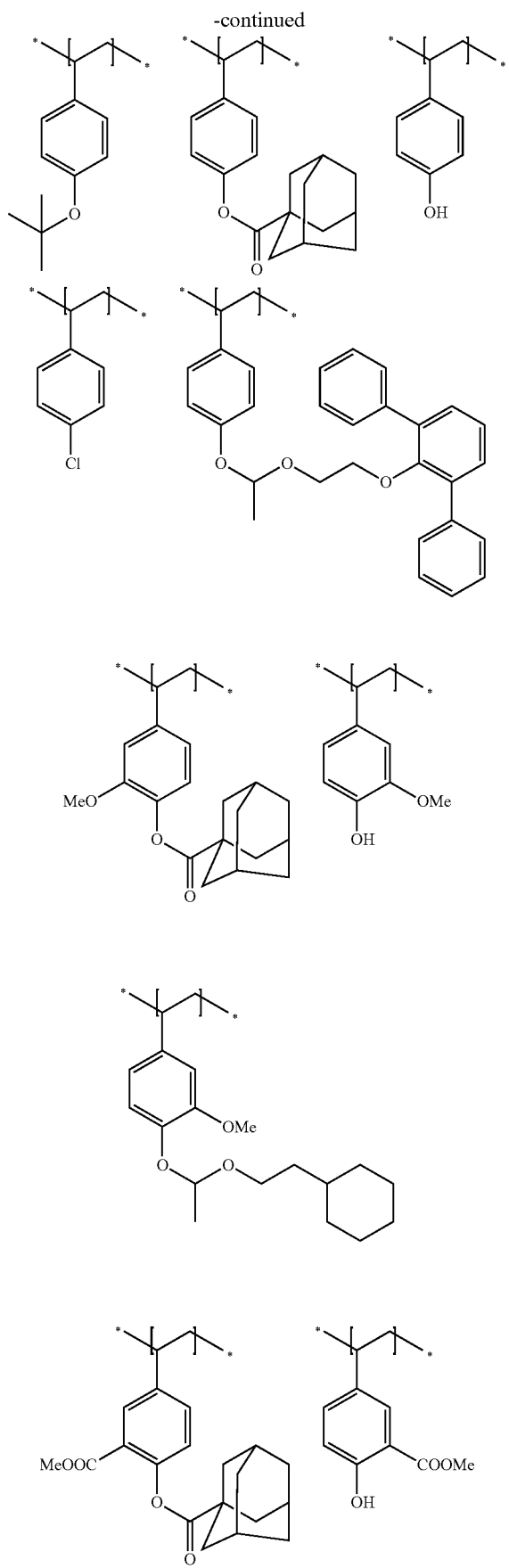
-continued
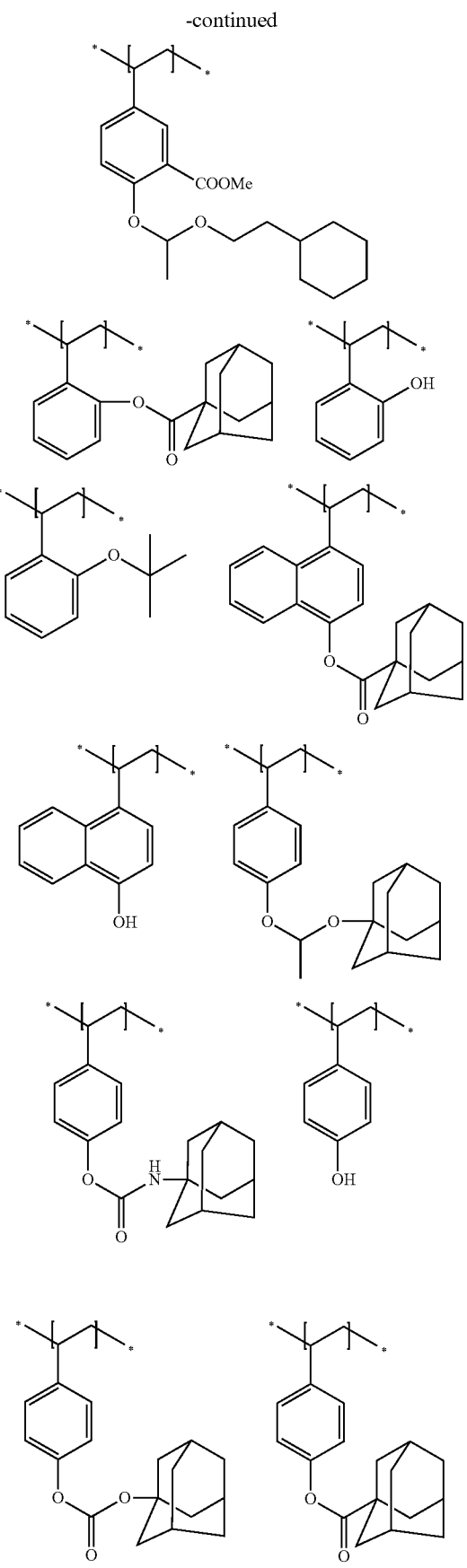

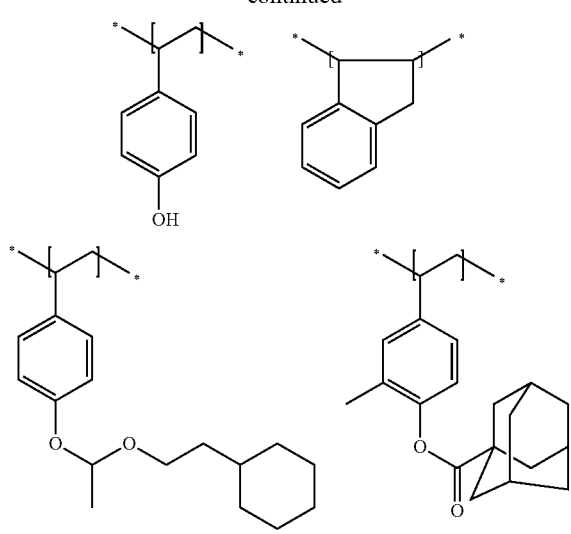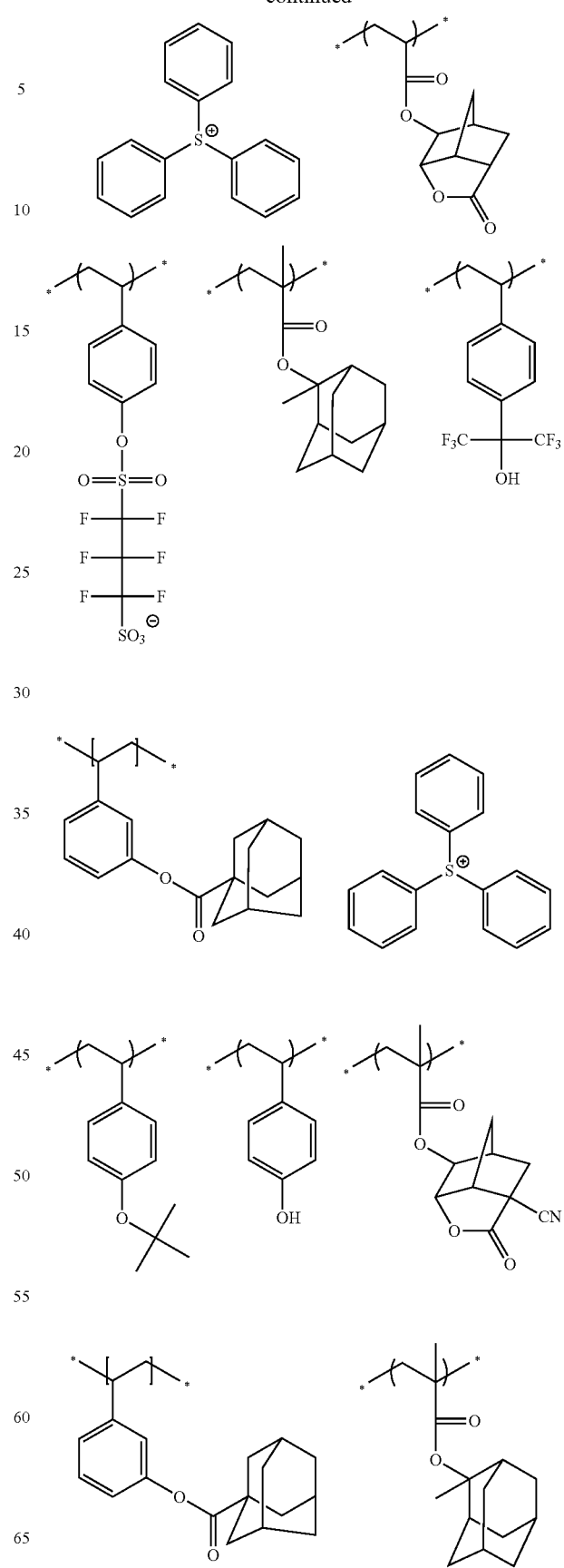

-continued

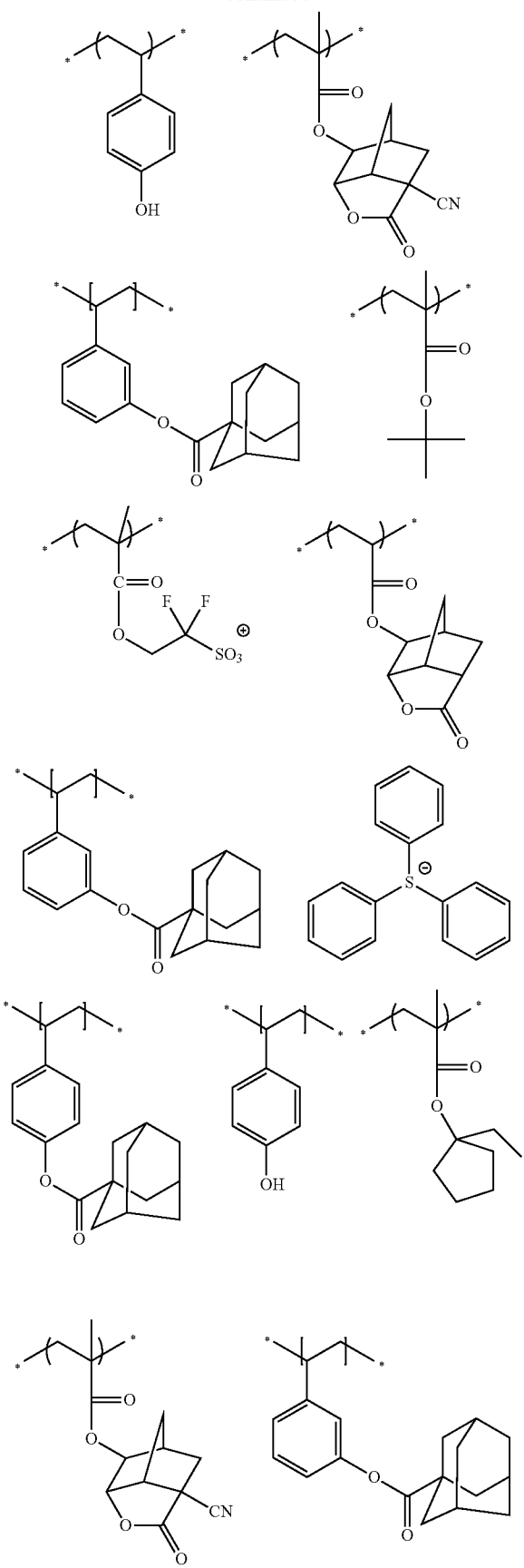

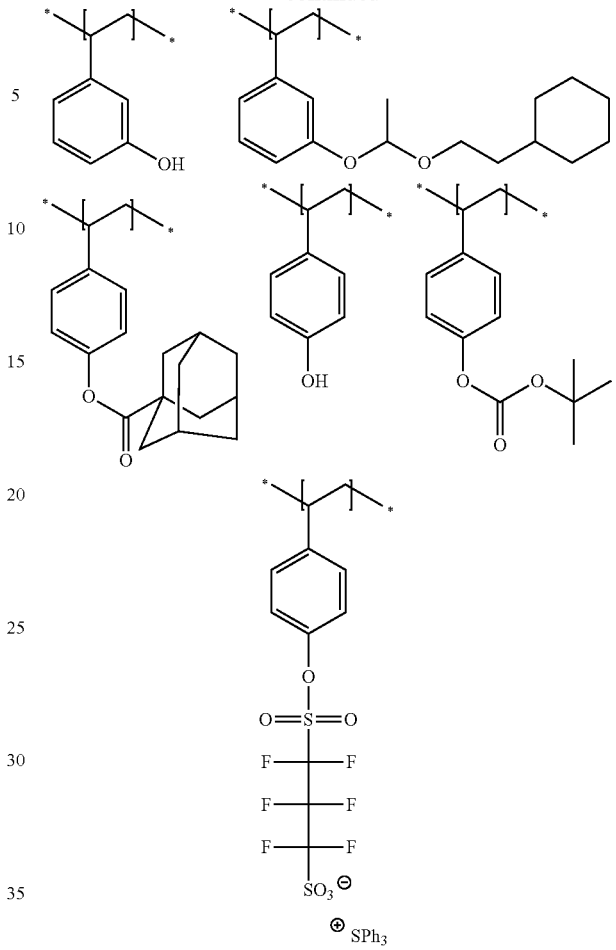

In the case of using the polymer compound (A) in a negative resist composition, the polymer compound (A) is preferably a polymer compound composed of two components, that is, a repeating unit represented by formula (1), (2) or (2') (hereinafter, such repeating units are generically referred to as a "repeating unit (X)") and a repeating unit represented by formula (3) (hereinafter, referred to as a "repeating unit (Y)").

In the case where the polymer compound (A) is a polymer compound composed of two components, that is, a repeating unit (X) and a repeating unit (Y), the molar ratio (%) (X/Y) between the repeating unit (X) and the repeating unit (Y) based on all repeating units constituting the polymer compound (A) is preferably X/Y=from 40/60 to 5/95, more preferably X/Y=from 30/70 to 7/93.

In the case of using the polymer compound (A) in a positive resist composition, the polymer compound (A) is preferably a polymer compound composed of three components, that is, a repeating unit represented by formula (1), (2) or (2') (hereinafter, such repeating units are generically referred to as a "repeating unit (X)"), a repeating unit represented by formula (3) (hereinafter, referred to as a "repeating unit (Y)"), and a repeating unit having the above-described acid-decomposable group (hereinafter, referred to as a "repeating unit (Z)").

In the case where the polymer compound (A) is a polymer compound composed of three components, that is, a repeating unit (X), a repeating unit (Y) and a repeating unit (Z), the molar proportions (%) X, Y and Z of the repeating unit (X), the repeating unit (Y) and the repeating unit (Z) based on all repeating units constituting the polymer compound (A) are preferably X=from 3 to 40, Y=from 20 to 70 and Z=from 10 to 60 (provided that X+Y+Z=100), more preferably X=from 5 to 30, Y=from 30 to 60 and Z=from 20 to 50 (provided that X+Y+Z=100).

[2] (B) Compound Capable of Generating Acid Upon Irradiation with Actinic Ray or Radiation The chemical amplification resist composition of the present invention contains (B) a compound capable of generating an acid upon irradiation with an actinic ray or radiation (hereinafter such a compound is sometimes simply referred to as an "acid generator").

A preferred embodiment of the acid generator is an onium compound. Examples of the onium compound include a sulfonium salt, an iodonium salt and a phosphonium salt.

Another preferred embodiment of the acid generator is a compound capable of generating a sulfonic acid, an imide acid or a methide acid upon irradiation with an actinic ray or radiation. Examples of the acid generator in this embodiment include a sulfonium salt, an iodonium salt, a phosphonium salt, oxime sulfonate and imidosulfonate.

The acid generator for use in the present invention is not limited to a low molecular compound, and a compound where a group capable of generating an acid upon irradiation with an actinic ray or radiation is introduced into the main or side chain of the polymer compound may be also used. Furthermore, in the case where, as described above, a group capable of generating an acid upon irradiation with an actinic ray or radiation is present in a repeating unit serving as a copolymerization component of the polymer compound (A) for use in the present invention, the acid generator (B) which is a different molecule from the polymer compound of the present invention may not be contained.

The acid generator is preferably a compound capable of generating an acid upon irradiation with an electron beam or an extreme-ultraviolet ray.

In the present invention, the onium compound is preferably a sulfonium compound represented by the following formula (7) or an iodonium compound represented by formula (8):

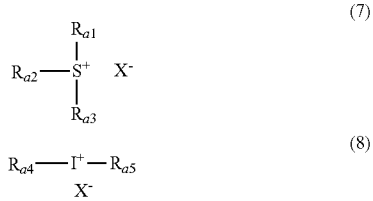

In formulae (7) and (8), each of $R_{a1}$, $R_{a2}$, $R_{a3}$, $R_{a4}$ and $R_{a5}$ independently represents an organic group, and $X^-$ represents an organic anion.

The sulfonium compound represented by formula (7) and the iodonium compound represented by formula (8) are described in detail below.

Each of $R_{a1}$ to $R_{a3}$ in formula (7) and $R_{a4}$ and $R_{a5}$ in formula (8) independently represents an organic group, but at least one of $R_{a1}$ to $R_{a3}$ and at least one of $R_{a4}$ and $R_{a5}$ each is preferably an aryl group. The aryl group is preferably a phenyl group or a naphthyl group, more preferably a phenyl group.

Examples of the organic anion of $X^-$ in formulae (7) and (8) include a sulfonate anion, a carboxylate anion, a bis(alkylsulfonyl)imide anion and a tris(alkylsulfonyl)methide anion. The organic anion is preferably an organic anion represented by the following formula (9), (10) or (11), more preferably an organic anion represented by the following formula (9):

In formulae (9), (10) and (11), each $Rc_1$, $Rc_2$, $Rc_3$ and $Rc_4$ represents an organic group.

The organic anion of $X^-$ corresponds to a sulfonic acid, an imide acid or a methide acid which are an acid generated upon irradiation with an actinic ray or radiation such as electron beam and extreme-ultraviolet ray.

Examples of the organic group of $R_{c1}$ to $R_{c4}$ include an alkyl group, a cycloalkyl group, an aryl group, and a group formed by combining a plurality of such groups. Among these organic groups, an alkyl group substituted with a fluorine atom or a fluoroalkyl group at the 1-position, a cycloalkyl group substituted with a fluorine atom or a fluoroalkyl group, and a phenyl group substituted with a fluorine atom or a fluoroalkyl group, are preferred. A plurality of organic groups of $R_{c2}$ to $R_{c4}$ may combine with each other to form a ring, and the group formed by combining a plurality of organic groups is preferably an alkylene group substituted with a fluorine atom or a fluoroalkyl group. By having a fluorine atom or a fluoroalkyl group, the acidity of the acid generated upon irradiation with light is increased and the sensitivity is enhanced. However, the terminal group preferably contains no fluorine atom as a substituent.

In the present invention, from the standpoint of constraining the acid generated by exposure from diffusing to the non-exposed area and improving the resolution or pattern profile, the (B) compound capable of generating an acid is preferably a compound capable of generating an acid of a size with a volume of 130 Å$^3$ or more (preferably a sulfonic acid), more preferably a compound capable of generating an acid of a size with a volume of 190 Å$^3$ or more (preferably a sulfonic acid), still more preferably a compound capable of generating an acid of a size with a volume of 270 Å$^3$ or more (preferably a sulfonic acid), yet still more preferably a compound capable of generating an acid of a size with a volume of 400 Å$^3$ or more (preferably a sulfonic acid). On the other hand, in view of sensitivity or solubility in the coating solvent, the volume above is preferably 2,000 Å$^3$ or less, more preferably 1,500 Å$^3$ or less. The value of the volume above was determined using "WinMOPAC" produced by Fujitsu Limited. That is, first, the chemical structure of the acid in each example is input; next, using this structure as an initial structure, the most stable steric configuration of each acid is determined by molecular force field calculation using an MM3 method; and thereafter, molecular orbital calculation using a PM3 method is performed with respect to the most stable steric conformation, whereby the "accessible volume" of each acid can be computed.

Acid generators particularly preferred in the present invention are illustrated below. In some of these examples, the calculated value of volume (unit: Å$^3$) is shown together. The calculated value determined here is a volume value of an acid where a proton is bonded to the anion moiety.

(z1)
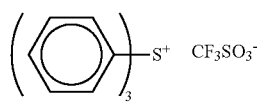

(z2)
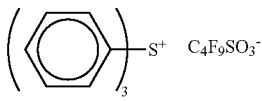
113 Å$^3$ (z3)
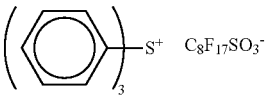
220 Å$^3$ (z4)
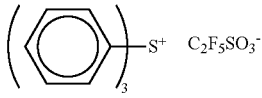

(z5)
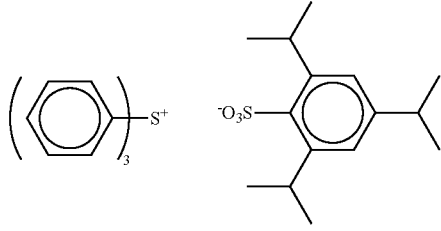
303 Å$^3$ (z6)
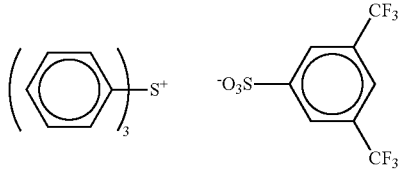

(z7)
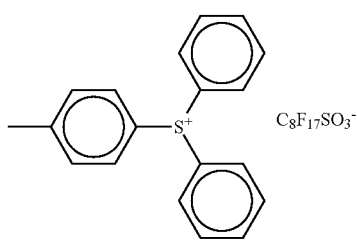

(z8)
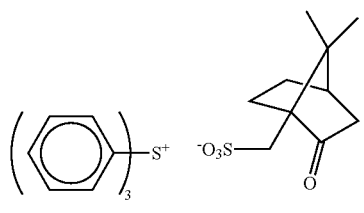
216 Å$^3$ (z9)
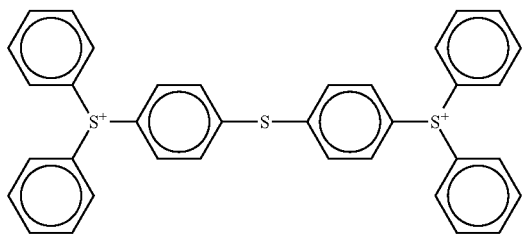

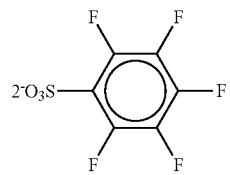
127 Å$^3$ (z10)
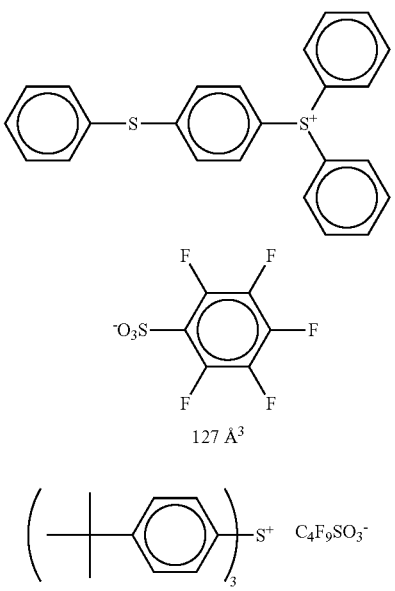
127 Å$^3$ (z11)
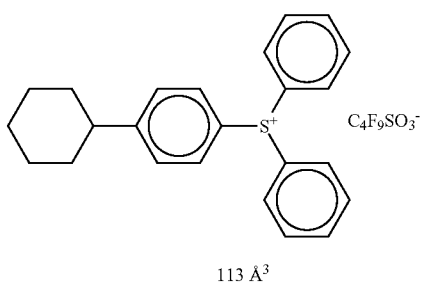
113 Å$^3$ (z12)

113 Å$^3$

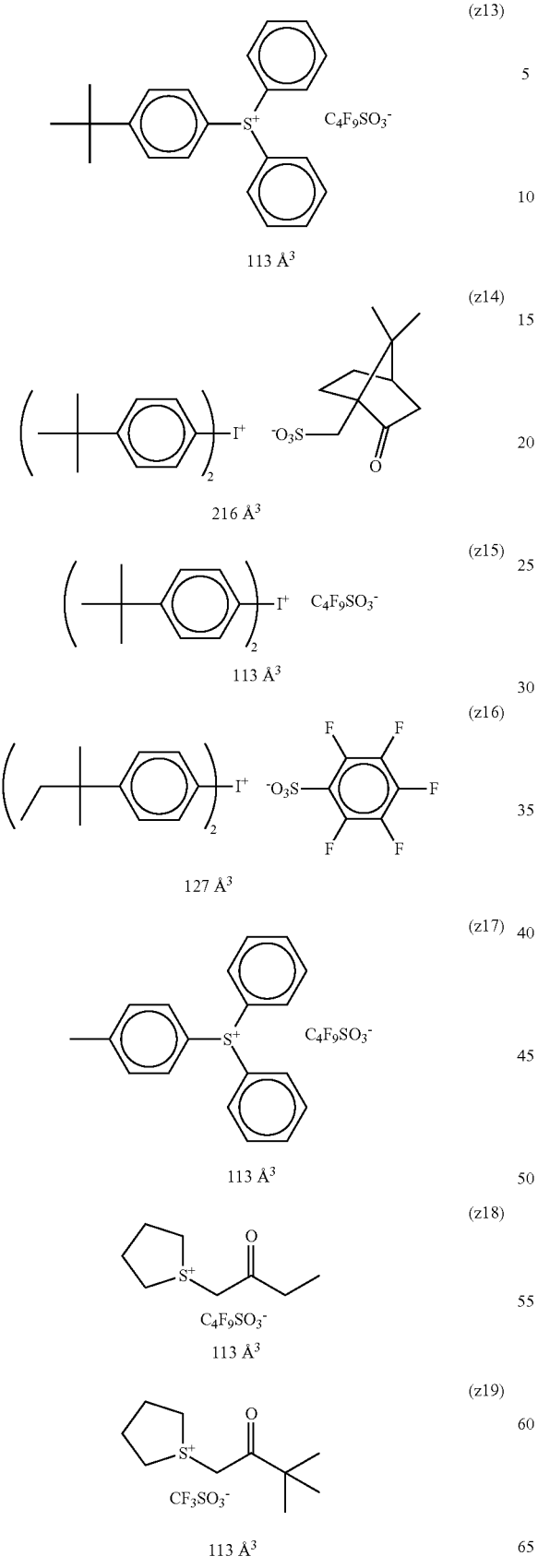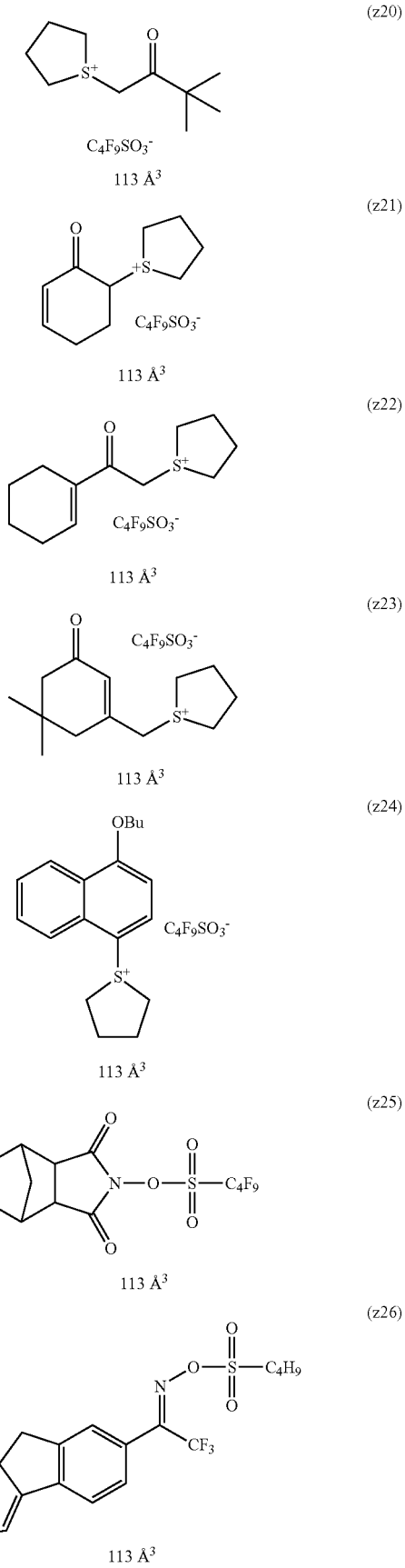

-continued
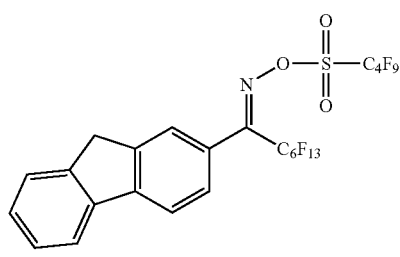
(z27)
113 Å³
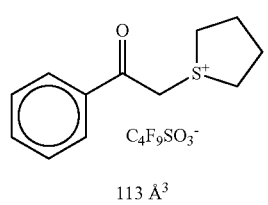
(z28)
113 Å³
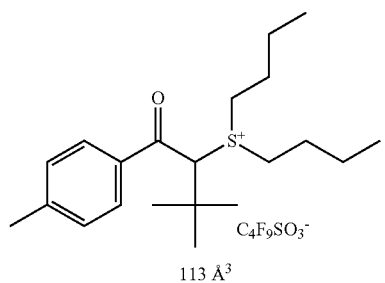
(z29)
113 Å³
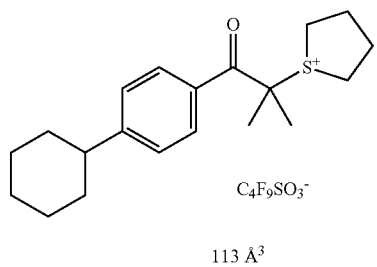
(z30)
113 Å³
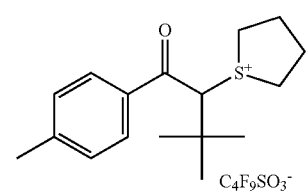
(z31)
113 Å³
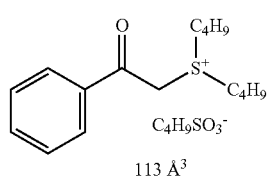
(Z32)
113 Å³
-continued
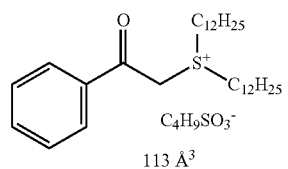
(Z33)
113 Å³
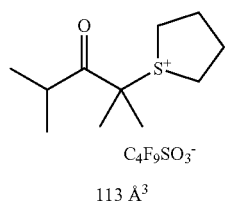
(z34)
113 Å³
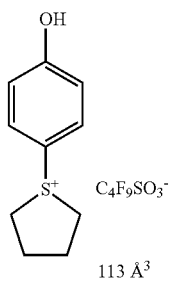
(Z35)
113 Å³
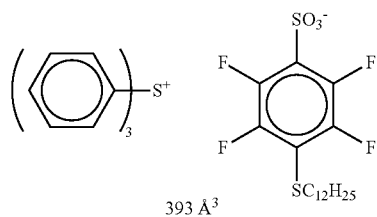
(Z36)
393 Å³
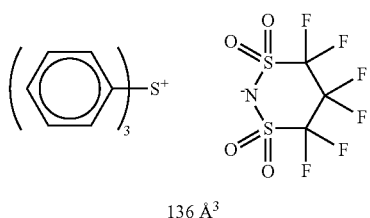
(z37)
136 Å³
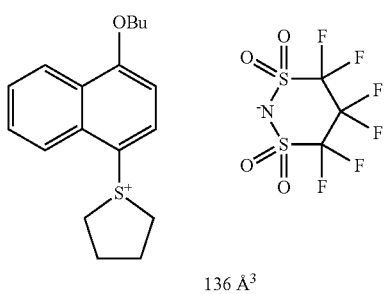
(z38)
136 Å³

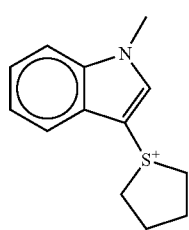 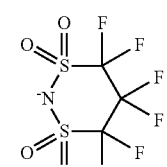 (z39)
136 Å³
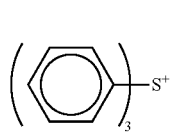 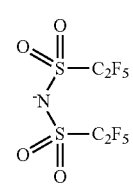 (z40)
173 Å³
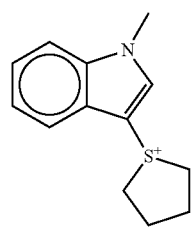  C₄F₉SO₃⁻ (z41)
113 Å³
 (z42)
244 Å³
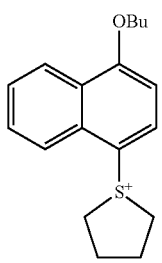  C₄F₉SO₃⁻ (z43)
113 Å³
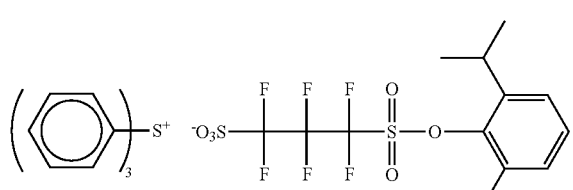 (z44)
347 Å³
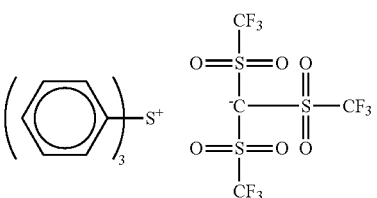 (z45)
189 Å³
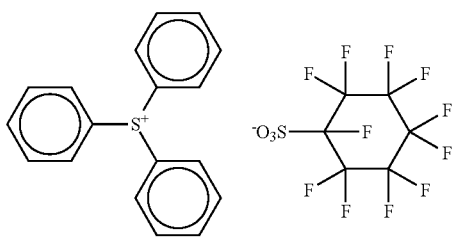 (z46)
136 Å³
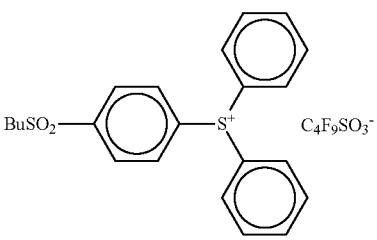 C₄F₉SO₃⁻ (z47)
113 Å³
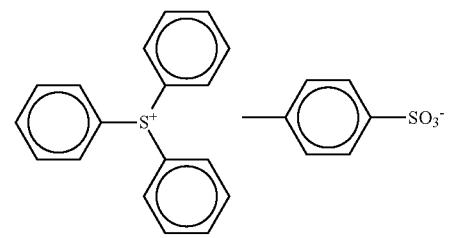 (z48)
186 Å³
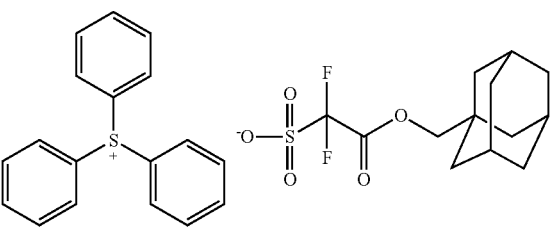 (z49)
271 Å³

(z50)
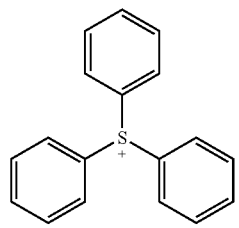 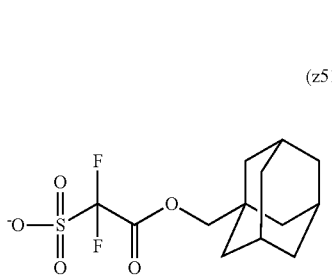
291 Å³
(z51)
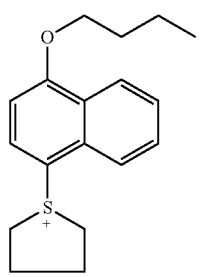
271 Å³
(z52)
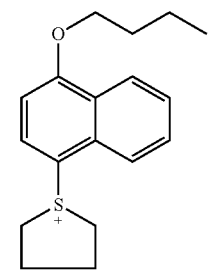
244 Å³
(z53)
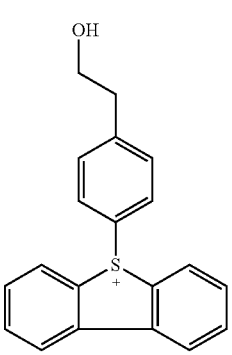
437 Å³
(z54)
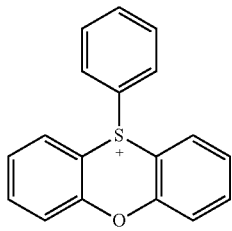 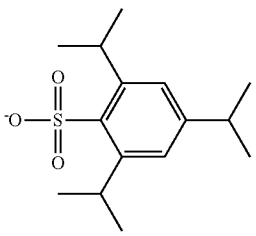
303 Å³
(z55)
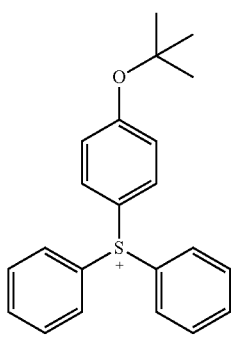 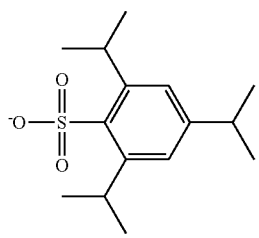
303 Å³
(z56)
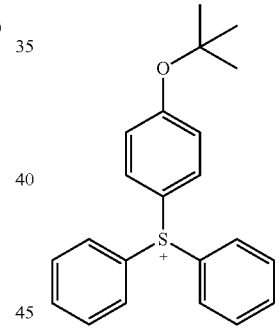 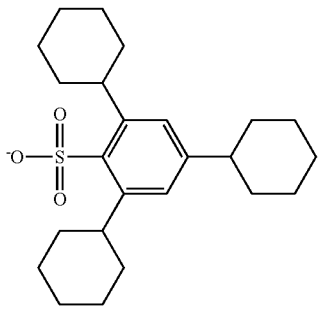
437 Å³
(z57)
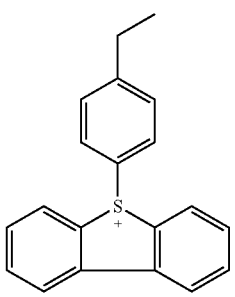 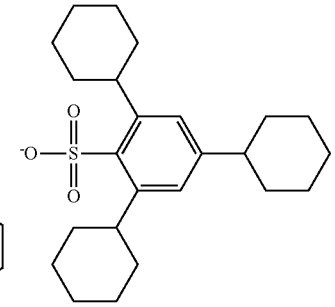
271 Å³

(z58)
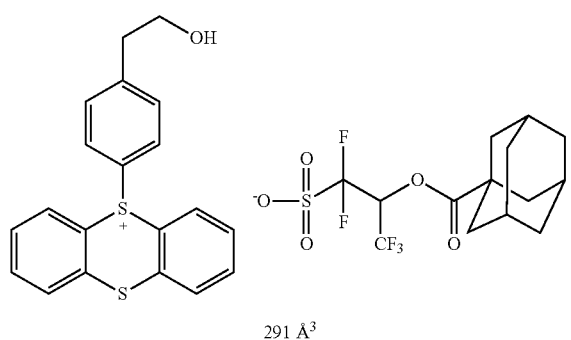
291 Å³
(z59)
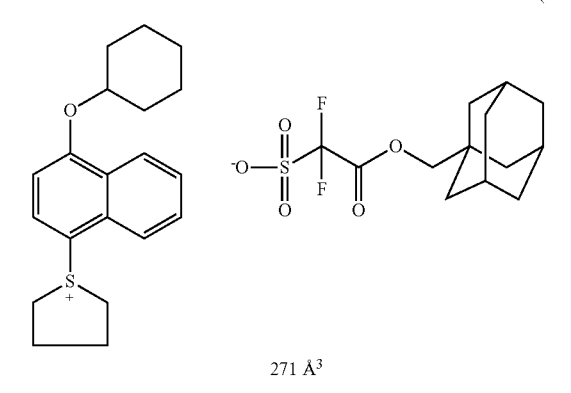
271 Å³
(z60)
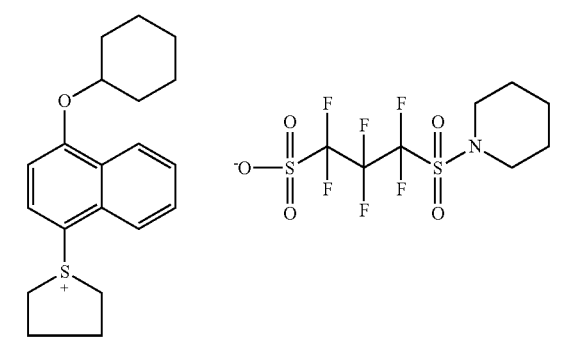
244 Å³
(z61)
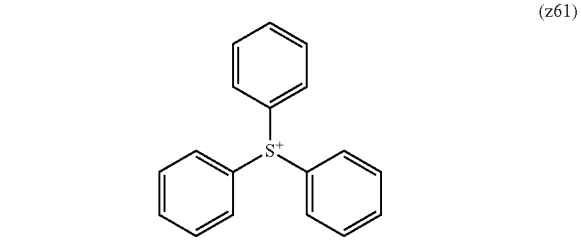
311 Å³
(z62)
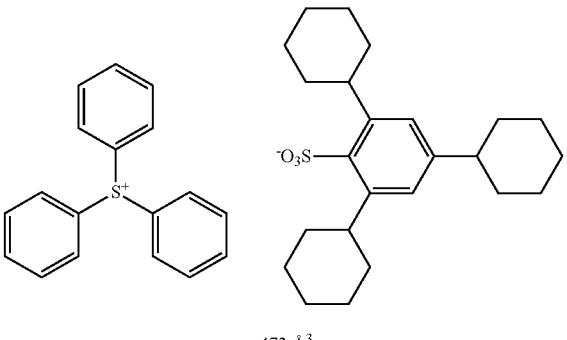
473 Å³
(z63)
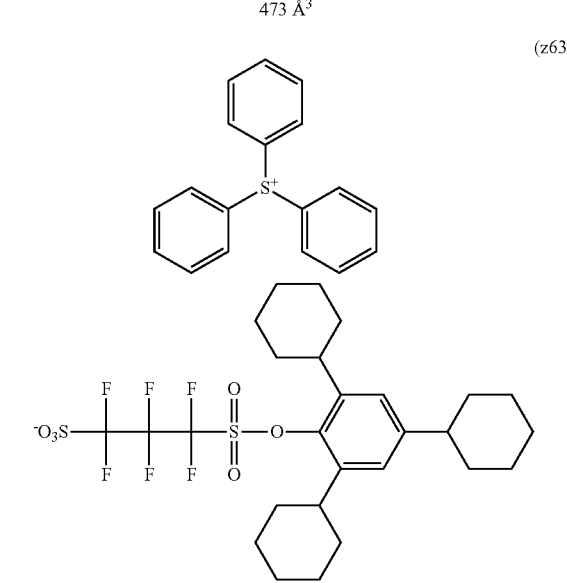
535 Å³
(z64)
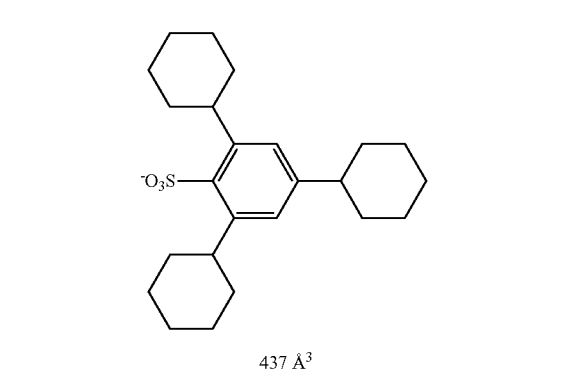
437 Å³

-continued

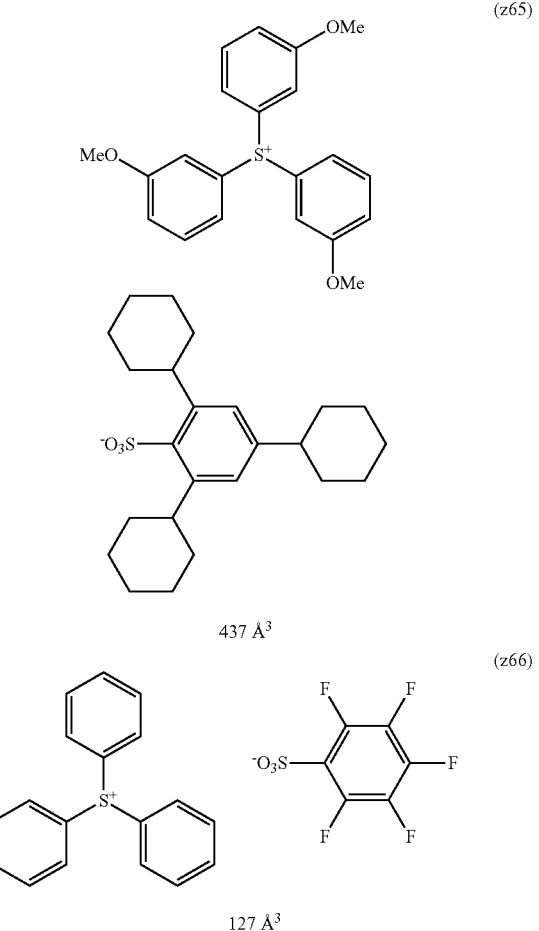

Incidentally, as the acid generator (preferably an onium compound) for use in the present invention, a polymer-type acid generator where a group capable of generating an acid upon irradiation with an actinic ray or radiation (photoacid generating group) is introduced into the main or side chain of a polymer compound may be also used, and this acid generator is described as a repeating unit having a photoacid generating group in connection with the polymer compound (A).

The content of the acid generator in the composition is preferably from 0.1 to 25 mass %, more preferably from 0.5 to 20 mass %, still more preferably from 1 to 18 mass %, based on the entire solid content of the resist composition.

One kind of an acid generator may be used alone, or two or more kinds of acid generators may be used in combination.

[3] Compound Having Two or More Hydroxymethyl Groups or Alkoxymethyl Groups within Molecule In the case of using the chemical amplification resist composition of the present invention as a negative chemical amplification resist composition, the negative chemical amplification resist composition preferably contains, as a crosslinking agent, (C) a compound having two or more hydroxymethyl groups or alkoxymethyl groups per molecule (hereinafter, sometimes referred to as an "acid crosslinking agent" or simply as a "crosslinking agent").

Preferred crosslinking agents include hydroxymethylated or alkoxymethylated phenol compounds, alkoxymethylated melamine compounds, alkoxymethyl glycoluril-based compounds, and acyloxymethylated urea-based compounds. The compound (C) particularly preferred as the crosslinking agent is a phenol derivative having a molecular weight of 1,200 or less and containing, per molecule, from 3 to 5 benzene rings and a total of two or more hydroxymethyl groups or alkoxymethyl groups, a melamine-formaldehyde derivative having at least two free N-alkoxymethyl groups, or an alkoxymethyl glycoluril derivative.

The alkoxymethyl group is preferably a methoxymethyl group or an ethoxymethyl group.

Out of the crosslinking agents above, the phenol derivative having a hydroxymethyl group can be obtained by reacting a corresponding phenol compound having no hydroxymethyl group with formaldehyde in the presence of a base catalyst. Also, the phenol derivative having an alkoxymethyl group can be obtained by reacting a corresponding phenol derivative having a hydroxymethyl group with an alcohol in the presence of an acid catalyst.

Among the thus-synthesized phenol derivatives, a phenol derivative having an alkoxymethyl group is preferred in view of sensitivity and storage stability.

Other preferred examples of the crosslinking agent include alkoxymethylated melamine-based compounds, alkoxymethyl glycoluril-based compounds, and compounds having an N-hydroxymethyl group or an N-alkoxymethyl group, such as alkoxymethylated urea-based compound.

Examples of these compounds include hexamethoxymethylmelamine, hexaethoxymethylmelamine, tetramethoxymethyl glycoluril, 1,3-bismethoxymethyl-4,5-bismethoxyethyleneurea, and bismethoxymethylurea, which are disclosed in EP 0,133,216A, German Patents 3,634,671 and 3,711,264, and EP 0,212,482A.

Among these crosslinking agents, particularly preferred are those illustrated below.

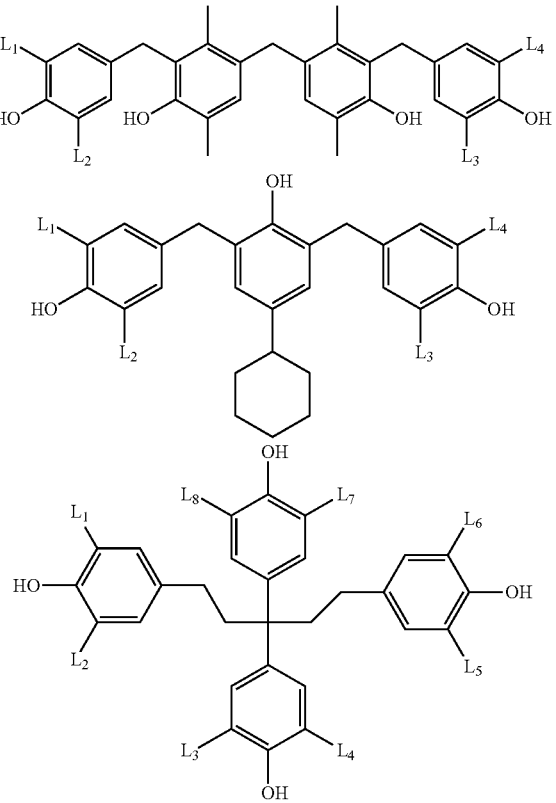

-continued

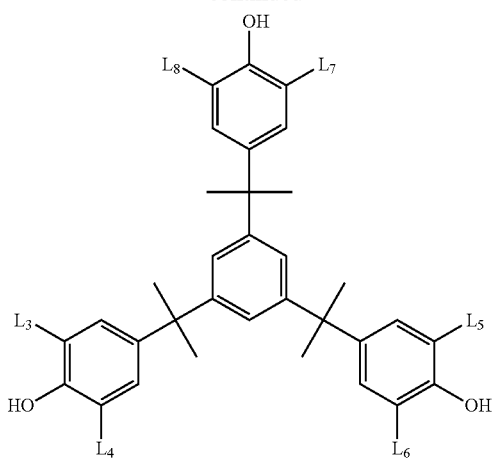

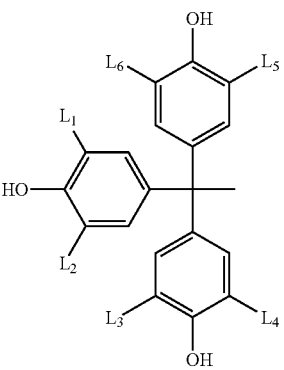

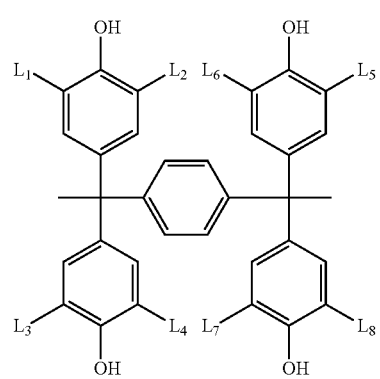

-continued

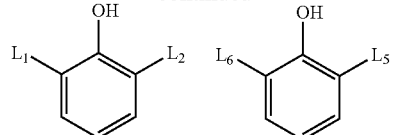

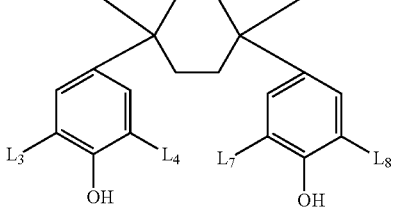

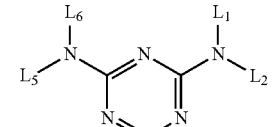

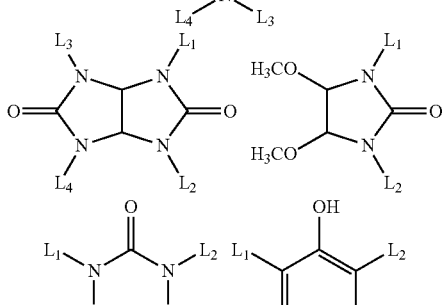

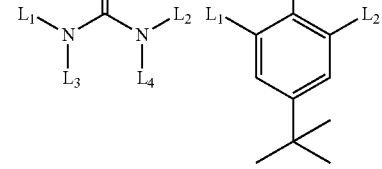

In these formulae, each of $L_1$ to $L_8$ independently represents a hydrogen atom, a hydroxymethyl group, a methoxymethyl group, an ethoxymethyl group, or an alkyl group having a carbon number of 1 to 6.

In the present invention, the crosslinking agent is used in an amount added of preferably from 3 to 65 mass %, more preferably from 5 to 50 mass %, based on the solid content of the negative resist composition. When the amount added of the crosslinking agent is from 3 to 65 mass %, the residual film ratio and the resolution can be prevented from decreasing and at the same time, good stability can be kept during storage of the resist solution.

In the present invention, one kind of a crosslinking agent may be used alone, or two or more kinds of crosslinking agents may be used in combination and in view of the pattern profile, two or more kinds of crosslinking agents are preferably used in combination.

For example, in the case of using the phenol derivative and additionally using another crosslinking agent, for example, the above-described compound having an N-alkoxymethyl group, in combination, the ratio between the phenol derivative and another crosslinking agent is preferably, in terms of molar ratio, from 100/0 to 20/80, preferably from 90/10 to 40/60, more preferably from 80/20 to 50/50.

[4] Basic Compound

The chemical amplification resist composition of the present invention preferably contains a basic compound as an acid scavenger, in addition to the components described

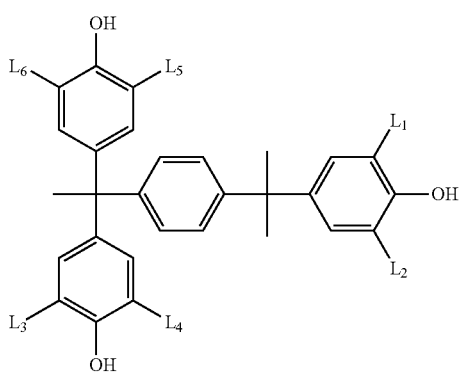

above. By using a basic compound, the change of performance with aging from exposure to post-heating can be reduced. The basic compound is preferably an organic basic compound, and specific examples thereof include aliphatic amines, aromatic amines, heterocyclic amines, nitrogen-containing compounds having a carboxyl group, nitrogen-containing compound having a sulfonyl group, nitrogen-containing compound having a hydroxy group, nitrogen-containing compound having a hydroxyphenyl group, an alcoholic nitrogen-containing compound, amide derivatives, and imide derivatives. An amine oxide compound (preferably an amine oxide compound having a methyleneoxy unit and/or an ethyleneoxy unit, for example, compounds described in JP-A-2008-102383) and an ammonium salt (preferably a hydroxide or a carboxylate; more specifically, a tetraalkylammonium hydroxide typified by tetrabutylammonium hydroxide is preferred in view of LER) may be also appropriately used.

Furthermore, a compound capable of increasing the basicity by the action of an acid can be also used as a kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(tert-butyl)aniline, triethanolamine, N,N-dihydroxyethylaniline, tris(methoxyethoxyethyl)amine, the compounds exemplified in column 3, line 60 et seq. of U.S. Pat. No. 6,040,112, 2-[2-{2-(2,2-dimethoxy-phenoxyethoxy)ethyl}-bis-(2-methoxyethyl)]-amine, and Compounds (C1-1) to (C3-3) illustrated in paragraph [0066] of U.S. Patent Application Publication No. 2007/0224539A1. Examples of the compound having a nitrogen-containing heterocyclic structure include 2-phenylbenzimidazole, 2,4,5-triphenylimidazole, N-hydroxyethylpiperidine, bis(1,2,2,6,6-pentamethyl-4-piperidyl)sebacate, 4-dimethylaminopyridine, antipyrine, hydroxyantipyrine, 1,5-diazabicyclo[4.3.0]-non-5-ene, 1,8-diazabicyclo[5.4.0]-undec-7-ene, and tetrabutylammonium hydroxide.

In addition, a photodecomposable basic compound (a compound which initially exhibits basicity due to the action of the basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, the onium salts described in Japanese Patent No. 3,577,743, JP-A-2001-215689, JP-A-2001-166476 and JP-A-2008-102383), and a photobase generator (for example, the compounds described in JP-A-2010-243773) may be also appropriately used.

Among these basic compounds, an ammonium salt is preferred from the standpoint of enhance the resolution.

In the present invention, one kind of a basic compound may be used alone, or two or more kinds of basic compounds may be used in combination.

The content of the basic compound for use in the present invention is preferably from 0.01 to 10 mass %, more preferably from 0.03 to 5 mass %, still more preferably from 0.05 to 3 mass %, based on the entire solid content of the resist composition.

[5] Surfactant

The chemical amplification resist composition of the present invention may further contain a surfactant so as to enhance the coatability. The surfactant is not particularly limited, but examples thereof include a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as Megaface F171 (produced by Dainippon Ink & Chemicals, Inc.), Florad FC430 (produced by Sumitomo 3M, Inc.), Surfynol E1004 (produced by Asahi Glass Co., Ltd.), and PF656 and PF6320 produced by OMNOVA, and an organosiloxane polymer.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

[6] Organic Carboxylic Acid

The chemical amplification resist composition of the present invention preferably contains an organic carboxylic compound, in addition to the components described above. Examples of the organic carboxylic compound include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, a phthalic acid, a terephthalic acid, an isophthalic acid, a 2-naphthoic acid, a 1-hydroxy-2-naphthoic acid, and a 2-hydroxy-3-naphthoic acid. At the time of performing electron beam exposure in vacuum, the organic carboxylic acid may vaporize from the resist film surface to contaminate the lithography chamber and therefore, the preferred compound is an aromatic organic carboxylic acid. Above all, for example, a benzoic acid, a 1-hydroxy-2-naphthoic acid and a 2-hydroxy-3-naphthoic acid are more preferred.

The amount of the organic carboxylic acid blended is preferably from 0.01 to 10 parts by mass, more preferably from 0.01 to 5 parts by mass, still more preferably from 0.01 to 3 parts by mass, per 100 parts by mass of the polymer compound (A).

The chemical amplification resist composition of the present invention may further contain, if desired, a dye, a plasticizer, and an acid-increasing agent (described, for example, in International Publication Nos. 95/29968 and 98/24000, JP-A-8-305262, JP-A-9-34106, JP-A-8-248561, JP-T-8-503082 (the term "JP-T" as used herein means a published Japanese translation of a PCT patent application), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943, JP-A-10-1508, JP-A-10-282642, JP-A-9-512498, JP-A-2000-62337, JP-A-2005-17730 and JP-A-2008-209889). As for all of these compounds, examples thereof include those described for respective compounds in JP-A-2008-268935.

[Onium Carboxylate]

The resist composition of the present invention may contain an onium carboxylate. Examples of the onium carboxylate include sulfonium carboxylate, iodonium carboxylate and ammonium carboxylate. In particular, the onium carboxylate is preferably iodonium carboxylate or sulfonium carboxylate. Furthermore, it is preferred that the carboxylate residue of the onium carboxylate does not contain an aromatic group and a carbon-carbon double bond. The anion moiety is preferably a linear or branched, monocyclic or polycyclic alkylcarboxylate anion having a carbon number of 1 to 30, more preferably the carboxylate anion above in which the alkyl group is partially or entirely fluorine-substituted. The alkyl chain may contain an oxygen atom. Thanks to such a configuration, the transparency to light at a wavelength of 220 nm or less is ensured, the sensitivity and resolution are enhanced, and the iso/dense bias and exposure margin are improved.

Preferred examples of the solvent used for the resist composition of the present invention include ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monomethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethyl-formamide, γ-butyrolactone, N,N-dimethylacetamide, propylene carbonate and ethylene carbonate. One of these solvents may be used alone, or some may be used in combination.

The resist composition is preferably prepared by dissolving the components in the solvent above to give a solid content of, in terms of solid content concentration, from 1 to 40 mass %, more preferably from 1 to 30 mass %, still more preferably from 3 to 20 mass %.

The present invention also relates to a resist film formed from the chemical amplification resist composition of the present invention, and the resist film is formed, for example, by applying the resist composition on a support such as substrate. The thickness of the resist film is preferably from 0.02 to 0.1 μm. As for the method to apply the resist composition on a substrate, the composition is applied on a substrate by an appropriate coating method such as spin coating, roll coating, flow coating, dip coating, spray coating and doctor coating, but spin coating is preferred, and the spinning speed is preferably from 1,000 to 3,000 rpm. The coated film is pre-baked at 60 to 150° C. for 1 to 20 minutes, preferably at 80 to 120° C. for 1 to 10 minutes, to form a thin film.

As for the materials constituting the substrate to be processed and the outermost surface layer thereof, for example, in the case of a wafer for semiconductor, a silicon wafer can be used, and examples of the material working out to the outermost surface include Si, $SiO_2$, SiN, SiON, TiN, WSi, BPSG, SOG, and an organic antireflection film.

The present invention also relates to a resist-coated mask blanks coated with the thus-obtained resist film. In order to obtain such a resist-coated mask blanks, in the case of forming a resist pattern on a photomask blanks for the production of a photomask, the transparent substrate is a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium, tantalum, tungsten, titanium and niobium is stacked. Examples of the material used for the outermost layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where plural materials are applied one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Out of the materials above, when pattern formation is performed using a chemical amplification resist composition on a photomask blanks having in the outermost surface layer thereof a material containing chromium and oxygen or nitrogen, a so-called undercut profile waist-shaped near the substrate is liable to be formed in general. However, when the present invention is used, the undercut problem can be improved as compared with the conventional mask blanks.

Subsequently, this resist film is irradiated with an actinic ray or radiation (e.g., electron beam), preferably baked (usually at 80 to 150° C., preferably from 90 to 130° C. for usually 1 to 20 minutes, preferably 1 to 10 minutes), and then developer, whereby a good pattern can be obtained. Etching, ion implantation or the like is appropriately performed by using this pattern as the mask to produce, for example, a semiconductor fine circuit or an imprint mold structure and a photomask.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu●Oyo Tenkai—Nanoimprint no Kiban Gijutsu to Saishin no Gijutsu Tenkai (Basic and Technology Expansion●Application Development of Nanoimprint—Fundamental Technology of Nanoimprint and Latest Technology Expansion), Frontier Shuppan.

The use mode of the chemical amplification resist composition of the present invention and the pattern forming method are described below.

The present invention also relates to a resist pattern forming method including exposing the above-described resist film or resist-coated mask blanks and developing the exposed resist film or resist-coated mask blanks. In the present invention, the exposure is preferably performed using an electron beam or an extreme-ultraviolet ray.

In the production or the like of a precision integrated circuit device, the exposure of the resist film (pattern forming step) is preferably performed by patternwise irradiating the resist film of the present invention with an electron beam or an extreme-ultraviolet ray (EUV). The exposure is performed with an exposure dose of, in the case of an electron beam, approximately from 0.1 to 20 $\mu C/cm^2$, preferably on the order of 3 to 10 $\mu C/cm^2$, and in the case of an extreme-ultraviolet ray, approximately from 0.1 to 20 $mJ/cm^2$, preferably on the order of 3 to 15 $mJ/cm^2$. Thereafter, post-exposure baking is performed on a hot plate at 60 to 150° C. for 1 to 20 minutes, preferably at 80 to 120° C. for 1 to 10 minutes, and subsequently, the resist film is developed, rinsed and dried, whereby a resist pattern is formed. The developer is an aqueous alkali solution in a concentration of preferably from 0.1 to 5 mass %, more preferably from 2 to 3 mass %, such as tetramethylammonium hydroxide (TMAH) and tetrabutylammonium hydroxide (TBAH), and the development is performed by a conventional method such as dip method, puddle method and spray method for preferably from 0.1 to 3 minutes, more preferably from 0.5 to 2 minutes. The pH of an alkali developer is usually from 10.0 to 15.0, and particularly tetramethylammonium hydroxide (TMAH) of 2.38 mass % aqueous solution is preferable.

In the developer, alcohols and/or a surfactant may be added each in an appropriate amount, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the development method, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various development methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using a developer, a step of stopping the development while replacing the solvent with another solvent may be practiced.

As for the rinsing solution in the rinsing treatment performed after the alkali development, pure water is used, and the pure water may be used after adding thereto an appropriate amount of a surfactant.

As such, in the case where the chemical amplification resist composition of the present invention is a negative resist composition, the resist film in the unexposed area is dissolved and since the polymer compound is crosslinked in the exposed area, the exposed area is hardly dissolved with the developer, and in the case where the chemical amplification composition is a positive resist composition, the exposed area is dissolved with the developer and the unexposed area is hardly dissolved with the developer, whereby an objective pattern is formed on the substrate.

The present invention also relates to a photomask obtained by exposing and developing the resist-coated mask blanks. As for the exposure and development, the above-described steps are applied. The photomask is suitably used for the production of a semiconductor.

The photomask of the present invention may be a light transmitting mask used with an ArF excimer laser and the like or may be a reflective mask used for reflection-system lithography using EUV light as the light source.

Furthermore, the present invention also relates to a production method of a semiconductor device, including the above-described resist pattern forming method of the present invention, and a semiconductor device produced by this production method.

The semiconductor device of the present invention is suitably mounted in electric/electronic equipment (for example, home appliance, office automation/media-related equipment, optical equipment and communication equipment).

EXAMPLES

The present invention is described in greater detail below by referring to Examples, but the contents of the present invention are not limited thereto.

(I) Examples as Negative Chemical Amplification Resist

Electron Beam

1. Synthesis Example of Polymer Compound (A)

Component (A)

Synthesis Example 1

Synthesis of Polymer Compound (A1)

In 120 mL of tetrahydrofuran (THF), 20 g of poly(p-hydroxystyrene) (VP2500) produced by Nippon Soda Co., Ltd. was dissolved, and 4.96 g of 1-adamantanecarbonyl chloride and 3.37 g of triethylamine were added thereto. The mixture was stirred at 50° C. for 4 hours, and the reaction solution was returned to room temperature. Thereafter, 100 mL of ethyl acetate and 100 mL of distilled water were added thereto, and an aqueous 1 N HCl solution was added little by little to the reaction solution to effect neutralization while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and added dropwise in 2 L of hexane. After filtration, the powder was collected and vacuum-dried to obtain 20.6 g of Polymer Compound (A1). FIG. 1 shows the $^1$H-NMR measurement chart in a $d^6$-DMSO solvent of Polymer Compound (A1) obtained.

Synthesis Example 2

Synthesis of Polymer Compound (A10)

Figure 2:
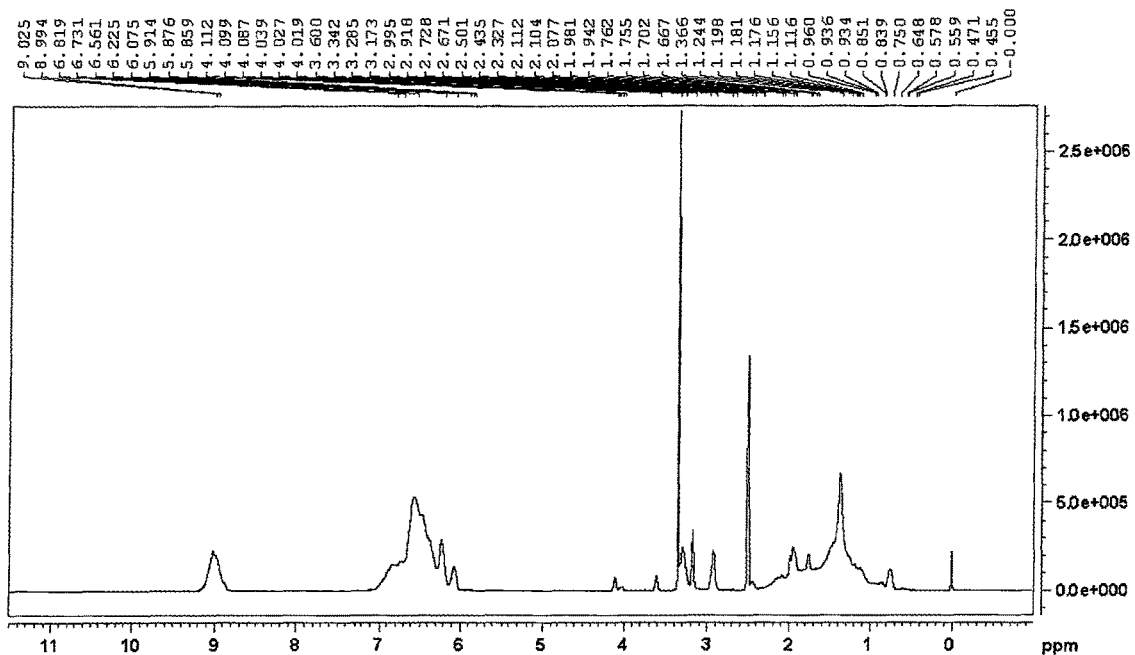
FIG. 2 is the $^1$H-NMR measurement chart in a d$^6$-DMSO (dimethylsulfoxide) solvent of the polymer compound (A10) synthesized in Synthesis Example 2.

In 100 mL of tetrahydrofuran (THF), 15 g of poly(p-hydroxystyrene) (VP2500) produced by Nippon Soda Co., Ltd. was dissolved, and 4.89 g of bicyclo[2.2.1]hept-5-ene-2-carbonyl chloride and 3.79 g of triethylamine were added thereto. The resulting mixture was stirred at 50° C. for 4 hours, and the reaction solution was returned to room temperature. Thereafter, 100 mL of ethyl acetate and 100 mL of distilled water were added thereto, and an aqueous 1 N HCl solution was added little by little to the reaction solution to effect neutralization while stirring the reaction solution in ice water. The reaction solution was transferred to a separating funnel and after removing the aqueous layer, the organic layer was washed with 200 mL of distilled water five times. The organic layer was then concentrated and added dropwise in 2 L of hexane, and the powder was collected by filtration and vacuum-dried to obtain 17.7 g of Polymer Compound (A10). FIG. 2 shows the $^1$H-NMR measurement chart in a $d^6$-DMSO solvent of Polymer Compound (A10) obtained.

Other polymer compounds were synthesized in the same manner as Polymer Compounds (A1) and (A10).

With respect to the polymer compounds obtained, the compositional ratio (molar ratio) of the polymer compound was calculated by $^1$H-NMR measurement. Also, the weight average molecular weight (Mw, in terms of polystyrene), number average molecular weight (Mn, in terms of polystyrene) and polydispersity (Mw/Mn, hereinafter sometimes referred to as "PDI") of the polymer compound were calculated by GPC (solvent: THF) measurement. In the Tables below, the weight average molecular weight and the polydispersity are shown together with the chemical formula and compositional ratio of the polymer compound.

TABLE 1

| Polymer Compound | Chemical Formula | Compositional Ratio (Molar Ratio) | Weight Average Molecular Weight | Polydispersity |
|---|---|---|---|---|
| Polymer Compound (A1) | 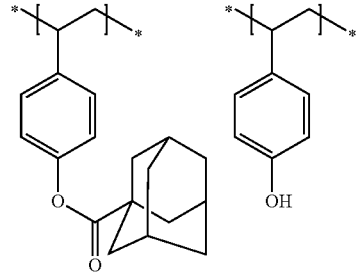 | 10/90 | 3500 | 1.1 |
| Polymer Compound (A2) | 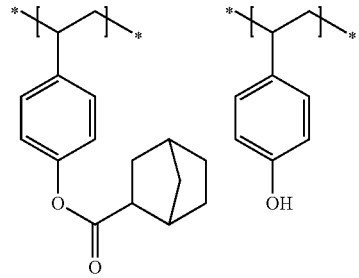 | 10/90 | 3400 | 1.1 |
| Polymer Compound (A3) | 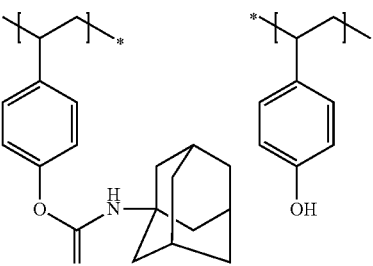 | 10/90 | 3500 | 1.1 |

TABLE 1-continued
| Polymer Compound | Chemical Formula | Compositional Ratio (Molar Ratio) | Weight Average Molecular Weight | Polydispersity |
|---|---|---|---|---|
| Polymer Compound (A4) | 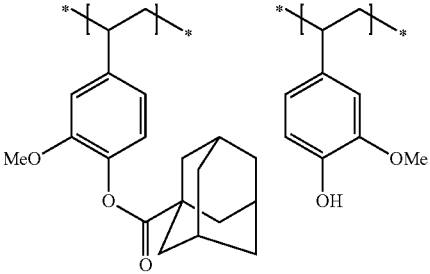 | 10/90 | 3400 | 1.1 |
| Polymer Compound (A5) | 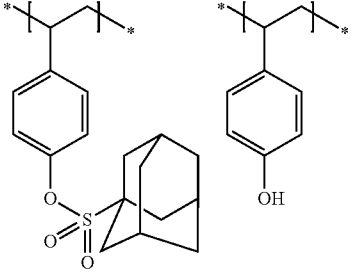 | 10/90 | 3500 | 1.1 |
| Polymer Compound (A6) | 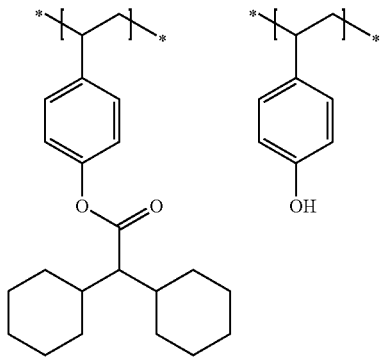 | 10/90 | 3500 | 1.1 |
| Polymer Compound (A7) | 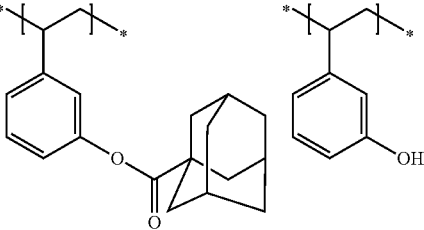 | 10/90 | 5000 | 1.1 |

TABLE 1-continued
| Polymer Compound | Chemical Formula | Compositional Ratio (Molar Ratio) | Weight Average Molecular Weight | Polydispersity |
|---|---|---|---|---|
| Polymer Compound (A8) | 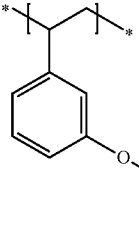 | 10/90 | 6000 | 1.1 |
| Polymer Compound (A9) | 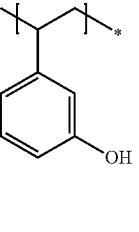 | 10/85/5 | 8000 | 1.4 |
| Polymer Compound (A10) | 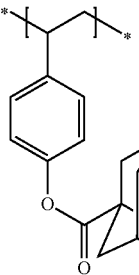 | 19/81 | 3900 | 1.1 |
| Comparative Polymer Compound (N1) | 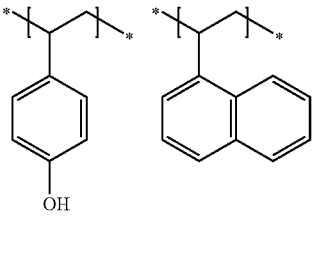 | 100 | 3200 | 1.1 |
| Comparative Polymer Compound (N2) | 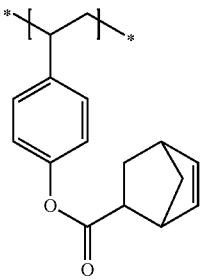 | 90/10 | 3500 | 1.1 |

2. Example

Example 1E

(1) Preparation of Support

A Cr oxide-deposited 6-inch wafer (a wafer subjected to a treatment of forming a shielding film, which is used for normal photomask blanks) was prepared.

(2) Preparation of Resist Coating Solution (Coating Solution Formulation of Negative Resist Composition N1)

| | |
|---|---|
| Polymer Compound (A1) | 0.60 g |
| Photoacid Generator (z5) (the structural formula is shown below | 0.12 g |
| Crosslinking Agent CL-1 (the structural formula is shown below | 0.08 g |
| Crosslinking Agent CL-5 (the structural formula is shown below | 0.04 g |
| Tetrabutylammonium hydroxide (basic compound) | 0.002 g |
| 2-Hydroxy-3-naphthoic acid (organic carboxylic acid) | 0.012 g |
| Surfactant PF6320 (produced by OMNOVA) | 0.001 g |
| Propylene glycol monomethyl ether acetate (solvent) | 4.0 g |
| Propylene glycol monomethyl ether (solvent) | 5.0 g |

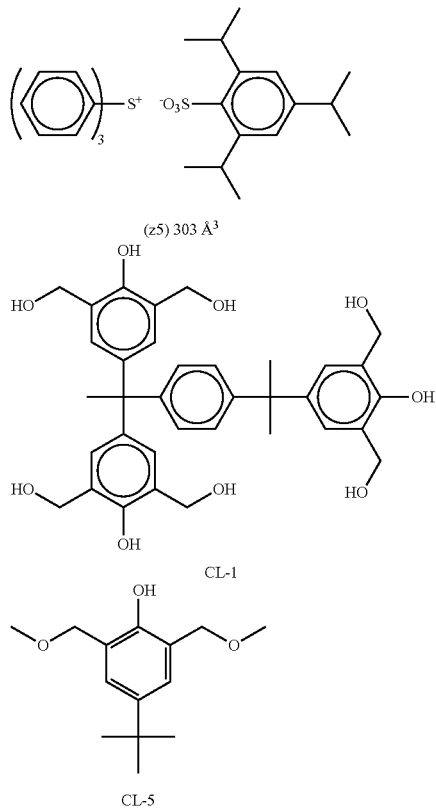

(z5) 303 Å$^3$

CL-1

CL-5

The solution of the composition above was microfiltered through a polytetrafluoroethylene filter having a pore size of 0.04 μm to obtain a resist coating solution.

(3) Preparation of Resist Film

The resist coating solution was applied on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blanks was obtained.

(4) Production of Negative Resist Pattern

This resist film was irradiated with a pattern by using an electron beam lithography device (HL750 manufactured by Hitachi, Ltd., accelerating voltage: 50 KeV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER) and dry etching resistance by the following methods.

Sensitivity

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.

Resolution (LS)

The limiting resolution (the minimum line width when the line and the space were separated and resolved) at the exposure dose (dose of electron beam irradiation) giving the sensitivity above was taken as the LS resolution (nm).

Resolution (IS)

The limiting resolution (the minimum space width when the line and the space were separated and resolved) at the minimum irradiation dose when resolving an isolated space pattern with a space width of 100 nm (space:line=1:>100) was taken as the IS resolution (nm).

Pattern Profile

The cross-sectional profile of the line pattern with a line width of 100 nm (L/S=1/1) at the exposure dose (dose of electron beam irradiation) giving the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is from 1.2 to less than 1.5, and rated "rectangle" when the ratio is less than 1.2.

Line Edge Roughness (LER)

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 36 was computed. A smaller value indicates better performance.

Dry Etching Resistance

A resist film formed by performing entire surface irradiation with the irradiation dose (dose of electron beam irradiation) giving the sensitivity above was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very Good: A residual film ratio of 95% or more.
Good: From 90% to less than 95%.
Bad: Less than 90%.

Example 2E

Preparation of the resist solution (Negative Resist Composition N2), negative pattern formation and evaluation thereof were performed in the same manner as in Example 1E except that Polymer Compound (A2) was used as the polymer compound (A) and the solvent shown in Table 2 below was used. The evaluation results are shown in Table 3.

Example 3E to Example 9E and Example 19E

Preparation of the resist solution (Negative Resist Compositions N3 to N9 and N19), negative pattern formation and evaluation thereof were performed in the same manner as in Example 1E except that each of Polymer Compounds (A3) to (A10) was used as the polymer compound (A) and the solvent shown in Table 2 below was used. The evaluation results are shown in Table 3.

Example 10E to Example 18E, Comparative Example 1E and Comparative Example 2E

Preparation of the resist solution (Negative Resist Compositions N10 to N18 and Comparative Negative Resist Compositions N1 and N2), negative pattern formation and evaluation thereof were performed in the same manner as in Example 1E except for the components shown in Table 2 below in the resist liquid formulation. The evaluation results are shown in Table 3.

TABLE 2

| Composition | Polymer Compound | Photoacid Generator | Basic Compound | Crosslinking Agent | Solvent |
|---|---|---|---|---|---|
| N1 | A1 (0.6 g) | z5 (0.12 g) | B1 (0.002 g) | CL-1/CL-5 (0.08 g/0.04 g) | S2/S1 (5.0 g/4.0 g) |
| N2 | A2 (0.6 g) | z5 (0.12 g) | B1 (0.002 g) | CL-1/CL-5 (0.08 g/0.04 g) | S1/S3 (5.0 g/4.0 g) |
| N3 | A3 (0.6 g) | z5 (0.12 g) | B1 (0.002 g) | CL-1/CL-5 (0.08 g/0.04 g) | S2/S3 (5.0 g/4.0 g) |
| N4 | A4 (0.6 g) | z5 (0.12 g) | B1 (0.002 g) | CL-1/CL-5 (0.08 g/0.04 g) | S2/S7 (5.0 g/4.0 g) |
| N5 | A5 (0.6 g) | z5 (0.12 g) | B1 (0.002 g) | CL-1/CL-5 (0.08 g/0.04 g) | S2/S1 (5.0 g/4.0 g) |
| N6 | A6 (0.6 g) | z5 (0.12 g) | B1 (0.002 g) | CL-1/CL-5 (0.08 g/0.04 g) | S2/S1 (5.0 g/4.0 g) |
| N7 | A7 (0.6 g) | z5 (0.12 g) | B1 (0.002 g) | CL-1/CL-5 (0.08 g/0.04 g) | S2/S1 (5.0 g/4.0 g) |
| N8 | A8 (0.6 g) | z5 (0.12 g) | B1 (0.002 g) | CL-1/CL-5 (0.08 g/0.04 g) | S2/S1 (5.0 g/4.0 g) |
| N9 | A9 (0.6 g) | z5 (0.12 g) | B1 (0.002 g) | CL-1/CL-5 (0.08 g/0.04 g) | S2/S1 (5.0 g/4.0 g) |
| N10 | A2 (0.6 g) | z2 (0.12 g) | B2 (0.002 g) | CL-1 (0.12 g) | S2/S1 (5.0 g/4.0 g) |
| N11 | A1/A7 (0.3 g/0.3 g) | z26 (0.12 g) | B3 (0.001 g) | CL-2 (0.12 g) | S2/S3 (5.0 g/4.0 g) |
| N12 | A1 (0.6 g) | z37 (0.12 g) | B4 (0.008 g) | CL-3 (0.12 g) | S1/S2/S6 (4.0 g/4.0 g/1.0 g) |
| N13 | A7 (0.6 g) | z45 (0.12 g) | B5 (0.002 g) | CL-4 (0.12 g) | S1/S2/S5 (4.0 g/4.0 g/1.0 g) |
| N14 | A7 (0.6 g) | z42 (0.12 g) | B6 (0.002 g) | CL-1/CL-4 (0.08 g/0.04 g) | S1/S2/S4 (4.0 g/4.0 g/1.0 g) |
| N15 | A7 (0.6 g) | z65 (0.12 g) | B2 (0.002 g) | CL-1/CL-3 (0.08 g/0.04 g) | S2/S1 (5.0 g/4.0 g) |
| N16 | A1 (0.6 g) | z49/z58 (0.06 g/0.06 g) | B3 (0.002 g) | CL-1/CL-2 (0.08 g/0.04 g) | S2/S1 (5.0 g/4.0 g) |
| N17 | A1 (0.6 g) | z61/z63 (0.06 g/0.06 g) | B1 (0.002 g) | CL-2/CL-4 (0.08 g/0.04 g) | S2/S1 (5.0 g/4.0 g) |
| N18 | A1 (0.6 g) | z5 (0.12 g) | B2/B6 (0.001 g/0.001 g) | CL-1/CL-5 (0.08 g/0.04 g) | S2/S1 (5.0 g/4.0 g) |
| N19 | A10 (0.6 g) | z5 (0.12 g) | B1 (0.002 g) | CL-1/CL-5 (0.08 g/0.04 g) | S2/S1 (5.0 g/4.0 g) |
| Comparative Composition N1 | Comparative Polymer Compound (N1) (0.6 g) | z2 (0.12 g) | B2 (0.002 g) | CL-1 (0.12 g) | S1 (9.0 g) |
| Comparative Composition N2 | Comparative Polymer Compound (N2) (0.6 g) | z2 (0.12 g) | B2 (0.002 g) | CL-1 (0.12 g) | S1 (9.0 g) |

Abbreviations used in the above and following Examples and Comparative Examples are described below.
[Acid Generator (Compound (B))]
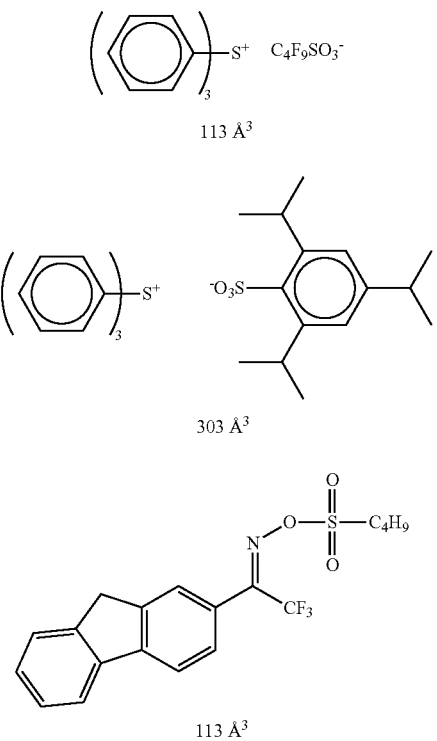
(z2) 113 Å³
(z5) 303 Å³
(z26) 113 Å³
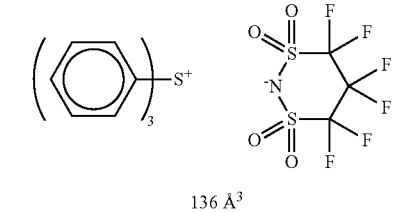
(z37) 136 Å³
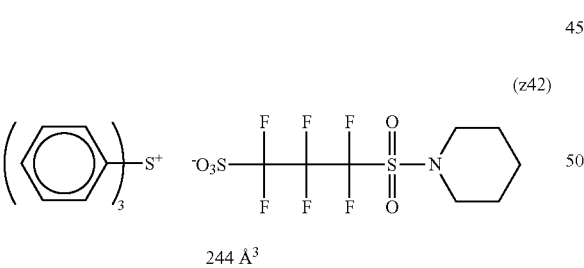
(z42) 244 Å³
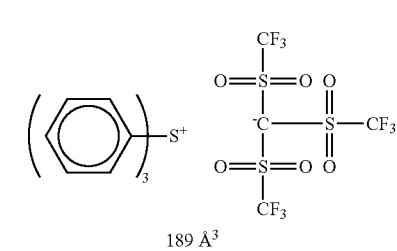
(z45) 189 Å³
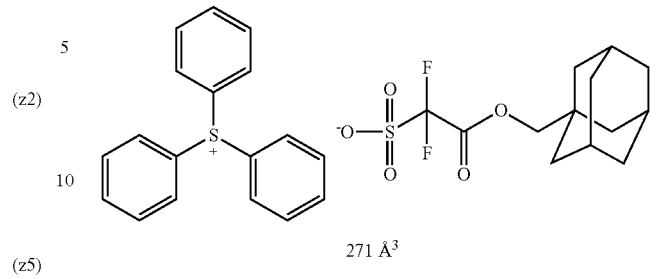
(z49) 271 Å³
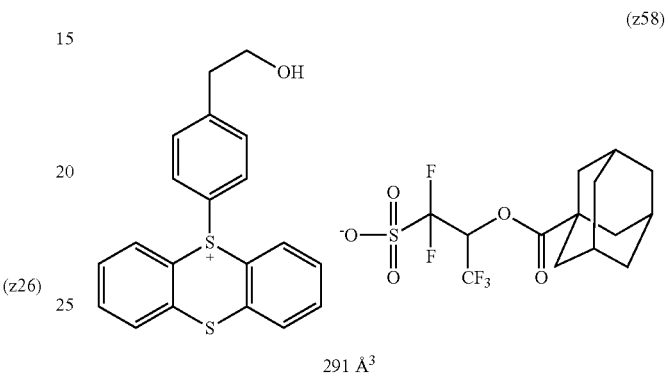
(z58) 291 Å³
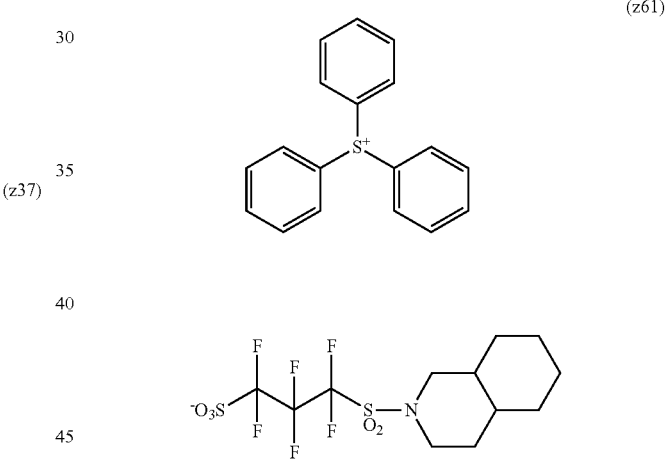
(z61) 311 Å³
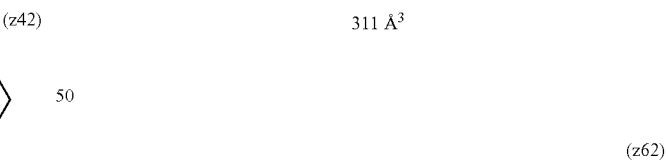
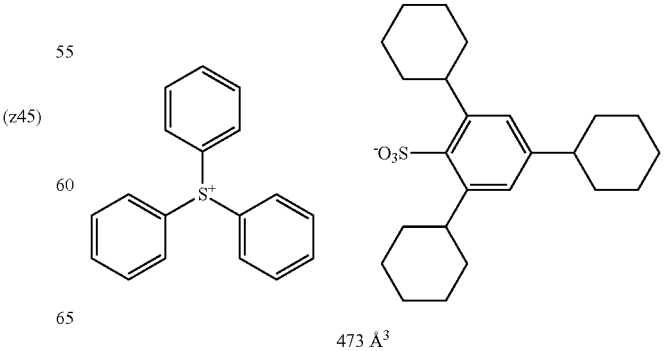
(z62) 473 Å³

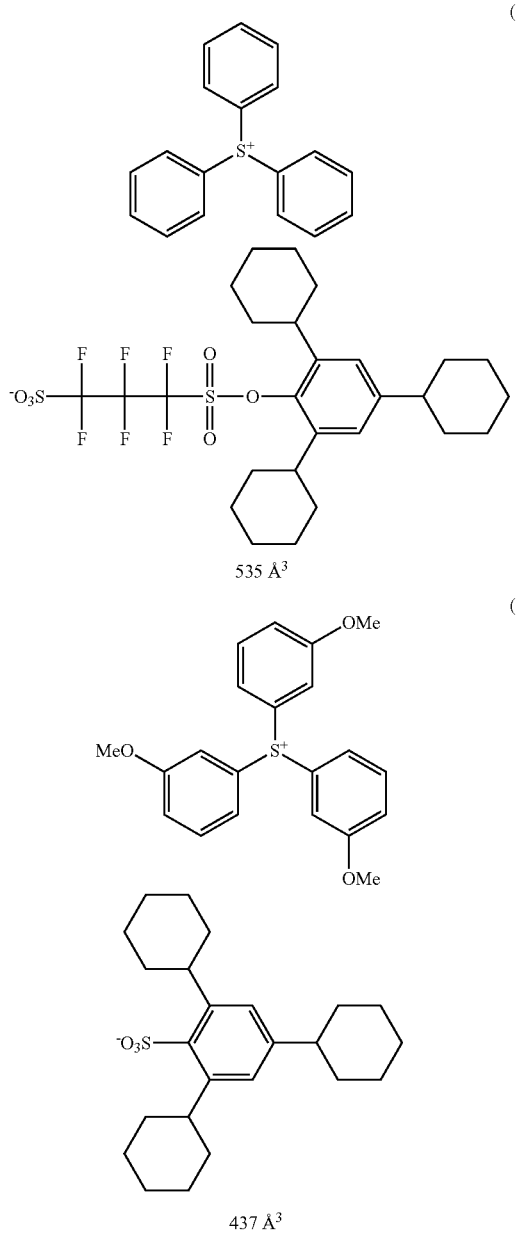
[Crosslinking Agent (Compound (C))]
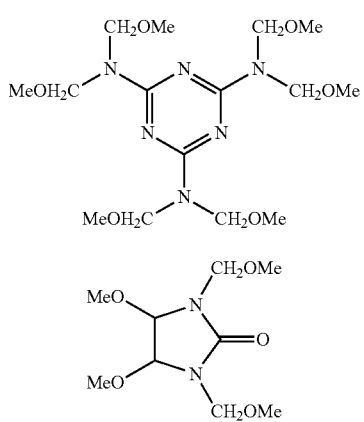
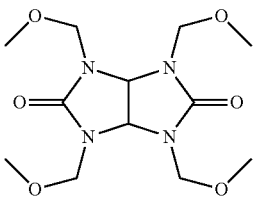
Basic Compound
B1: Tetrabutylammonium hydroxide
B2: Tri(n-octyl)amine
B3: 2,4,5-Triphenylimidazole
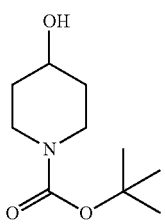
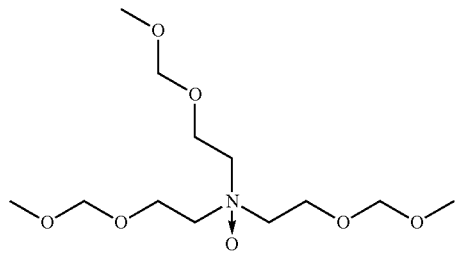
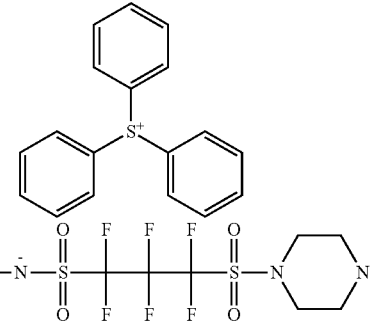
Solvent
S1: Propylene glycol monomethyl ether acetate (1-methoxy-2-acetoxypropane)
S2: Propylene glycol monomethyl ether (1-methoxy-2-propanol)
S3: 2-Heptanone
S4: Ethyl lactate
S5: Cyclohexanone
S6: γ-Butyrolactone
S7: Propylene carbonate The evaluation results are shown in Table 3.

TABLE 3

(electron beam exposure, negative)

| Example | Composition | Sensitivity ($\mu C/cm^2$) | LS Resolution (nm) | IS Resolution (nm) | Pattern Profile | LER (nm) | Dry Etching Resistance |
|---|---|---|---|---|---|---|---|
| 1E | N1 | 10.2 | 50 | 50 | rectangle | 4.5 | very good |
| 2E | N2 | 10.0 | 50 | 50 | rectangle | 4.5 | good |
| 3E | N3 | 10.2 | 50 | 50 | rectangle | 4.5 | very good |
| 4E | N4 | 10.2 | 50 | 50 | rectangle | 4.5 | very good |
| 5E | N5 | 10.3 | 50 | 50 | rectangle | 4.5 | very good |
| 6E | N6 | 10.3 | 50 | 50 | rectangle | 4.5 | good |
| 7E | N7 | 10.0 | 50 | 50 | rectangle | 4.5 | very good |
| 8E | N8 | 10.2 | 50 | 50 | rectangle | 4.5 | very good |
| 9E | N9 | 11.2 | 50 | 50 | rectangle | 4.5 | very good |
| 10E | N10 | 10.2 | 55 | 55 | slightly reverse taper | 5.0 | good |
| 11E | N11 | 10.3 | 55 | 55 | slightly reverse taper | 5.0 | very good |
| 12E | N12 | 10.2 | 55 | 55 | slightly reverse taper | 5.0 | very good |
| 13E | N13 | 10.3 | 55 | 55 | slightly reverse taper | 5.0 | very good |
| 14E | N14 | 10.3 | 50 | 50 | rectangle | 5.0 | very good |
| 15E | N15 | 10.3 | 50 | 50 | rectangle | 5.0 | very good |
| 16E | N16 | 10.2 | 50 | 50 | rectangle | 5.0 | very good |
| 17E | N17 | 10.3 | 50 | 50 | rectangle | 4.6 | very good |
| 18E | N18 | 10.5 | 50 | 50 | rectangle | 5.0 | very good |
| 19E | N19 | 10.2 | 50 | 50 | rectangle | 4.5 | very good |
| Comparative Example 1E | Comparative Composition N1 | 12.8 | 70 | 80 | reverse taper | 6.5 | bad |
| Comparative Example 2E | Comparative Composition N2 | 12.8 | 70 | 80 | reverse taper | 6.0 | bad |

It is seen from the results shown in Table 3 that the composition according to the present invention is excellent in the sensitivity, resolution, pattern profile, line edge roughness (LER) and dry etching resistance.

(II) Examples as Positive Chemical Amplification Resist

Electron Beam

1. Synthesis Example of Polymer Compound (A)

Component (A)

Synthesis Example 3

Synthesis of Polymer Compound (P1)

In 120 mL of tetrahydrofuran (THF), 20 g of poly(p-hydroxystyrene) (VP8000) produced by Nippon Soda Co., Ltd. was dissolved, and 4.96 g of 1-adamantanecarbonyl chloride and 3.37 g of triethylamine were added thereto. The mixture was stirred at 50° C. for 4 hours, and the reaction solution was returned to room temperature. Thereafter, 100 mL of ethyl acetate and 100 mL of distilled water were added thereto, and an aqueous 1 N HCl solution was added little by little to the reaction solution to effect neutralization while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and dissolved in propylene glycol monomethyl ether acetate (PGMEA). Hereinafter, this solution is sometimes denoted by Solution p-1.

Subsequently, 10.27 g of 2-cyclohexyl ethyl vinyl ether as a vinyl ether compound and 0.97 g of 2% camphorsulfonic acid (a PGMEA solution) were added to Solution p-1, and the mixture was stirred at room temperature for 4 hours. Furthermore, 0.70 g of 6% triethylamine (a PGMEA solution) was added and after stirring for a while, the reaction solution was transferred to a separating funnel containing 165 mL of ethyl acetate. The obtained organic layer was washed with 200 mL of distilled water three times. The organic layer was then concentrated in an evaporator to remove ethyl acetate, and the resulting reaction solution was added dropwise in 2 L of hexane. After filtration, the powder was collected and vacuum-dried to obtain 25.6 g of Polymer Compound (P1).

Other polymer compounds were synthesized in the same manner as Polymer Compound (P1).

With respect to the polymer compounds obtained, the compositional ratio (molar ratio) of the polymer compound was calculated by $^1$H-NMR measurement. Also, the weight average molecular weight (Mw, in terms of polystyrene), number average molecular weight (Mn, in terms of polystyrene) and polydispersity (Mw/Mn, hereinafter sometimes referred to as "PDI") of the polymer compound were calculated by GPC (solvent: THF) measurement, In the Tables below, the weight average molecular weight and the polydispersity are shown together with the chemical formula and compositional ratio of the polymer compound.

TABLE 4

| Polymer Compound | Chemical Formula | Compositional Ratio (Molar Ratio) | Weight Average Molecular Weight | Polydispersity |
|---|---|---|---|---|
| Polymer Compound (P1) | | 15/50/35 | 9100 | 1.1 |
| Polymer Compound (P2) | | 10/45/45 | 9200 | 1.1 |
| Polymer Compound (P3) | | 10/50/40 | 4000 | 1.1 |

TABLE 4-continued

| Polymer Compound | Chemical Formula | Compositional Ratio (Molar Ratio) | Weight Average Molecular Weight | Polydispersity |
|---|---|---|---|---|
| Polymer Compound (P4) | (structure) | 10/50/40 | 9300 | 1.1 |
| Polymer Compound (P5) | (structure) | 10/45/45 | 9200 | 1.1 |
| Polymer Compound (P6) | (structure) | 10/45/45 | 9100 | 1.1 |

TABLE 4-continued

| Polymer Compound | Chemical Formula | Compositional Ratio (Molar Ratio) | Weight Average Molecular Weight | Polydispersity |
|---|---|---|---|---|
| Polymer Compound (P7) | (structures shown) | 10/45/45 | 6000 | 1.1 |
| Polymer Compound (P8) | (structures shown) | 10/30/40/20 | 8000 | 1.5 |

TABLE 4-continued
| Polymer Compound | Chemical Formula | Compositional Ratio (Molar Ratio) | Weight Average Molecular Weight | Polydispersity |
|---|---|---|---|---|
| Polymer Compound (P9) | 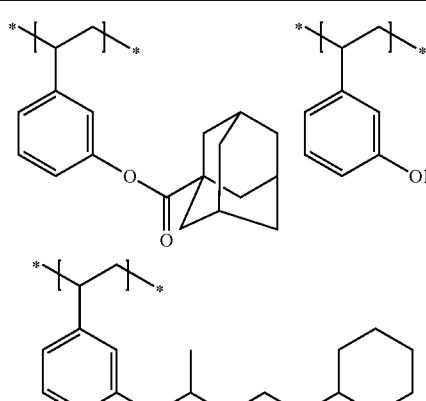 | 10/50/40 | 5000 | 1.1 |
| Polymer Compound (P10) | 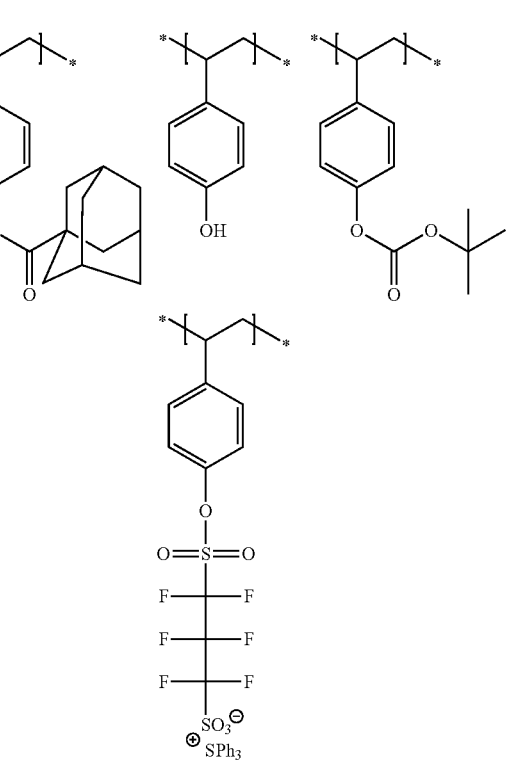 | 10/40/40/10 | 9900 | 1.1 |

TABLE 4-continued
| Polymer Compound | Chemical Formula | Compositional Ratio (Molar Ratio) | Weight Average Molecular Weight | Polydispersity |
|---|---|---|---|---|
| Polymer Compound (P11) | 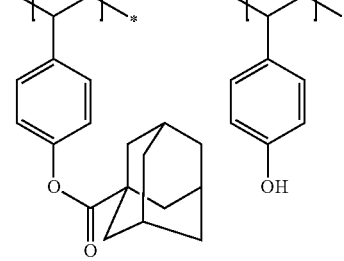 | 10/45/45 | 4100 | 1.1 |
| Comparative Polymer Compound (P1) | 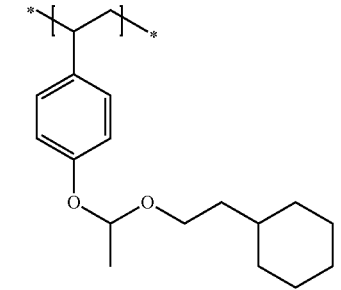 | 40/60 | 8800 | 1.1 |
| Comparative Polymer Compound (P2) | 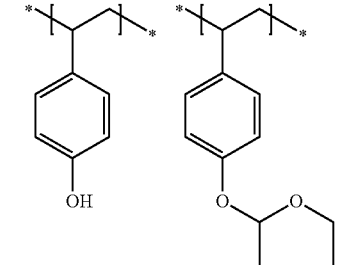 | 40/50/10 | 9100 | 1.1 |
| Comparative Polymer Compound (P3) | 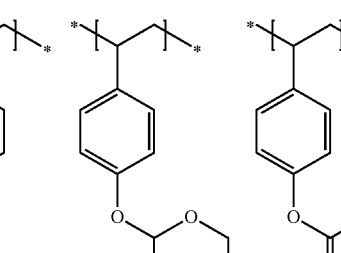 | 40/50/10 | 9000 | 1.1 |

2. Example

Example 1P

(1) Preparation of Support

A Cr oxide-deposited 6-inch wafer (a wafer subjected to a treatment of forming a shielding film, which is used for normal photomask blanks) was prepared.

(2) Preparation of Resist Coating Solution (Coating Solution Formulation of Positive Resist Composition P1)

| | |
|---|---|
| Polymer Compound (P1) | 0.60 g |
| Photoacid Generator z62 (the structural formula is shown above) | 0.12 g |
| Tetrabutylammonium hydroxide (basic compound) | 0.002 g |
| Surfactant PF6320 (produced by OMNOVA) | 0.001 g |
| Propylene glycol monomethyl ether acetate (solvent) | 9.0 g |

The solution of the composition above was microfiltered through a polytetrafluoroethylene filter having a pore size of 0.04 μm to obtain a resist coating solution.

(3) Preparation of Resist Film

The resist coating solution was applied on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blanks was obtained.

(4) Production of Positive Resist Pattern

This resist film was irradiated with a pattern by using an electron beam lithography device (HL750 manufactured by Hitachi, Ltd., accelerating voltage: 50 KeV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER) and dry etching resistance by the following methods.

Sensitivity

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.

Evaluation of Resolution (LS)

The limiting resolution (the minimum line width when the line and the space were separated and resolved) at the exposure dose (dose of electron beam irradiation) giving the sensitivity above was taken as the LS resolution.

Evaluation of Resolution (IL)

The limiting resolution (the minimum line width when the line and the space were separated and resolved) at the minimum irradiation dose when resolving an isolated line pattern with a line width of 100 nm (line:space=1:>100) was taken as the IL resolution (nm).

Pattern Profile

The cross-sectional profile of the line pattern with a line width of 100 nm (L/S=1/1) at the exposure dose (dose of electron beam irradiation) giving the sensitivity above was observed by a scanning electron microscope (S-4300, manufactured by Hitachi, Ltd.). The cross-sectional profile of the line pattern was rated "forward taper" when the ratio represented by [line width at the bottom part (basement) of line pattern/line width in the middle of line pattern (the position of half the height of line pattern)] is 1.5 or more, rated "slightly forward taper" when the ratio above is from 1.2 to less than 1.5, and rated "rectangle" when the ratio is less than 1.2.

Line Edge Roughness (LER)

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 3σ was computed. A smaller value indicates better performance.

Evaluation of Dry Etching Resistance

An unexposed resist film was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.
Very Good: A residual film ratio of 95% or more.
Good: From 90% to less than 95%.
Bad: Less than 90%.

Example 2P to Example 20P and Comparative Example 1P to Comparative Example 3P Preparation of the resist solution (Positive Resist Compositions P2 to P20 and Comparative Positive Resist Compositions P1 to P3), positive pattern formation and evaluation thereof were performed in the same manner as in Example 1P except for the components shown in Table 5 below in the resist liquid formulation.

TABLE 5

| | (electron beam exposure, positive) | | | |
|---|---|---|---|---|
| Composition | Polymer Compound | Photoacid Generator | Basic Compound | Solvent |
| P1 | P1 (0.6 g) | z62 (0.12 g) | B1 (0.002 g) | S1 (9.0 g) |

TABLE 5-continued (electron beam exposure, positive)

| Composition | Polymer Compound | Photoacid Generator | Basic Compound | Solvent |
|---|---|---|---|---|
| P2 | P2 (0.6 g) | z62 (0.12 g) | B1 (0.002 g) | S2/S1 (5.0 g/4.0 g) |
| P3 | P3 (0.6 g) | z62 (0.12 g) | B1 (0.002 g) | S2/S3 (5.0 g/4.0 g) |
| P4 | P4 (0.6 g) | z62 (0.12 g) | B1 (0.002 g) | S2/S1 (5.0 g/4.0 g) |
| P5 | P5 (0.6 g) | z62 (0.12 g) | B1 (0.002 g) | S2/S1 (5.0 g/4.0 g) |
| P6 | P6 (0.6 g) | z62 (0.12 g) | B1 (0.002 g) | S2/S4 (5.0 g/4.0 g) |
| P7 | P7 (0.6 g) | z62 (0.12 g) | B1 (0.002 g) | S2/S5 (5.0 g/4.0 g) |
| P8 | P8 (0.6 g) | z62 (0.12 g) | B1 (0.002 g) | S2/S1 (5.0 g/4.0 g) |
| P9 | P9 (0.6 g) | z62 (0.12 g) | B1 (0.002 g) | S2/S3 (5.0 g/4.0 g) |
| P10 | P10 (0.72 g) | none | B1 (0.002 g) | S1/S3 (5.0 g/4.0 g) |
| P11 | P11 (0.6 g) | z62 (0.12 g) | B1 (0.001 g) | S2/S3 (5.0 g/4.0 g) |
| P12 | P1 (0.6 g) | z2 (0.12 g) | B2 (0.008 g) | S2/S7 (5.0 g/4.0 g) |
| P13 | P9/P1 (0.3 g/0.3 g) | z63 (0.12 g) | B4 (0.002 g) | S2/S1 (5.0 g/4.0 g) |
| P14 | P11 (0.6 g) | z61 (0.12 g) | B5 (0.002 g) | S2/S1 (5.0 g/4.0 g) |
| P15 | P1 (0.6 g) | z65 (0.12 g) | B6 (0.002 g) | S2/S1 (5.0 g/4.0 g) |
| P16 | P1 (0.6 g) | z37 (0.12 g) | B3 (0.002 g) | S2/S1 (5.0 g/4.0 g) |
| P17 | P11 (0.6 g) | z42 (0.12 g) | B1 (0.002 g) | S2/S1 (5.0 g/4.0 g) |
| P18 | P11 (0.6 g) | z5 (0.12 g) | B1 (0.002 g) | S2/S1 (5.0 g/4.0 g) |
| P19 | P1 (0.6 g) | z63/z65 (0.06 g/0.06 g) | B1 (0.002 g) | S2/S1 (5.0 g/4.0 g) |
| P20 | P1 (0.6 g) | z62 (0.12 g) | B2/B6 (0.001 g/0.001 g) | S2/S1 (5.0 g/4.0 g) |
| Comparative Composition P1 | Comparative Polymer Compound (P1) (0.6 g) | z2 (0.12 g) | B2 (0.002 g) | S1 (9.0 g) |
| Comparative Composition P2 | Comparative Polymer Compound (P2) (0.6 g) | z2 (0.12 g) | B2 (0.002 g) | S1 (9.0 g) |
| Comparative Composition P3 | Comparative Polymer Compound (P3) (0.6 g) | z2 (0.12 g) | B2 (0.002 g) | S1 (9.0 g) |

The evaluation results are shown in Table 6.

TABLE 6

(electron beam exposure, positive)

| Example | Composition | Sensitivity ($\mu C/cm^2$) | LS Resolution (nm) | IL Resolution (nm) | Pattern Profile | LER (nm) | Dry Etching Resistance |
|---|---|---|---|---|---|---|---|
| 1P | P1 | 10.8 | 50 | 45 | rectangle | 4.5 | very good |
| 2P | P2 | 10.8 | 50 | 45 | rectangle | 4.5 | very good |
| 3P | P3 | 10.8 | 50 | 45 | rectangle | 4.5 | very good |
| 4P | P4 | 10.7 | 50 | 45 | rectangle | 4.5 | good |
| 5P | P5 | 10.8 | 50 | 45 | rectangle | 4.5 | good |
| 6P | P6 | 10.8 | 50 | 45 | rectangle | 4.5 | very good |
| 7P | P7 | 10.7 | 50 | 45 | rectangle | 4.5 | good |
| 8P | P8 | 12.8 | 50 | 45 | rectangle | 4.5 | very good |
| 9P | P9 | 10.9 | 50 | 45 | rectangle | 4.5 | very good |
| 10P | P10 | 10.8 | 50 | 50 | rectangle | 4.5 | very good |
| 11P | P11 | 10.8 | 50 | 45 | rectangle | 4.5 | very good |
| 12P | P12 | 10.8 | 55 | 55 | rectangle | 5.0 | very good |

TABLE 6-continued (electron beam exposure, positive)

| Example | Composition | Sensitivity ($\mu C/cm^2$) | LS Resolution (nm) | IL Resolution (nm) | Pattern Profile | LER (nm) | Dry Etching Resistance |
|---|---|---|---|---|---|---|---|
| 13P | P13 | 10.7 | 50 | 45 | rectangle | 5.0 | very good |
| 14P | P14 | 10.8 | 50 | 50 | rectangle | 5.0 | very good |
| 15P | P15 | 10.8 | 50 | 45 | rectangle | 5.0 | very good |
| 16P | P16 | 10.6 | 55 | 55 | rectangle | 5.0 | very good |
| 17P | P17 | 10.8 | 50 | 50 | rectangle | 4.5 | very good |
| 18P | P18 | 10.6 | 50 | 50 | rectangle | 4.5 | very good |
| 19P | P19 | 10.6 | 50 | 45 | rectangle | 4.5 | very good |
| 20P | P20 | 10.8 | 50 | 45 | rectangle | 5.0 | very good |
| Comparative Example 1P | Comparative Composition P1 | 12.9 | 70 | 80 | forward taper | 6.5 | bad |
| Comparative Example 2P | Comparative Composition P2 | 12.9 | 70 | 80 | slightly forward taper | 6.0 | bad |
| Comparative Example 3P | Comparative Composition P3 | 12.9 | 70 | 80 | slightly forward taper | 6.0 | bad |

It is seen from the results shown in Table 6 that the composition according to the present invention is excellent in the sensitivity, resolution, pattern profile, LER and dry etching resistance.

(III) Examples as Negative Chemical Amplification Resist (EUV)

Examples 1F to 6F and Comparative Examples 1F and 2F

Preparation of Resist Solution

The negative resist composition shown in Table 7 below was filtered through a polytetrafluoroethylene filter having a pore size of 0.04 µm to prepare a negative resist solution.

Evaluation of Resist

The negative resist solution prepared was uniformly applied on a hexamethyldisilazane-treated silicon substrate by using a spin coater and dried under heating on a hot plate at 100° C. for 60 seconds to form a resist film having a thickness of 0.05 µm.

The obtained resist film was evaluated for the sensitivity, resolution, pattern profile, line edge roughness (LER) and dry etching resistance by the following methods.

Sensitivity

The obtained resist film was exposed to EUV light (wavelength: 13 nm) through a 6% halftone mask having a 1:1 line-and-space pattern with a line width of 100 nm by changing the exposure dose in steps of 0.1 mJ/cm² in the range of 0 to 20.0 mJ/cm², then baked at 110° C. for 90 seconds and developed with an aqueous 2.38 mass % tetramethylammonium hydroxide (TMAH) solution.

The exposure dose when reproducing a line-and-space (L/S=1/1) mask pattern with a line width of 100 nm was taken as the sensitivity. A smaller value indicates higher sensitivity.

Resolution (LS)

The limiting resolution (the minimum line width when the line and the space were separated and resolved) at the exposure dose giving the sensitivity above was taken as the LS resolution (nm).

Pattern Profile

The cross-sectional profile of the line pattern with a line width of 100 nm (L/S=1/1) at the exposure dose giving the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is from 1.2 to less than 1.5, and rated "rectangle" when the ratio is less than 1.2.

Line Edge Roughness (LER)

A line pattern (L/S=1/1) having a line width of 100 nm was formed with the exposure dose giving the sensitivity above. At arbitrary 30 points included in its longitudinal 50 µm region, the distance from the reference line where the edge should be present was measured using a scanning electron microscope (S-9220, manufactured by Hitachi, Ltd.). The standard deviation of the measured distances was determined, and 3σ was computed. A smaller value indicates better performance.

Dry Etching Resistance

A resist film formed by performing entire surface irradiation with the exposure dose giving the sensitivity above was subjected to dry etching for 15 seconds by using an Ar/$C_4F_6$/$O_2$ gas (a mixed gas in a volume ratio of 100/4/2) in HITACHI U-621. Thereafter, the residual resist film ratio was measured and used as an indicator of dry etching resistance.

Very Good: A residual film ratio of 95% or more.
Good: From 90% to less than 95%.
Bad: Less than 90%.

The results of these evaluations are shown in Table 7.

TABLE 7

(EUV exposure, negative)

| Example | Composition | Sensitivity (mJ/cm$^2$) | Resolution (nm) | Pattern Profile | LER (nm) | Dry Etching Resistance |
|---|---|---|---|---|---|---|
| 1F | N1 | 12.8 | 50 | rectangle | 4.5 | very good |
| 2F | N7 | 13.2 | 50 | rectangle | 4.5 | very good |
| 3F | N10 | 13.3 | 55 | slightly reverse taper | 5.0 | good |
| 4F | N14 | 13.1 | 50 | rectangle | 4.5 | very good |
| 5F | N15 | 13.0 | 50 | rectangle | 4.5 | very good |
| 6F | N17 | 13.0 | 50 | rectangle | 4.5 | very good |
| Comparative Example 1F | Comparative Composition N1 | 15.8 | 70 | reverse taper | 6.5 | bad |
| Comparative Example 2F | Comparative Composition N2 | 15.8 | 70 | reverse taper | 6.0 | bad |

It is seen from the results shown in Table 7 that the composition according to the present invention is excellent in the sensitivity, resolution, pattern profile, line edge roughness (LER) and dry etching resistance.

(IV) Examples as Positive Chemical Amplification Resist (EUV)

Examples 1Q to 9Q and Comparative Examples 1Q and 2Q

Preparation of Resist Solution

The positive resist composition shown in Table 8 below was filtered through a polytetrafluoroethylene filter having a pore size of 0.04 μm to prepare a positive resist solution.

Evaluation of Resist

The positive resist solution prepared was uniformly applied on a hexamethyldisilazane-treated silicon substrate by using a spin coater and dried under heating on a hot plate at 100° C. for 60 seconds to form a resist film having a thickness of 0.05 μm.

The obtained resist film was evaluated for the sensitivity, resolution, pattern profile, line edge roughness (LER) and dry etching resistance by the following methods.

Sensitivity

The obtained resist film was exposed to EUV light (wavelength: 13 nm) through a 6% halftone mask having a 1:1 line-and-space pattern with a line width of 100 nm by changing the exposure dose in steps of 0.1 mJ/cm$^2$ in the range of 0 to 20.0 mJ/cm$^2$, then baked at 110° C. for 90 seconds and developed with an aqueous 2.38 mass % tetramethylammonium hydroxide (TMAH) solution.

The exposure dose when reproducing a line-and-space (L/S=1/1) mask pattern with a line width of 100 nm was taken as the sensitivity. A smaller value indicates higher sensitivity.

Resolution (LS)

The limiting resolution (the minimum line width when the line and the space were separated and resolved) at the exposure dose giving the sensitivity above was taken as the LS resolution (nm).

Pattern Profile

The cross-sectional profile of the line pattern with a line width of 100 nm (L/S=1/1) at the exposure dose giving the sensitivity above was observed by a scanning electron microscope (S-4300, manufactured by Hitachi, Ltd.). The cross-sectional profile of the line pattern was rated "forward taper" when the ratio represented by [line width in the bottom part (basement) of line pattern/line width in the middle of line pattern (the position of half the height of line pattern)] is 1.5 or more, rated "slightly forward taper" when the ratio above is from 1.2 to less than 1.5, and rated "rectangle" when the ratio is less than 1.2.

Line Edge Roughness (LER)

A line pattern (L/S=1/1) having a line width of 100 nm was formed with the exposure dose giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 36 was computed. A smaller value indicates better performance.

Dry Etching Resistance

An unexposed resist film was subjected to dry etching for 15 seconds by using an Ar/C$_4$F$_6$/O$_2$ gas (a mixed gas in a volume ratio of 100/4/2) in HITACHI U-621. Thereafter, the residual resist film ratio was measured and used as an indicator of dry etching resistance.
Very Good: A residual film ratio of 95% or more.
Good: From 90% to less than 95%.
Bad: Less than 90%.

The results of these evaluations are shown in Table 8.

TABLE 8

(EUV exposure, positive)

| Example | Composition | Sensitivity (mJ/cm$^2$) | Resolution (nm) | Pattern Profile | LER (nm) | Dry Etching Resistance |
|---|---|---|---|---|---|---|
| 1Q | P1 | 10.8 | 45 | rectangle | 4.5 | very good |
| 2Q | P2 | 10.8 | 45 | rectangle | 4.5 | very good |
| 3Q | P10 | 10.8 | 50 | rectangle | 4.5 | very good |
| 4Q | P11 | 10.7 | 45 | rectangle | 4.5 | very good |
| 5Q | P14 | 10.8 | 50 | rectangle | 5.0 | very good |
| 6Q | P15 | 10.8 | 45 | rectangle | 5.0 | very good |
| 7Q | P16 | 10.7 | 55 | rectangle | 5.0 | very good |
| 8Q | P17 | 10.8 | 50 | rectangle | 4.5 | very good |
| 9Q | P12 | 10.9 | 55 | rectangle | 5.0 | good |
| Comparative Example 1Q | Comparative Composition P1 | 12.9 | 70 | forward taper | 6.5 | bad |
| Comparative Example 2Q | Comparative Composition P2 | 12.9 | 70 | slightly forward taper | 6.0 | bad |

It is seen from the results shown in Table 8 that the composition according to the present invention is excellent in the sensitivity, resolution, pattern profile, line edge roughness (LER) and dry etching resistance.

INDUSTRIAL APPLICABILITY

According to the present invention, a chemical amplification resist composition capable of forming a pattern satisfying high sensitivity, high resolution property (for example, high resolution, excellent pattern profile and small line edge roughness (LER)) and good dry etching resistance all at the same time, and a resist film using the composition, a resist-coated mask blanks, a resist pattern forming method, a photomask and a polymer compound can be provided.

This application is based on Japanese patent application Nos. JP 2011-8331 filed on Jan. 18, 2011 and JP 2011-255302 filed on Nov. 22, 2011, and U.S. Provisional Application No. 61/504,431 filed on Jul. 5, 2011, the entire contents of which are hereby incorporated by reference, the same as if set forth at length.

The invention claimed is:

1. A chemical amplification resist composition, comprising:
    (A) a polymer compound having a structure where a hydrogen atom of a phenolic hydroxyl group is replaced by a group having a non-acid-decomposable polycyclic alicyclic hydrocarbon structure;
    (B) a compound capable of generating an acid upon irradiation with an actinic ray or radiation; and
    (C) a crosslinking agent.

2. The chemical amplification resist composition according to claim 1, which is for electron beam or extreme-ultraviolet exposure.

3. The chemical amplification resist composition according to claim 1,
    wherein the polymer compound (A) contains a repeating unit represented by the following formula (1):

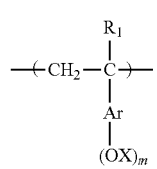
(1)

wherein $R_1$ represents a hydrogen atom or a methyl group;
X represents a group having a non-acid-decomposable polycyclic alicyclic hydrocarbon structure;
Ar represents an aromatic ring; and
m is an integer of 1 or more.

4. The chemical amplification resist composition according to claim 3,
    wherein the repeating unit represented by formula (1) is a repeating unit represented by the following formula (2) and the polymer compound (A) further contains a repeating unit represented by the following formula (3):

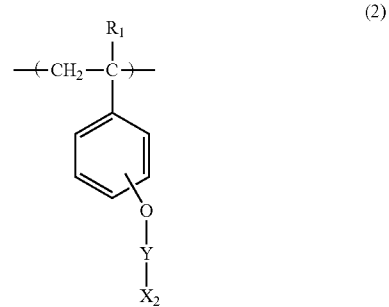
(2)

wherein $R_1$ represents a hydrogen atom or a methyl group;
Y represents a single bond or a divalent linking group; and
$X_2$ represents a non-acid-decomposable polycyclic alicyclic hydrocarbon group;

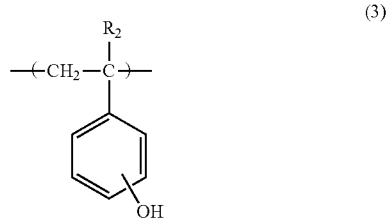
(3)

wherein $R_2$ represents a hydrogen atom or a methyl group.

5. The chemical amplification resist composition according to claim 4,
    wherein in formula (2), Y is a divalent linking group and the divalent linking group is a carbonyl group.

6. The chemical amplification resist composition according to claim 1,
wherein the compound (B) is an onium compound.

7. The chemical amplification resist composition according to claim 1,
wherein the dispersity of the polymer compound (A) is from 1.0 to 1.35.

8. The chemical amplification resist composition according to claim 1, which is a negative chemical amplification resist composition, further comprising:
(D) a compound having two or more hydroxymethyl groups or alkoxymethyl groups per molecule.

9. A resist film, which is formed from the chemical amplification resist composition according to claim 1.

10. A resist-coated mask blanks, which is coated with the resist film according to claim 9.

11. A resist pattern forming method, comprising:
exposing the resist film according to claim 9, so as to form an exposed film; and
developing the exposed film.

12. A resist pattern forming method, comprising:
exposing the resist-coated mask blanks according to claim 10, so as to form an exposed resist-coated mask blanks; and
developing the exposed resist-coated mask blanks.

13. The resist pattern forming method according to claim 11,
wherein the exposure is performed using an electron beam or an extreme-ultraviolet ray.

14. A photomask, which is obtained by exposing and developing the resist-coated mask blanks according to claim 10.

15. The chemical amplification resist composition according to claim 1, wherein the resist composition is a negative chemical amplification resist composition.

16. The chemical amplification resist composition according to claim 1, wherein the crosslinking agent (C) contains a benzene ring.

17. The chemical amplification resist composition according to claim 1, wherein the crosslinking agent (C) is a phenol derivative having a molecular weight of 1,200 or less.

18. A polymer compound, which has a structure where a hydrogen atom of a phenolic hydroxyl group is replaced by a group having a non-acid-decomposable polycyclic alicyclic hydrocarbon structure,
wherein the group having a non-acid-decomposable polycyclic alicyclic hydrocarbon structure is contained as a repeating unit represented by the following formula (2'):

$$\begin{array}{c}R_1\\ -(CH_2-C)-\\ \phantom{xx}\\ \text{[benzene ring]}-O-C(=O)-\text{[adamantyl]}\end{array}\quad(2')$$

wherein $R_1$ represents a hydrogen atom or a methyl group.

19. The chemical amplification resist composition according to claim 1, wherein the content of the crosslinking agent is from 3 to 65 mass% based on the solids content of the resist composition.

20. The chemical amplification resist composition according to claim 1, wherein the crosslinking agent contains, per molecule, from 3 to 5 benzene rings.

* * * * *